United States Patent [19]
Nakagawa et al.

[11] Patent Number: 5,859,707
[45] Date of Patent: Jan. 12, 1999

[54] POSITION DETECTION APPARATUS AND ALIGNER COMPRISING SAME

[75] Inventors: Masahiro Nakagawa, Yokohama; Ayako Sugaya, Kawasaki; Masashi Tanaka, Yokohama; Koichiro Komatsu, Tokyo, all of Japan

[73] Assignee: Nikon Corporation, Tokyo, Japan

[21] Appl. No.: 796,320

[22] Filed: Feb. 6, 1997

[30] Foreign Application Priority Data

Feb. 13, 1996 [JP] Japan .................................. 8-025327
Feb. 15, 1996 [JP] Japan .................................. 8-027517

[51] Int. Cl.$^6$ .................................................. G01B 11/00
[52] U.S. Cl. ............................ 356/401; 356/399; 356/373
[58] Field of Search ................................ 356/401, 399, 356/373

[56] References Cited

U.S. PATENT DOCUMENTS

| | | |
|---|---|---|
| 4,677,301 | 6/1987 | Tanimoto et al. . |
| 4,780,617 | 10/1988 | Umatate et al. . |
| 4,833,621 | 5/1989 | Umatate . |
| 4,962,318 | 10/1990 | Nishi . |
| 5,004,348 | 4/1991 | Magome . |
| 5,171,999 | 12/1992 | Komatsu et al. . |

*Primary Examiner*—Frank G. Font
*Assistant Examiner*—Reginald A. Ratliff
*Attorney, Agent, or Firm*—Klarquist Sparkman Campbell Leigh & Whinston, LLP

[57] ABSTRACT

Position-detection apparatus (alignment sensors) are disclosed for determining the position of an object (e.g., wafer, bearing a position-detection mark) as required in microlithography processes for manufacturing semiconductor devices and displays. The apparatus comprises an irradiation optical system, a condenser optical system, a first photoelectric detector, a fiducial body bearing a fiducial mark, a combining optical system, a second photoelectric detector, and a processor. The position-detection and fiducial marks are illuminated with coherent illumination light from the irradiation optical system. Light diffracted from the marks is condensed by the condenser optical system. The first photoelectric detector receives the condensed diffracted light and produces first electrical signals. The combining optical system receives the diffracted light from the fiducial mark. The second photoelectric detector receives multiple diffracted light beams from the fiducial mark and produces second electrical signals. From the electrical signals, the processor determines the position of the position-detection mark relative to the fiducial mark.

36 Claims, 19 Drawing Sheets

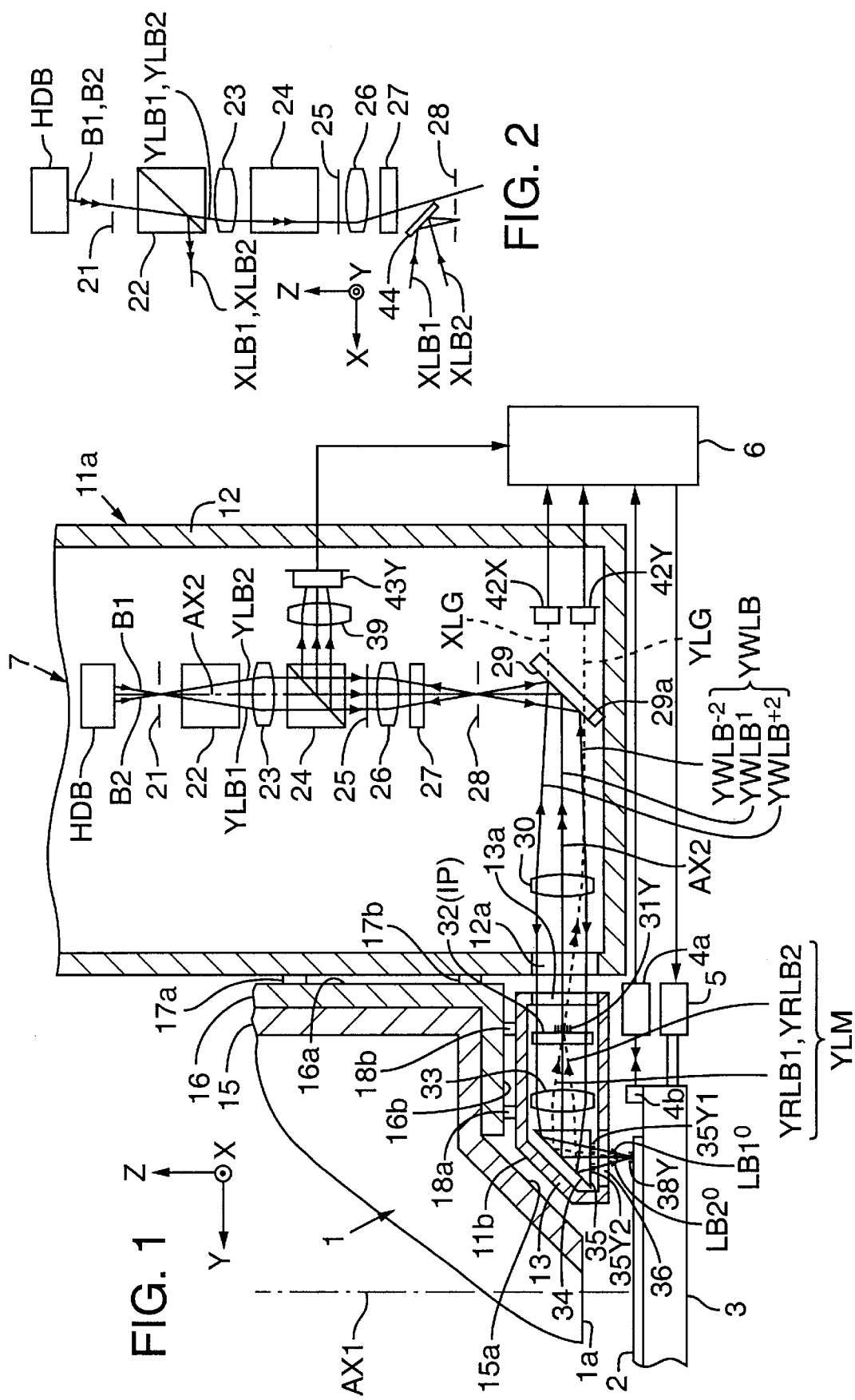

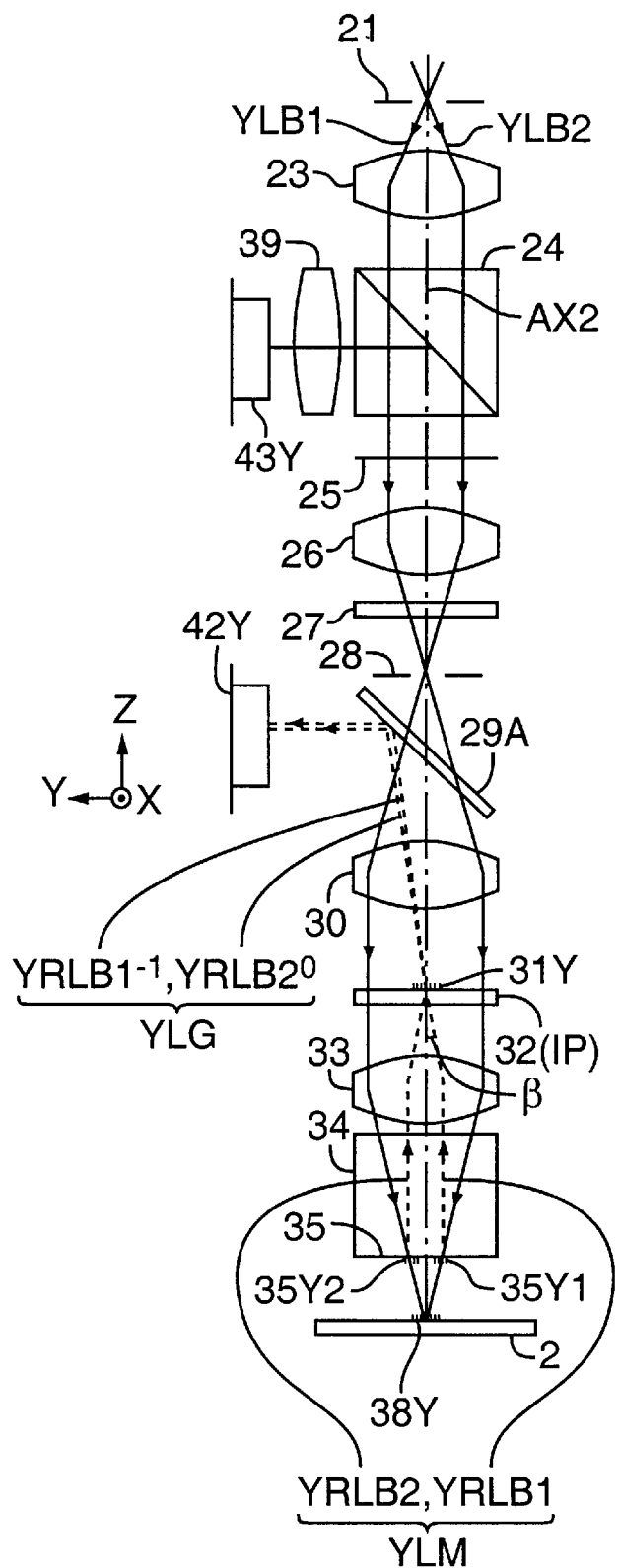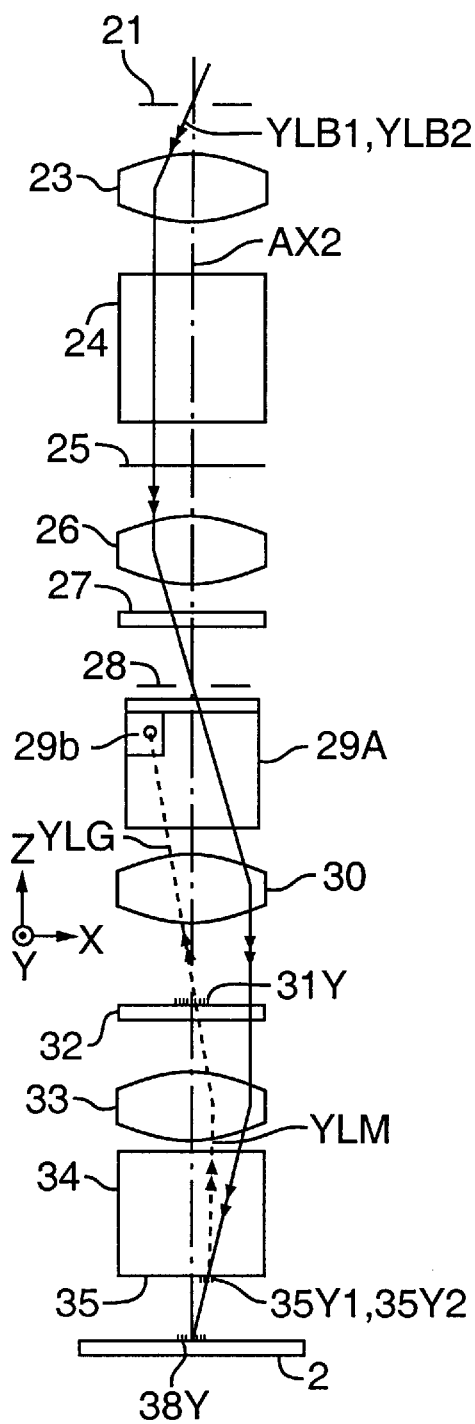
FIG. 4(a)
FIG. 4(b)

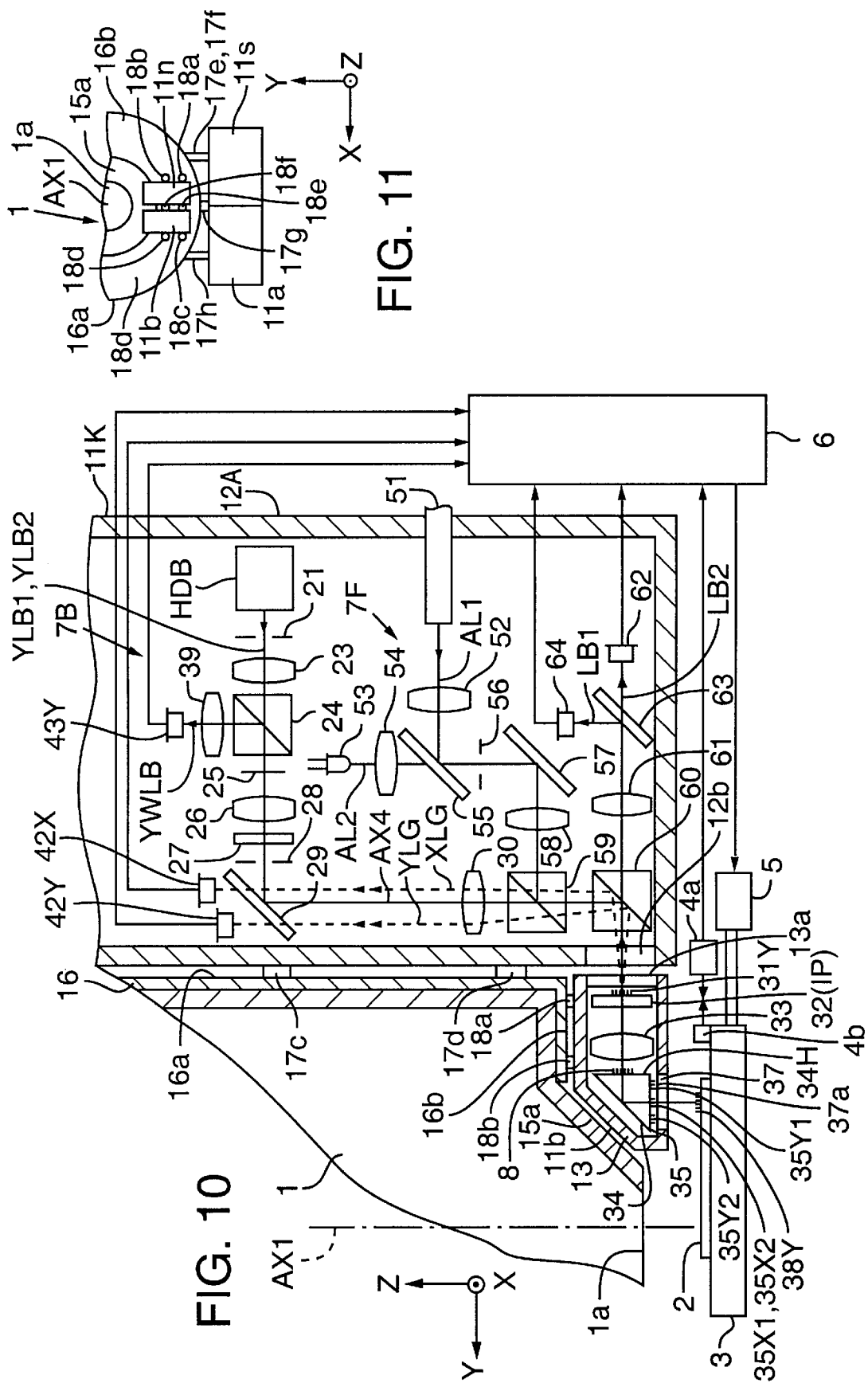

POSITION DETECTION APPARATUS AND ALIGNER COMPRISING SAME

FIELD OF THE INVENTION

This invention concerns position-detection apparatus and methods adapted for and favorably applied for alignment sensing and control as used in microlithography as employed for manufacturing semiconductor devices, displays, and the like having high integration density. More specifically, the invention concerns apparatus and methods for achieving, when using a "stepper" or other aligner, proper alignment between a photosensitive substrate and a mask or reticle (defining a pattern to be transferred to the photosensitive substrate) before an exposure is made of the reticle pattern onto the surface of the photosensitive substrate.

BACKGROUND OF THE INVENTION

Modern semiconductor processing is typically performed using at least one photolithographic step involving an apparatus that projects a pattern, defined by a mask or reticle, onto the surface of a photosensitive substrate (e.g., "wafer"). Semiconductor devices manufactured using such an apparatus include, for example, integrated circuits, microprocessors, memories, liquid-crystal display devices, image-pickup devices (CCDs, etc.), and thin-film magnetic heads. Such apparatus are usually termed "aligners" or "steppers". Virtually all aligners and steppers comprise an apparatus operable to properly align the photosensitive substrate with the mask before an exposure is made.

More specifically, steppers and other projection-exposure apparatus typically comprise an alignment apparatus operable to ensure high-precision overlay registration of the mask with the substrate. To facilitate such alignment, alignment marks are provided at each exposure region ("die") on the wafer.

Contemporary alignment apparatus typically exploit one of the following technologies: (1) LSA (Laser-Step Alignment), wherein laser light is irradiated on an alignment mark configured as an array of dots on the wafer, and the position of the mark is detected using light that has been diffracted or scattered by the mark; (2) FIA (Field Image Alignment), involving processing of image data picked up from an alignment mark on the wafer illuminated by light produced by a halogen lamp source and having a broad spectral bandwidth; and (3) LIA (Laser Interferometric Alignment), wherein an alignment mark, in the form of a diffraction grating, on the wafer is irradiated from two directions by laser light of the same or slightly different frequencies, the resulting two beams of diffracted light are caused to interfere with one another and the position of the alignment mark is measured from the phases of such interference.

Conventional alignment methods typically fall into one of the following categories: (1) TTL (Throughthe-Lens), wherein the position of an alignment mark on the wafer is measured by passing light from the alignment mark through a projection optical system; (2) Off-Axis, wherein the position of an alignment mark on the wafer is measured directly without passing light from the alignment mark through a projection optical system; and (3) TTR (Through-the-Reticle), wherein both the wafer and the reticle (mask) are simultaneously viewed via a projection optical system and the relative positional relationship between the mask and wafer is detected.

When performing alignment of a reticle and wafer through the use of one of the foregoing, the magnitude of a baseline, which is the distance between the center of measurement of the alignment sensor and the center of the projected image of the reticle pattern (i.e., the center of exposure), is determined in advance. Then, by using the alignment sensor to detect the offset of the alignment mark from the measurement center, and by moving the wafer a distance equal to the offset after correction for the baseline, the center of the exposure region in question is accurately aligned to the center of exposure.

However, over the course of continued use of the aligner, a gradual change in the magnitude of the baseline can arise. Such "baseline drift" can cause a decline in alignment precision (i.e., the precision of overlay registration). As a preventative measure, periodic baseline checks are usually performed, usually to ensure accurate measurements of the distance between the alignment-sensor measurement center and the exposure center.

However, despite periodic baseline checks, declines in alignment precision can arise during the intervals between baseline checks if the baseline drifts over shorter periods. One factor responsible for such short-period baseline drifts or other baseline fluctuations is displacement of the alignment-sensor measurement center position concomitant with mechanical vibration or thermal deformation resulting from irradiation by the illuminant light for exposure, atmospheric changes, or other environmental changes. Thus, even if the alignment sensor and the wafer are actually stationary with respect to each other, such drift can cause a change in positional offset between the measurement center and the alignment mark, resulting in alignment error.

The resistance to change in the positional offset between the measurement center of an alignment sensor and the alignment mark which it measures is referred to herein as the "drift stability" of the alignment sensor.

Because off-axis-type alignment sensors do not use a projection optical system in detecting the alignment mark on the wafer, it is important (more important than with TTL-type and other alignment sensors that do use a projection optical system) to improve the drift stability of off-axis-type alignment sensors as much as possible.

In recent years, to accommodate a trend toward finer linewidths (feature sizes) for semiconductor devices and the like, increasingly shorter wavelengths of illumination light have been required to attain satisfactory high resolution. I.e., ultraviolet illumination light is increasingly being used, including far ultraviolet light generated by, e.g., KrF excimer lasers or ArF excimer lasers. Projection apparatus using, e.g., excimer lasers as the exposure illuminant light increasingly employ off-axis-type alignment sensors because of their liberal degrees of freedom in design and high potential performance. (TTL-type alignment sensors experience myriad technical difficulties when used with such projection apparatus.) However, unless the drift stability of an off-axis-type alignment sensor is high, undesirable declines in alignment precision will arise compared to the precision of alignment realized using TTL or other alignment methods.

SUNMMARY OF THE INVENTION

In view of the shortcomings of the prior art summarized above, an object of the invention is to provide a position-detection apparatus having superior drift stability and permitting highly precise detection of the position of the object being detected (position detection mark) despite environmental changes such as changes in atmospheric pressure, or changes in temperature produced as a result of illuminant light, internally generated heat, and so forth.

Another object is to provide an exposure device that is equipped with such a position-detection apparatus.

According to one aspect of the invention, a first embodiment of a position-detection apparatus is provided for determining the position of an object such as a photosensitive substrate (especially a wafer or other substrate that will be the subject of a microlithography process). The position-detection apparatus comprises an irradiation optical system operable to irradiate coherent illuminant light on a position-detection mark formed on the object being detected. The irradiation optical system preferably comprises a heterodyne laser-beam generation system, and also preferably comprises an appropriate assemblage of optical components as required such as, for example, one or more field stops, beam separator or analogous component, condensing lenses, and quarter-wave plate. The apparatus also comprises a condenser optical system operable to condense light diffracted from the position-detection mark. The condenser optical system preferably comprises an appropriate assemblage of optical components as required such as, for example, condensing lens(es), beam splitters and deflectors, field stop, objective lens, and relay lens. The apparatus also comprises a first photoelectric detector operable to receive the condensed diffracted light and to photoelectrically convert the condensed diffracted light into first electrical signals. The apparatus also comprises a first fiducial (reference) body situated between the detected object and the condenser optical system. The first fiducial body defines a first fiducial mark having a measurement direction. The first fiducial mark, when irradiated by the coherent illuminant light from the irradiation optical system, produces multiple diffracted light beams. The first fiducial mark can comprise multiple separate reference marks corresponding to each of the dimensions of movement of the object. The apparatus also comprises a combining optical system operable to receive the multiple diffracted light beams from the first fiducial mark. The combining optical system can comprise, e.g., an index plate preferably defining at least one index mark for each of the dimensions of movement of the object. The apparatus also comprises a second photoelectric detector operable to receive, via the combining optical system and the condenser optical system, the multiple diffracted light beams from the first fiducial mark and to photoelectrically convert the received light into second electrical signals. Finally, the apparatus comprises a processor or analogous means operable to receive the first and second electrical signals and determine from the signals the position of the position-detection mark relative to the fiducial mark. Thus, the position of the object can be detected.

As summarized above, the first fiducial body is arranged between the condenser optical system and the object. The first fiducial body preferably comprises multiple fiducial marks (reference marks) in a measurement direction and the object preferably has one or more position-detection marks. Plural beams of diffracted light from the position-detection mark (i.e., the "first wafer-mark detection light") and plural beams of diffracted light from the fiducial mark(s) (i.e., the "fiducial-mark detection light") are preferably condensed by the same condenser optical system. The relative position of the position-detection mark relative to the fiducial mark(s) is detected using, e.g., the LIA method. If any drift should arise in the condenser optical system (e.g., due to ambient heat generation or a change in atmospheric pressure), the drift would have the same effect on the first wafer-mark detection light and the fiducial-mark detection light. This provides improved drift stability and improved precision with which the position-detection mark can be detected.

At least two fiducial marks are preferably provided at two separate locations in the measurement direction on the fiducial body in the measurement direction. Also, the combining optical system is preferably operable (such as by including condensing and deflecting components) to deflect light diffracted from the fiducial marks, to condense the diffracted light, and to combine the diffracted light into a single optical path. I.e., the combining optical system forms a single beam from the diffracted light from the fiducial marks.

According to another aspect of the invention, the first embodiment of a position-detection apparatus summarized above can comprise a second fiducial body situated between the detected object and the condenser optical system. At least one index mark is formed on the second fiducial body. An illumination optical system is included that is operable to illuminate the position-detection mark and the index mark (s). The illumination optical system can include an appropriate assemblage of optical components such as condenser lens(es), deflectors, and beam splitters as required. The apparatus also comprises a first image-pickup device operable to receive an image from light routed from the position-detection mark and to photoelectrically convert the image into third electrical signals. Routing of the light beam from the position-detection mark to the first image-pickup device is preferably performed by a portion of the condenser optical system. The apparatus also comprises a second image-pickup device operable to receive an image formed from light routed from the index mark by the condenser optical system and to photoelectrically convert the image into fourth electrical signals. Routing of the light beam from the index mark to the second image-pickup device is preferably performed by a portion of the condenser optical system. The processor is operable to receive the third and fourth electrical signals and to determine, from the third and fourth electrical signals, the position of the position-detection mark relative to the index mark. The light from the position-detection mark (termed the "second wafer-mark detection light") and the light from the index mark (termed the "index-mark detection light") are preferably condensed by the condenser optical system. Also, the relative positions of the position-detection mark and the index mark are preferably detected concurrently using, e.g., FIA. Any drift arising in the condenser optical system will have the same influence on the second wafer-mark detection light and the index-mark detection light. As a result, this apparatus exhibits improved drift stability and precision in the detection of the position-detection mark.

According to another aspect of the invention, a first embodiment of an aligner is provided that comprises the first embodiment of a position-detection apparatus summarized above. The first aligner embodiment is operable to transfer and expose a transfer pattern from a reticle (mask) to a photosensitive substrate. The object detected by the position-detection apparatus is the photosensitive substrate, which comprises an alignment mark comprising the position-detection mark. By determining the relative position of the position-detection mark, and thus the alignment mark, on the photosensitive substrate, the position-detection apparatus determines the alignment of the photosensitive substrate relative to the reticle. As a result of being equipped with the position-detection apparatus, such an aligner exhibits excellent drift stability and improved precision with which the position-detection mark is detected. This allows the pattern on the reticle to be transferred to the photosensitive substrate with high precision in overlay registration.

According to another aspect of the invention, a second embodiment of an aligner is provided. The second aligner comprises the first embodiment of a position-detection apparatus as described above, and is operable to transfer and expose a transfer pattern from a reticle (mask) to a photosensitive substrate by way of a projection optical system. The condenser optical system comprises first and second groups of optical components that are preferably independent of each other with respect to their mechanical mountings and housings. The first group of optical components preferably includes a condensing lens. The projection optical system is supported by a first retaining member. The aligner also comprises a second retaining member adapted to hold the first fiducial body on which the first fiducial mark is formed, and to hold the first group of optical components of the condenser optical system. The second retaining member is mounted to a surface of the first retaining member (16) oriented toward the photosensitive substrate. The photosensitive substrate has formed thereon an alignment mark comprising the position-detection mark. The position of the alignment mark relative to the first fiducial mark is detected by the position-detection apparatus. Based on the detection results, the aligner determines the position of the photosensitive substrate relative to the reticle.

The second embodiment of the aligner according to the invention summarized above exhibits all the advantages exhibited by the first embodiment of the aligner. In addition, because the fiducial body and the first group of optical components of the condenser optical system are supported independently of the second group of optical components of the condenser optical system by the second retaining member, the fiducial mark and the position-detection mark are commonly influenced by, for example, any thermal deformation or mechanical vibration arising in the projection optical system or the first retaining member. As a result, this embodiment of an aligner according to the invention exhibits a further reduction in baseline fluctuation, yielding a further improvement in the precision with which the position-detection mark is detected.

According to yet another aspect of the invention, a second embodiment is provided of a position-detection apparatus according to the invention. This embodiment comprises a condenser optical system having an optical axis and being operable to condense a light beam from a position-detection mark formed on a surface of an object being detected. The apparatus also comprises a first photoelectric detector operable to receive the condensed light and to photoelectrically convert the received light into first electrical signals. The apparatus also comprises a first fiducial body situated between the detected object and the condenser optical system. The first fiducial body comprises a surface bearing an index mark. The apparatus also comprises a second photoelectric detector operable to receive light via the condenser optical system from the index mark and to photoelectrically convert the received light into second electrical signals. Finally, the apparatus comprises a processor operable to receive the first and second electrical signals and to determine from the signals the position of the position-detection mark relative to the index mark.

In the second embodiment of a position-detection apparatus according to the invention as summarized above, the condenser optical system is preferably operable to pass a first light beam from the position-detection mark (termed the "detected object-detection light") and a second light beam from the index mark (termed the "fiducial detection light"). As a result, the detected object-detection light and the fiducial detection light are identically influenced by any drift arising in the condenser optical system from heat or mechanical vibration. Thus, this embodiment exhibits improved drift stability and precision of detection (detection reproducibility) of the relative position of the position-detection mark relative to the index mark.

The second embodiment summarized above preferably further comprises an illumination optical system operable to illuminate the position-detection mark with light that, upon reflection from the position-detection mark becomes the detected object-detection light, and to illuminate the index mark with light that, upon reflection from the index mark, becomes the fiducial detection light. The apparatus also preferably includes a reflecting member operable to substantially conjugate the surface on which the index mark is formed and the surface on which the position-detection mark is formed. The reflecting member performs the conjugation by reflecting toward the index mark a third light beam already irradiated on the index mark by the illumination optical system and now propagating toward the detected object by way of the index mark. The reflecting member also reflects the fiducial detection light, propagating from the index mark, that subsequently passes through the condenser optical system and is received by the second photoelectric detector.

In the second embodiment, the lengths of the optical paths of the detected object-detection light and the fiducial detection light are preferably substantially the same. This facilitates a shared use of at least a portion of the condenser optical system, and permits the light-receiving surfaces of the first and second photoelectric detectors to be situated such that the surfaces are essentially equidistant from the condenser optical system.

Further with respect to the second embodiment of an aligner, the surface on which the index mark is formed is preferably situated proximally to the surface on which the position-detection mark is formed. Such a proximal arrangement of the index mark and the position-detection mark provides further improvement to drift stability.

The condenser optical system of the second aligner embodiment can comprise an imaging optical system operable to form an image of the position-detection mark and an image of the index mark. In such an embodiment, the first and second photoelectric detectors are preferably each configured as an image-pickup device operable to respectively pick up (preferably simultaneously) the image of the position-detection mark and the image of the index mark. Such an embodiment preferably further comprises a light-blocking member within the illumination optical system. The light-blocking member is operable to partially block the third light beam, propagating by way of the reflecting member from the illumination optical system toward the index mark, at a location conjugate to the index mark. Such a configuration prevents unwanted stray light from encroaching upon the fiducial detection light and prevents a decrease in contrast, at the second image-pickup device, of the image of the index mark. Thus, the signal-to-noise ratio of the corresponding second electrical signals is improved. A similar configuration can also be included with respect to the position-detection mark to improve the signal-to-noise ratio of the corresponding first electrical signals.

Such an embodiment further comprises a height adjuster operable to adjust the position, along the optical axis (i.e., along the Z direction) of the condenser optical system, of the index mark or of an image of the index mark. Such an embodiment preferably further comprises an environmental-state monitor operable to perform measurements of environmental conditions ambient to the position-detection apparatus. Such an embodiment preferably further comprises an offset computer operable to determine the magnitude of an offset between a target location and an actual location at which a light beam (specifically, the fiducial detection light) from the index mark is condensed by the condenser optical system in accordance with the measurements performed by the environmental-state monitor indicating a magnitude of change in the ambient environmental conditions. The height adjuster is operable to adjust the position along the optical axis, based on the magnitude of offset determined by the offset computer, of the index mark or of an image of the index mark. As a result, offset that would otherwise occur due to environmental fluctuations while condensing the fiducial detection light no longer occurs, providing increased stability to the detection position of the index mark. Consequently, the position-detection mark can be detected with improved precision.

In the foregoing apparatus that comprises an environmental-state monitor and offset computer as summarized above, it is further preferable that the processor be operable to determine, from the predetermined magnitude of offset as determined by the offset computer, a corrected position of the position-detection mark relative to the index mark. Such a configuration provides even further improvement in the precision with which the position-detection mark is detected.

According to yet another aspect of the invention, a third embodiment of an aligner is provided that comprises the second embodiment of a position-detection apparatus as described above. The aligner is operable to expose a transfer pattern from a reticle (mask) to a photosensitive substrate. The substrate has a surface including an alignment mark comprising the position-detection mark. Thus, the position of the alignment mark relative to the index mark is detected by the position-detection apparatus, thereby permitting the aligner to achieve high-precision alignment of the photosensitive substrate with the reticle based on the position-detection results obtained by the position-detection apparatus.

According to yet another aspect of the invention, a fourth embodiment of an aligner is provided that comprises the second embodiment of a position-detection apparatus as summarized above. The aligner is operable to expose a transfer pattern from a reticle (mask) to a photosensitive substrate. To such end, the aligner comprises a projection optical system supported by a first retaining member. The aligner also comprises a second retaining member operable to support the fiducial body on which the index mark is formed and to support the first group of optical components of the condenser optical system independently from the second group of optical components of the condenser optical system. The second retaining member is secured to a surface of the first retaining member oriented preferably toward the photosensitive substrate In the fourth aligner embodiment, the substrate has a surface including an alignment mark comprising the position-detection mark. Thus, the position of the alignment mark relative to the index mark is detected by the position-detection apparatus, thereby permitting the aligner to achieve high-precision alignment of the photosensitive substrate with the reticle based on the position-detection results obtained by the position-detection apparatus.

The fourth aligner embodiment provides advantages as summarized above with respect to the second aligner embodiment. The fourth embodiment also provides compensation for any thermal deformation or mechanical vibration arising in the projection optical system or the first retaining member. This is because the fiducial body, on which the index mark is formed, and the first group of optical components (including a condenser lens) of the condenser optical system are supported by the second retaining member independently of the second group of optical components of the condenser optical system. As a result, the aligner exhibits a substantially improved drift stability.

The foregoing and additional features and advantages of the present invention will be more readily apparent from the following detailed description, which proceeds with reference to the accompanying drawings.

BRIEF DESCRIPTION OF THE DRAWINGS

FIG. 1 is a simplified partial cutaway elevational view of an LIA-type position-detection apparatus (alignment sensor) according to a first example embodiment of the invention, and of a portion of an aligner incorporating the position-detection apparatus.

FIG. 2 is a side view of the main body of the LIA-type alignment sensor shown in FIG. 1.

FIG. 4(a) depicts, with respect to the first example embodiment, the optical path of the reference-mark detection light.

FIG. 4(b) is a side view of FIG. 4(a).

FIG. 10 is a simplified partial cutaway elevational view of a position-detection apparatus (alignment sensor) according to a third example embodiment of the invention, and of a portion of an aligner incorporating the position-detection apparatus.

FIG. 11 depicts certain features of a fourth example embodiment of an alignment sensor according to the invention, as viewed from the wafer side of the projection optical system.

DETAILED DESCRIPTION

First Example Embodiment

A first example embodiment of a position-detection apparatus according to the invention is discussed below with reference to FIGS. 1–6. This example embodiment is specifically directed, inter alia, to an alignment sensor employing both the LIA method and the off-axis method and equipped with a stepper-type projection aligner that exposes an entire reticle pattern onto each exposure region on a wafer by way of a projection optical system.

FIG. 1 is a partial cross-sectional view showing principal components of the projection aligner of this example embodiment, and FIG. 2 is a side view of the internal optical system of FIG. 1.

In FIG. 1, a pattern from a reticle, not shown, is transferred to each of the exposure regions (termed "shot regions") on a wafer 2 by way of a projection optical system 1. In FIG. 1, the Z axis is parallel to an optical axis AX1 of the projection optical system 1, the Y axis is parallel to the plane of the page, and the X axis is perpendicular to the plane of the page. Thus, the X and Y axes define a plane perpendicular to the Z axis.

Figure 14:
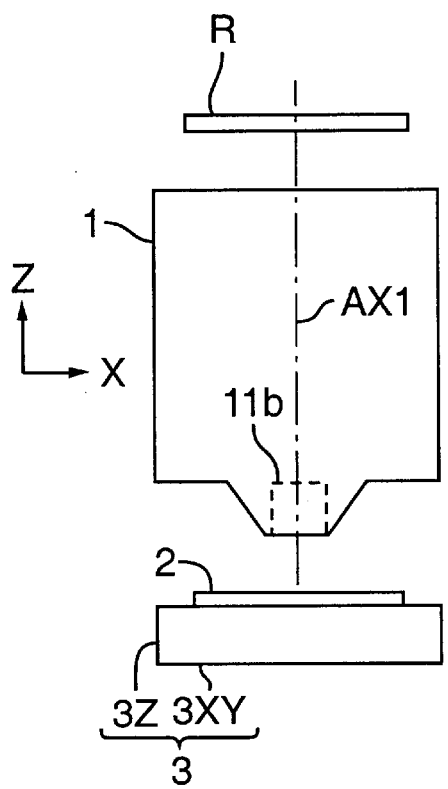
FIG. 14 shows certain features of a projection aligner comprising the alignment sensor of the first example embodiment.

The wafer 2 is mounted on a wafer stage 3. Referring to FIG. 14 (which is a simplified side view, looking in the Y direction, of FIG. 1), the wafer stage 3 comprises a Z-tilt stage 3Z on which the wafer 2 is mounted by way of a wafer holder (not shown). The Z-tilt stage 3Z is operable, by means of an internal drive system, to move the wafer 2 in the direction of the optical axis AX1 (i.e., in the Z direction), to tilt the wafer 2, and to rotate wafer 2 about the optical axis AX1. The wafer stage 3 also comprises an X-Y stage 3XY on which the Z-tilt stage 3Z is mounted. The X-Y stage 3XY is operable, by means of a wafer-stage driver 5 (FIG. 1), to move the wafer in the X direction or in the Y direction with respect to the projection optical system 1.

Returning to FIG. 1, a movable mirror 4b, operable to reflect a laser beam from an external laser interferometer 4a, is secured to an end of the wafer stage 3; the position of the wafer stage 3 in the X and Y directions, and the angular rotation of the wafer stage 3, are measured by means of the laser interferometer 4a interacting with the movable mirror 4b. Positional data from the laser interferometer 4a are supplied to a central controller 6, which has overall control of the entire apparatus. The central controller 6 controls the positioning of the wafer stage 3 by actuating a wafer-stage driver 5 based on this positional data.

Figure 6A:
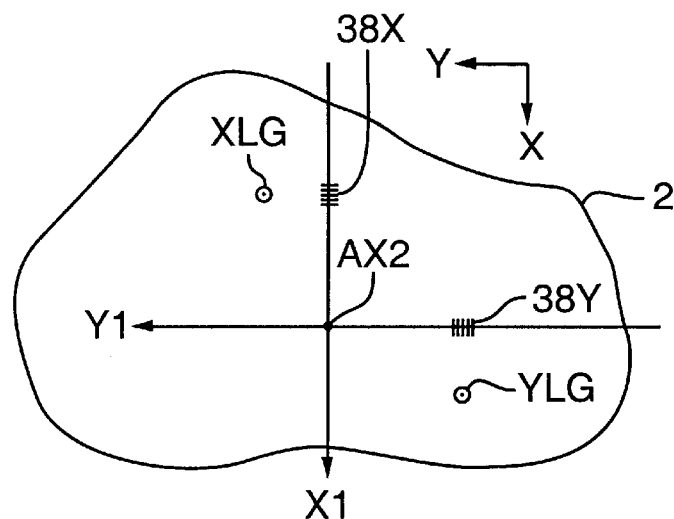
FIG. 6(a) is an enlarged plan view, with respect to the first example embodiment, showing locations where reference-mark detection light appears to exit the wafer 2.

Each of the shot regions on the wafer 2 is provided with a Y-axis wafer mark (Y-axis alignment mark) in the form of a diffraction grating having a pitch PW in the Y direction for the purpose of aligning the wafer 2 with the reticle (FIG. 6(a). (Only the Y-axis wafer mark 38Y for one particular shot region is shown in FIG. 1.) In addition, the shot region is also provided with an X-axis wafer mark 38X (FIG. 6(a)). The reticle and each shot region on the wafer 2 are aligned with each other by detection of the positions of these wafer marks 38Y and 38X using an alignment sensor according to this example embodiment.

The off-axis, LIA-type alignment sensor 7 according to this example embodiment preferably utilizes a heterodyne beam-generation system HDB (FIG. 1). The heterodyne beam-generation system HDB can be any of various conventional systems useful for its intended purpose; hence, description of this component is omitted. In addition, to avoid unnecessarily complicating the description, detailed descriptions of detecting the positions of wafer marks on the wafer 2 are limited to the Y-axis direction.

The LIA-type alignment sensor 7 comprises a sensor main body 11a secured to the lower flank of the projection optical system 1 and constituted such that the heterodyne beam generation system HDB and other components are housed within a casing 12. The sensor 7 also comprises an index-objective unit 11b secured to the lower end (and oriented in the −Y direction) of the projection optical system 1. The index-objective unit 11b comprises a right-angle reflecting prism 34 containing reference marks, a first objective lens 33, and an index plate 32 arranged within a casing 13. The lens barrel 15 of the projection optical system 1 is secured to a projection optical system retainer 16 which is secured to a column (not shown). The projection optical system retainer 16 is formed from a low thermal expansion material such as Invar or other such alloy having a low coefficient of thermal expansion. Also, care is exercised to ensure that temperature fluctuations in the chamber (not shown) housing the projection aligner of this example embodiment have as little influence as possible on the projection optical system 1 and the alignment sensor 7.

The casing 12 is secured to a flank 16a of the projection optical system retainer 16 by way of multiple supporting frames (of these, supporting frames 17a and 17b are shown in FIG. 1). Like the projection optical system retainer 16, the casing 13 of the index objective unit 11b is formed from a low thermal expansion material such as an alloy having a low coefficient of thermal expansion, and is secured to an underside 16b (near the periphery) of the projection optical system retainer 16 by way of multiple supporting frames (of these, supporting frames 18a and 18b are shown in FIG. 1). It is important that the measurement location of the alignment sensor 7 be situated as near as possible to the optical axis AX1 of the projection optical system 1, and that the supporting frames of the index objective unit 11b be arranged symmetrically with respect to an axis parallel to the Y axis.

Below, to facilitate the description, the flank 16a of the projection optical system retainer 16 is regarded as the "D surface," and the underside 16b of projection optical system retainer 16 is regarded as the "C surface." Also, with respect to the projection optical system, the lower inclined surface 15a of the lens barrel 15 is regarded as the "B surface," and the central bottom surface 1a is regarded as the "A surface."

Next, the optical paths of the illuminant light at the alignment sensor 7 are described. The optical axis AX2 is regarded as the optical axis of the optical members described below.

First, two laser beams B1 and B2, of slightly different frequencies and wavelength (average wavelength $\lambda$), exit the heterodyne beam-generation system HDB within the sensor main body 11a such that, when projected onto the ZY plane, the beams intersect at prescribed angles symmetrically with respect to the optical axis AX2. These two laser beams B1, B2 are polarized in more or less the same direction, the direction of oscillation being parallel to the plane of the page in FIG. 1. The two laser beams B1, B2 are then incident upon the aperture of a field stop 21, located at a position conjugate to the surface of the wafer 2, such that the principal rays mutually intersect in the vicinity of the center of the field stop. The laser beams B1, B2, having been given prescribed shapes by the field stop 21, exit the field stop 21 at symmetrical angles and are incident upon an XY-separating half-prism 22.

FIG. 2 is a side view, looking in the −Y direction, of the optical system within the sensor main body 11a of FIG. 1. As shown in FIG. 2, the laser beams B1, B2 are split, by way of the XY-separating half-prism 22, into more or less equal quantities of light to form a pair of illuminant light beams YLB1 and YLB2 for position detection in the Y direction and a pair of illuminant light beams XLB1 and XLB2 for position detection in the X direction.

Returning to FIG. 1, Y-axis illuminant light beams YLB1, YLB2, are transmitted through the XY-separating half-prism 22, and are refracted by a condenser lens 23 such that the principal ray of each beam proceeds parallel to the optical axis AX2. After being transmitted without attenuation through a prismatic polarizing beam splitter (PBS) 24 as P-polarized light, the light beams YLB1, YLB2 are incident at two locations separated from the optical axis AX2 on an entrance-pupil plane 25 of a condenser lens 26. The illuminant light beams YLB1 and YLB2 are refracted by the condenser lens 26 and are converted by a quarter-wave plate 27 from linearly polarized (P-polarized) light to circularly polarized light, forming collimated light beams and mutually intersecting at symmetrical angles at about the center of an aperture defined by a field stop 28 operable to prevent propagation of stray light. The field stop 28 is located at a position conjugate to the surface of the wafer 2 and corresponds to the focal plane of the condenser lens 26. The illuminant light beams YLB1, YLB2 pass through the field stop 28 without being eclipsed by it.

It will be appreciated that the foregoing descriptions of the optical paths of illuminant light beams YLB1 and YLB2 apply equally to the measurement direction (Y direction) in the plane of the page of FIG. 1, and to the cross-measurement direction (X direction) perpendicular to the plane of the page in FIG. 1. Unique to the optical paths of the illuminant light beams YLB1 and YLB2 in the cross-measurement direction is the fact that, as shown in FIG. 2, the principal rays of the illuminant light beams YLB1 and YLB2 have prescribed angles of inclination in the cross-measurement direction (X direction) at the field stops 21 and 28, and at wafer 2, to be described below. The reason for inclining the principal rays of the illuminant light beams YLB1 and YLB2 in the cross-measurement direction, i.e. for deviating from telecentricity in the meridional (M) direction (hereinafter referred to simply as "M telecentricity"), will be described below.

As shown in FIG. 2, an XY-combining deflector mirror 44 is provided above the field stop 28. The XY-combining deflecting mirror 44 is operable to combine, at a location conjugate to wafer 2, the optical paths for detection of the wafer mark 38X (see FIG. 6a) in the X-axis direction and the optical paths for detection of wafer mark 38Y in the Y-axis direction. The XY-combining deflector mirror 44 permits the X-direction-related illuminant light beams XLB1, XLB2 and the detection light from the wafer mark 38X, described below, and the Y-direction-related illuminant light beams YLB1, YLB2 and the detection light from the wafer mark 38Y, described below, to proceed along separate respective optical paths.

Returning again to FIG. 1, the illuminant light beams YLB1, YLB2, having exited field stop 28, are incident upon the surface of a deflector mirror 29, on which a transmitting region 29a is provided at a prescribed location on an otherwise reflective surface. The deflector mirror 29 is mounted obliquely such that it forms a tilt angle of roughly 45° with respect to the optical paths of the illuminant light beams YLB1, YLB2. From the deflector mirror 29, the illuminant light beams YLB1, YLB2 are reflected to the +Y direction. The illuminant light beams YLB1, YLB2 pass through a second objective lens 30 which makes the beams parallel to the optical axis AX2.

The illuminant light beams YLB1 and YLB2 then pass through a window 12a defined by the casing 12 of the sensor main body 11a, and a window 13a defined by the casing 13 of the index objective unit 11b. The windows 12a, 13a are typically transparent plate glass. The illuminant light beams YLB1, YLB2 are incident on the index plate 32 situated within the index objective unit 11b. The index plate 32 is arranged at an entrance-pupil plane IP of an adjacent downstream first objective lens 33.

Figure 3A:
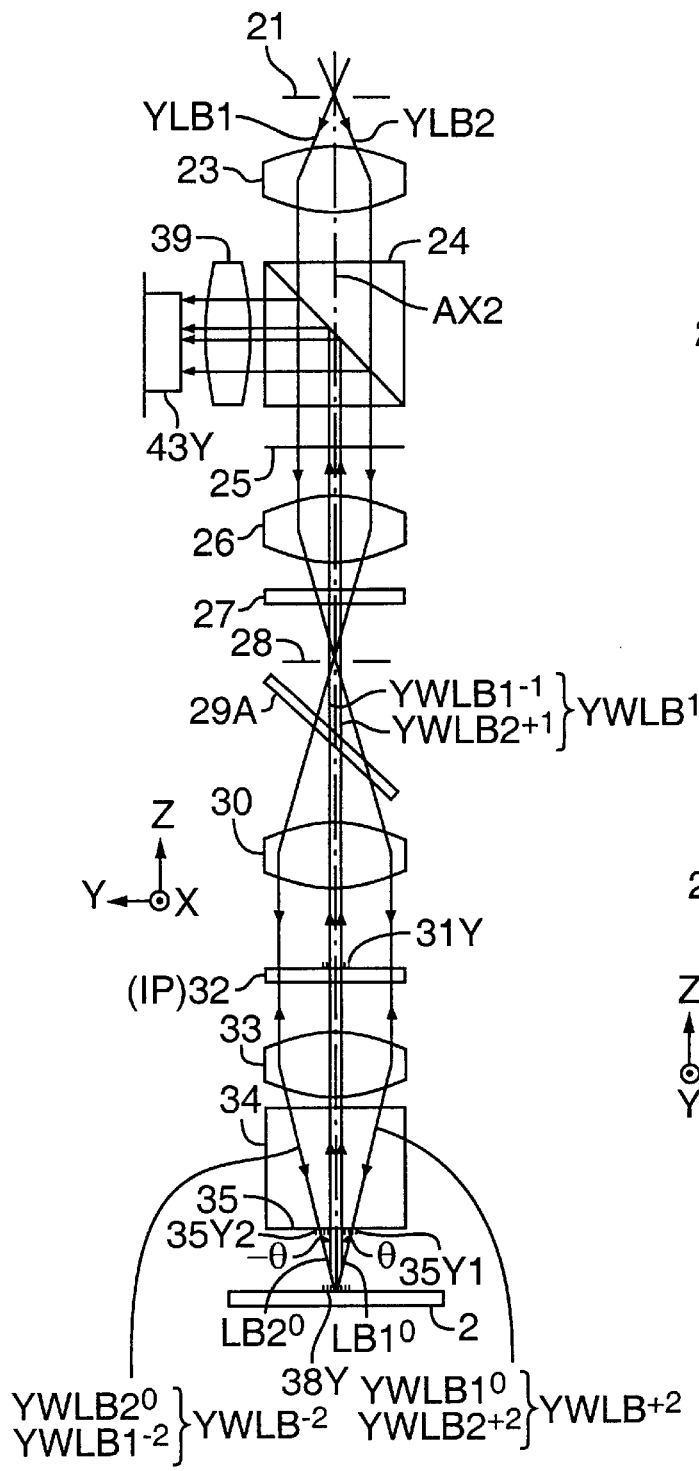
FIG. 3(a) depicts, with respect to the first example embodiment, the optical path of the wafer-mark detection light.

On the index plate 32 in the vicinity of the optical axis AX2 (which passes through the center of the index plate 32), a Y-axis eccentric index mark 31Y (a phase-type diffraction grating made up as a Fresnel zone plate, the grating having a pitch of $P_H$) is defined (See FIG. 3(a)). The illuminant light beams YLB1, YLB2 pass through respective transmitting regions on the index plate 32; the transmitting regions are separated from, and symmetrical with respect to, the optical axis AX2. As described below, an X-axis eccentric index mark 31X (a phase-type diffraction grating having a pitch $P_H$) is also defined by the index plate 32.

The illuminant light beams YLB1 and YLB2, having been transmitted through the index plate 32, are condensed by the first objective lens 33 and are reflected by the right-angle reflecting prism 34. The illuminant light beams YLB1, YLB2 are thus deflected downward to respectively irradiate reference (fiducial) marks 35Y1, 35Y2, respectively, each a diffraction grating (see also FIG. 3(a)). Each reference mark 35Y1, 35Y2 is made up of alternating light and dark patterns at a fixed pitch. The reference marks 35Y1, 35Y2 are arranged at two locations in the Y direction on a plane 35 (referred to as the "RG plane"; the plane 35 also serves as a "fiducial body") of the right-angle reflecting prism 34, the RG plane 35 facing the wafer 2. The RG plane 35 also includes X-axis reference (fiducial) marks 35X1, 35X2 (see FIG. 5d).

Of the diffracted light produced by transmission of the illuminant light beams YLB1, YLB2 through the reference marks 35Y1, 35Y2, respectively, null-order diffracted light $LB1^0$, $LB2^0$, respectively, is transmitted through a window 36 in the casing 13 directly beneath the RG plane 35. The null-order diffracted light $LB1^0$, $LB2^0$ is incident, at angles mutually symmetrical with respect to the optical axis AX2, upon the wafer mark 38Y on the surface of the wafer 2 (coinciding with the focal plane of the first objective lens 33). The region on the wafer mark 38Y irradiated by the null-order diffracted light $LB1^0$, $LB2^0$, is determined by the field stop 21. The aperture of the field stop 28 is set such that its conjugate image on the wafer 2 is somewhat larger than this irradiated region. The pitch $P_G$ of the Y-axis reference marks 35Y1, 35Y2 is of the same order as the pitch $P_W$ of the wafer mark 38Y.

Wafer-mark detection light, made up of diffracted light from the null-order diffracted light $LB1^0$, $LB2^0$, is generated from the wafer mark 38Y. The wafer-mark detection light passes through the index-objective unit 11b, is incident upon the deflector mirror 29 in the sensor main body 11a, is reflected by reflecting region(s) of the deflector mirror 29, becomes S-polarized by passage through the quarter-wave plate 27, is reflected by the PBS 24, and is incident upon a Y-axis photoelectric detector 43Y (FIG. 3(a)).

With respect to light from the illuminant light beams YLB1, YLB2 diffracted from the reference marks 35Y1, 35Y2, reference-mark detection light made up of a pair of first-order diffracted light beams generated at the side toward first objective lens 33, passes through the index-objective unit 11b. The reference-mark detection light is incident on the deflector mirror 29, passes through the transmitting region 29a of the deflector mirror 29, and is incident on the light-receiving surface of a Y-axis photoelectric detector 42Y.

Figure 6B:
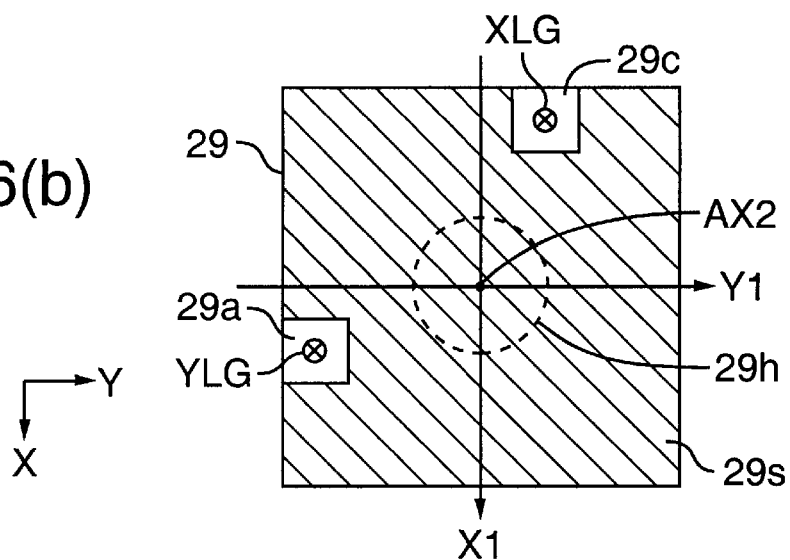
FIG. 6(b) depicts, with respect to the first example embodiment, locations where the reference-mark detection light passes through the deflector mirror 29.
Figure 6C:
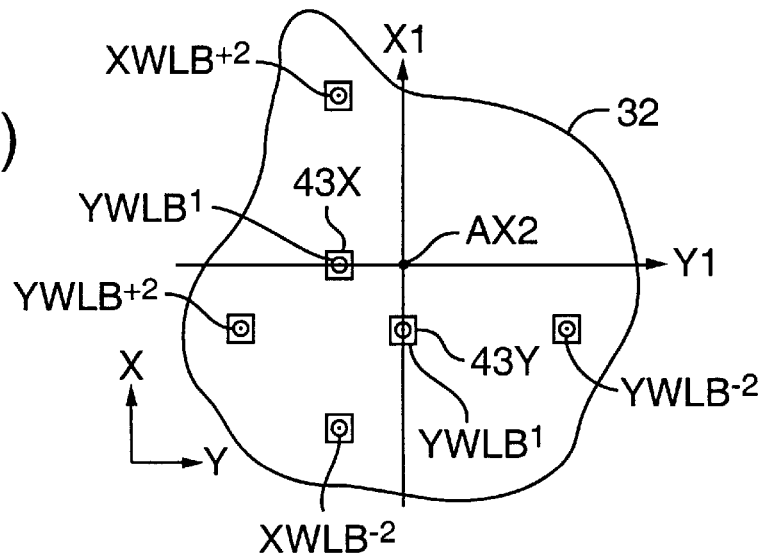
FIG. 6(c) depicts, with respect to the first example embodiment, the detection surfaces of the photoelectric detectors 43Y and 43X projected onto the index plate 32.

Reference-mark detection light from the X-direction reference marks 35X1, 35X2 is similarly transmitted through a separate transmitting region (not shown) of the deflector mirror 29. The light is incident upon the light-receiving surface of an X-axis photoelectric detector 42X. As shown in FIGS. 6(a)–6(c), for example, positive and negative first-order wafer-mark detection light $XWLB^1$, obtained by irradiation of X-direction illuminant light XLB1 and XLB2 on the wafer mark 38X, is detected at the X-axis photoelectric detector 43X.

When the illuminant light beams YLB1, YLB2 are transmitted through and diffracted by the reference marks 35Y1, 35Y2, respectively, large diffraction angles of higher-order diffracted light (i.e., other than null-order diffracted light $LB1^0$, $LB2^0$) are produced. The reference marks 35Y1, 35Y2 are appropriately separated from the surface of the wafer 2. Thus, as is evident from the position of the RG plane 35 on the right-angle reflecting prism 34, the points on the wafer 2 that are irradiated by transmitted higher-order diffracted light from the illuminant light beams YLB1, YLB2 are located considerably away from the conjugate image of the aperture of the field stop 28 on the wafer 2. Accordingly, transmitted higher-order diffracted light is reflected and diffracted at the wafer 2. Even if such light should return to the field stop 28, which is at a location conjugate to the wafer 2, the light would be unable to pass through the aperture of the field stop 28 and would thus be blocked. The light would hence not reach the photoelectric detector 43Y.

Since all of the diffracted light beams produced from reflection of the illuminant light beams YLB1, YLB2 by the reference marks 35Y1, 35Y2, respectively, are such that their apparent exit locations on the wafer 2 are located well away from the conjugate image of the field stop 28 on the wafer 2, they, like the transmitted diffracted light, neither reach the photoelectric detector 43Y, nor become stray light. The field stop 28 may be imparted with the functions of both restricting the irradiation region and preventing stray light; in that case the field stop 21 need not be provided.

Referring now to FIGS. 3($a$), 3($b$), 4($a$), 4($b$), 5($a$)–5($d$), and 6($a$)–6($c$), a more detailed description concerning the optical paths of the wafer-mark detection light and the reference-mark detection light is provided.

FIG. 3($a$) shows the optical paths of the wafer-mark detection light; FIG. 3($b$) is an orthogonal view of FIG. 3($a$), looking into the −Y direction. FIG. 4($a$) shows the optical paths of the reference-mark detection light; FIG. 4($b$) is an orthogonal view of FIG. 4($a$), looking into the −Y direction. In FIGS. 3($a$)–3($b$) and 4($a$)–4($b$), the deflector mirror 29$a$, on which the reflecting region and the transmitting region have been interchanged, is used in place of the deflector mirror 29 shown in FIG. 1 so as to straighten out the optical paths.

As shown in FIG. 3($a$), the angles of incidence, in the measurement direction, of the illuminant light beams YLB1, YLB2 (or, technically speaking, the transmitted null-order diffracted light $LB1^0$, $LB2^0$ produced from the illuminant light beams YLB1, YLB2 by the reference marks 35Y1, 35Y2, respectively) on the wafer mark 38Y are respectively +θ and −θ. The pair of illuminant light beams is symmetrical, in the measurement direction, with respect to an axis parallel to the Z axis, thus ensuring telecentricity in the measurement direction (Y direction). Furthermore, the product of the pitch $P_W$ of the pattern of the wafer mark 38Y and the angle of incidence θ, i.e. $P_W \cdot$ ←, is more or less equal to the wavelength λ of the illuminant light.

As shown in FIG. 3($b$), the angles of incidence α (M telecentricity), in the cross-measurement direction (i.e., X direction), of the null-order diffracted light beams $LB1^0$, $LB2^0$ on the wafer mark 38Y are equal. Null-order diffracted light beams $LB1^0$, $LB2^0$ from the illuminant light beams YLB1, YLB2, respectively, are reflected and diffracted by the wafer mark 38Y, generating null- to second-order diffracted light.

From the wafer mark 38Y, negative first-order diffracted light $YWLB1^{-1}$ from the illuminant light beam YLB1, and positive first-order diffracted light $YWLB2^{+1}$ from the illuminant light beam YLB2, as shown at FIGS. 3($a$)–3($b$), exit parallel to the XZ plane and at a tilt angle α with respect to the YZ plane, such that they more or less overlap one another as they start back on the return trip. In the descriptions below, the light in which the diffracted light $YWLB1^{-1}$, $YWLB2^{+1}$ are combined (a heterodyne beam) is referred to as "wafer-mark detection light $YWLB^1$." Negative second-order diffracted light $YWLB1^{-2}$ from the illuminant light beam YLB1, and null-order diffracted light $YWLB2^0$ from the illuminant light beam YLB2 overlap one another and start back on the return trip on an optical path that is symmetrical to the optical path of the illuminant light YLB2 with respect to an axis parallel to the Z axis.

In the descriptions below, the light in which the diffracted lights $YWLB1^{-2}$, $YWLB2^0$ are combined is referred to as "wafer-mark detection light $YWLB^{-2}$." Furthermore, null-order diffracted light $YWLB1^0$ from the illuminant light beam YLB1, and positive second-order diffracted light $YWLB2^{+2}$ from the illuminant light beam YLB2, overlap one another, starting back on the return trip along an optical path that is symmetrical to the optical path of the illuminant light beam YLB1 with respect to an axis parallel to the Z axis. In the descriptions below, the light in which these diffracted lights $YWLB1^0$ and $YWLB2^{+2}$ are combined is referred to as "wafer-mark detection light $YWLB^{+2}$." Moreover, in the descriptions below, the wafer-mark detection lights $YWLB^1$, $YWLB^{-2}$, and $YWLB^{+2}$ are referred to as "Y-axis wafer-mark detection light YWLB."

Because the three beams of wafer-mark detection light $YWLB^1$, $YWLB^{-2}$, and $YWLB^{+2}$, in which light is respectively combined, each comprise light in which two light beams of slightly different frequencies are combined, their intensities are modulated at prescribed beat frequencies. Further, if the position of the wafer mark 38Y is offset in the measurement direction (Y direction), then there will be corresponding shifts in the phases of the beat signals obtained from photoelectric conversion of this wafer-mark detection light. Because of the deviation of M telecentricity for illuminant light beams YLB1, YLB2, the three beams of wafer-mark detection lights $YWLB^1$, $YWLB^{-2}$, and $YWLB^{+2}$, which possess positional data regarding the wafer mark 38Y at the RG plane 35 pass through a transmitting region on the side opposite their incident optical paths such that they, together with the reference marks 35Y1 and 35Y2, straddle the optical axis AX2.

FIG. 5($b$) shows the arrangement, as viewed from the first-objective-lens 33 side, of the Y-direction illuminant light and two beams of detection light present at the RG plane 35 of the right-angle reflecting prism 34 in FIG. 3($b$). Two reference marks 35Y1 and 35Y2 are situated at locations near the center of the RG plane 35 symmetrically with respect to an axis X1 (which is parallel to the X axis and which passes through the optical axis AX2). The illuminant light beams YLB1, YLB2 are coincident with the reference marks 35Y1, 35Y2, respectively. (Note that FIG. 5($c$), as well as FIG. 5($a$), which will be described below, only show the arrangement for detecting the position of the Y-axis wafer mark 38Y.) The wafer-mark detection light $YWLB^{-2}$, which is made up of negative second-order diffracted light $YWLB1^{-2}$ from the illuminant light beam YLB1 and null-order diffracted light $YWLB2^0$ from the illuminant light beam YLB2, is transmitted through a location symmetrical to the illuminant light beam YLB1 with respect to the axis Y1 (which is parallel to the Y axis and which passes through the optical axis AX2). The wafer-mark detection light $YWLB^{+2}$, which is made up of null-order diffracted light $YWLB1^0$ from the illuminant light beam YLB1 and positive second-order diffracted light $YWLB2^{+2}$ from the illuminant light beam YLB2, is transmitted through a location symmetrical to the illuminant light beam YLB2 with respect to the axis Y1. Furthermore, the wafer-mark detection light $YWLB^1$, which is made up of negative first-order diffracted light $YWLB1^{-1}$ from the illuminant light beam YLB1 and positive first-order diffracted light $YWLB2^{+1}$ from the illuminant light beam YLB2, is transmitted through a location on an axis X1 more or less centrally located between the wafer-mark detection light $YWLB^{-2}$ and the wafer-mark detection light $YWLB^{+2}$. That is, the wafer-mark detection lights $YWLB^1$, $YWLB^{-2}$, $YWLB^{+2}$ pass through transmitting regions at the RG plane 35 in a line that is symmetrical, with respect to the Y1 axis, to a line between the illuminant light beams YLB1 and YLB2. Thus, because of the deviation of M telecentricity for the illuminant light beams YLB1 and YLB2, the wafer-mark detection lights $YWLB^1$, $YWLB^{-2}$, $YWLB^{+2}$ are not coincident with the illuminant light beams YLB1 or YLB2 or with the reference marks 35Y1 or 35Y2.

Returning to FIGS. 3(a) and 3(b), from the RG plane 35, the wafer-mark detection light YWLB, which is made up of the wafer-mark detection lights $YWLB^1$, $YWLB^{-2}$, and $YWLB^{+2}$, is incident upon the first objective lens 33 via the right-angle reflecting prism 34. The wafer-mark detection light YWLB, having become by passage through the first objective lens 33 a condensed light beam (each principal ray proceeds along the optical axis AX2), is incident upon the index plate 32, which is situated on the entrance-pupil plane IP of the first objective lens 33.

Figure 5A:
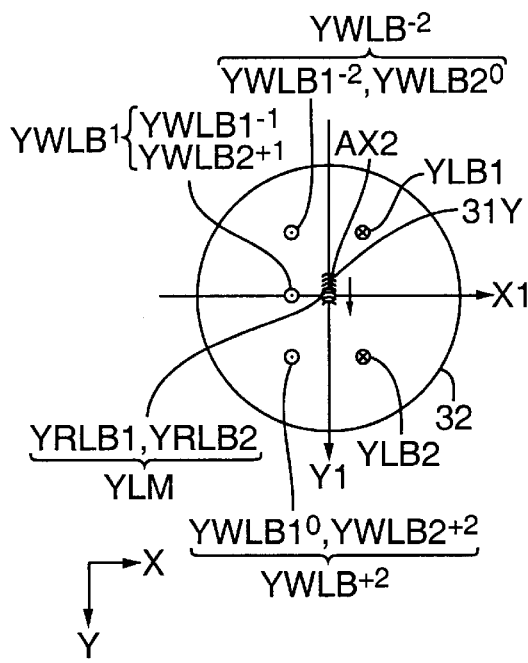
FIG. 5(a) depicts, with respect to the first example embodiment, locations on the index plate 32 through which the illuminant light and the detection light can pass in a first instance.

FIG. 5(a) is a diagram of the Y-direction illuminant light and the three beams of detection light on the index plate 32, as viewed from the second objective lens 30 side. The illuminant light beams YLB1 and YLB2 are condensed at locations that are symmetrical with respect to the X1 axis. The wafer-mark detection light $YWLB^{-2}$ (made up of negative second-order diffracted light $YWLB1^{-2}$ and null-order diffracted light $YWLB2^0$) is condensed at a location that is symmetrical, with respect to the axis Y1, with a point at which the illuminant light beam YLB1 is condensed. Furthermore, the wafer-mark detection light $YWLB^{+2}$ (made up of null-order diffracted light $YWLB1^0$ and positive second-order diffracted light $YWLB2^{+2}$) is condensed at a location that is symmetrical, with respect to the axis Y1, with the point at which the illuminant light beam YLB2 is condensed.

Further with respect to FIG. 5(a), the wafer-mark detection light $YWLB^1$ (made up of negative firs-torder diffracted light $YWLB^{-1}$ and positive first-order diffracted light $YWLB2^{+1}$) is condensed at a location that is midway between the wafer-mark detection light $YWLB^{-2}$ and the wafer-mark detection light $YWLB^{+2}$, i.e. on the axis X1. Hence, just as at the RG plane 35, the wafer-mark detection lights $YWLB^1$, $YWLB^{-2}$, $YWLB^{+2}$ are transmitted through the transmitting regions at the index plate 32 in a line that is symmetrical, with respect to the Y1 axis, to a line drawn between the illuminant light beam YLB1 and YLB2. The eccentric index mark 31Y is formed on the optical axis AX2 roughly in the center of the index plate 32.

The reference-mark detection lights YRLB1 and YRLB2, which are the positive and negative, respectively, first-order diffracted light beams from the reference marks 35Y1 and 35Y2 on the RG plane 35, are condensed so as to be coincident on the eccentric index mark 31Y. (In FIG. 5(a), the arrow just to the right of the index mark 31Y indicates the direction in which the light beams are diffracted by the index mark 31Y.)

Because of the deviation of M telecentricity for the illuminant light beams YLB1 and YLB2, as described above, the wafer-mark detection light YWLB is not eclipsed by the reference marks 35Y1 or 35Y2 or by the eccentric index mark 31Y as the wafer-mark detection light returns along its optical path.

Returning to FIGS. 3(a) and 3(b), the wafer-mark detection light YWLB, having been transmitted through the index plate 32, is then transmitted through transmitting region(s) of the partially reflective deflector mirror 29A (or in FIG. 1, is reflected by the reflecting regions of the deflector mirror 29) by way of the second objective lens 30; as a result, the beams combined within the wafer-mark detection light YWLB mutually intersect at the aperture of the field stop 28, which is located at a position conjugate to the location on the wafer 2 irradiated by the illuminant light beams YLB1 and YLB2. The wafer-mark detection light YWLB, having passed through the field stop 28 without being eclipsed by it, is converted from circularly polarized light to linearly polarized (S-polarized) light as it passes through the quarter-wave plate 27; the light becomes a condensed light beam by passage through the condenser lens 26, and forms images of three points, which appeared on the index plate 32, on the entrance-pupil plane 25 of the condenser lens 26. S-polarized wafer-mark detection light YWLB, having diverged from the images on the entrance-pupil plane 25 of these three points, is reflected and deflected by the prismatic PBS 24, and is then condensed by a relay lens 39 (the relay lens of the entrance-pupil plane 25), to once again form the images of the above three points upon the light-receiving surface of the Y-axis wafer-mark-detection photoelectric detector 43Y.

The Y-axis photoelectric detector 43Y has dedicated independent photodiodes or analogous photoelectric conversion devices corresponding to the respective images of the points of the beams of the three wafer-mark detection lights $YWLB^1$, $YWLB^{-2}$, and $YWLB^{+2}$. The Y-axis photoelectric detector 43Y outputs three wafer beat signals, at several tens of kHz, obtained from photoelectric conversion of the respective wafer-mark detection lights $YWLB^1$, $YWLB^{-2}$, and $YWLB^{+2}$. The three wafer beat signals are conducted to the central controller 6 (FIG. 1). The X-axis photoelectric detector 43X is also provided with three photoelectric conversion devices that independently receive light from the three beams of the X-axis wafer-mark detection light.

Next, as shown in FIGS. 4(a) and 4(b), among the reflected diffracted light produced as a result of irradiation of the illuminant light beams YLB1 and YLB2 on the reference marks 35Y1 and 35Y2 of RG plane 35, a reference-mark detection light YRLB1 (which is the positive first-order reflected diffracted light from the illuminant light beam YLB1) and a reference-mark detection light YRLB2 (which is the negative first-order reflected diffracted light from the illuminant light beam YLB2) both travel in the general direction of the optical axis AX2 and are nearly parallel as they start back on the return trip. The reference-mark detection lights YRLB1 and YRLB2 are collectively referred to as the pre-combination "reference mark detection light YLM." The reference-mark detection light YLM is incident upon the first objective lens 33 via the right-angle reflecting prism 34. The light beams become condensed by passage through the first objective lens 33, and, as shown in FIG. 5(a), and converge at mutually different angles upon the eccentric index mark 31Y, which lies on the surface of the index plate 32 (located on the entrance-pupil plane IP).

Figure 3B:
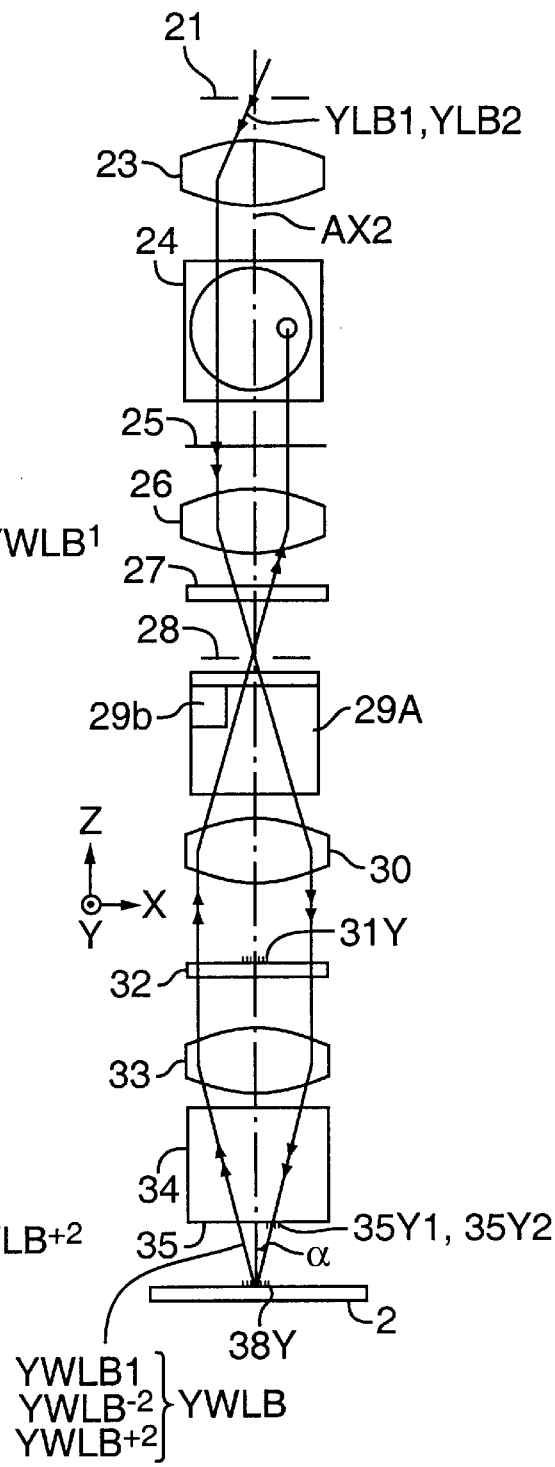
FIG. 3(b) is a side view of FIG. 3(a).

The location where the reference-mark detection light YLM is incident upon the index plate 32 can be controlled. To such end, the locations of the points at which reference-mark detection lights YRLB1 and YRLB2 are respectively incident upon the index plate 32 can be individually controlled in the direction of the optical axis AX2 and within a plane perpendicular to the optical axis AX2. This is done by appropriately setting the pitch PG of the patterns of the reference marks 35Y1 and 35Y2 at the RG plane 35, and the directions in which the patterns of the reference marks 35Y1 and 35Y2 are pitched. As shown at FIGS. 3(a) and 3(b), the angle of incidence $\theta$ in the measurement direction by which the illuminant lights YLB1 and YLB2 irradiate the wafer mark 38Y, and the tilt angle $\alpha$ resulting from the deviation of M telecentricity are taken in consideration. Thus, the pitch PG of the patterns of reference marks 35Y1 and 35Y2 is established slightly narrower than the pitch PW of the pattern of the wafer mark 38Y. Furthermore, the directions in which the patterns of reference marks 35Y1 and 35Y2 are pitched follow along lines drawn from their respective pattern centers to the optical axis AX2 (see FIG. 5(c)). In this way, as shown at FIG. 4(a) and FIG. 4(b), the two light beams of the pre-combination reference mark detection light YLM, produced by reflection and diffraction as a result of irradiation of the illuminant light beams YLB1 and YLB2 on the reference marks 35Y1 and 35Y2, are substantially parallel to the optical axis AX2 as they start back on the return trip. Accordingly, the two illuminant light beams YLB1, YLB2 enter the entrance pupil plane IP such that they overlap at a single point lying more or less on the optical axis AX2.

The location, however, where the two illuminant light beams YLB1, YLB2 converge need not necessarily be on the entrance-pupil plane IP as described above. This is because the index plate 32 must be located within the first objective lens 33 when the entrance-pupil plane IP of the first objective lens 33 is internal to the first objective lens 33. This adds difficulty to making fine adjustments of the position of the index plate 32 in the X, Y, and Z directions. It also adds difficulty to making any angular rotation of the index plate 32 about the optical axis AX2 for the purpose of aligning the eccentric index mark 31Y and pre-combination reference mark detection light YLM.

In actual construction of an optical system, setting the pitch of the reference marks 35Y1 and 35Y2 even narrower allows increases in the respective tilt angles, with respect to the optical axis AX2, of the reference-mark detection lights YRLB1 and YRLB2 (which are reflected diffracted light from the reference marks 35Y1 and 35Y2). Setting the pitch even narrower also causes the location where the pre-combination reference mark detection lights YRLB1, YRLB2, from the interior of the first objective lens 33 to the pupil space (the space including the entrance pupil plane IP) at the side toward the photoelectric detector 42Y, to be coincident. By situating the index plate 32 at this location, fine adjustment of the position of the index plate 32 is facilitated.

In addition to index and reference marks for the Y-axis wafer mark 38Y, index mark(s) and reference mark(s) used for detection of the X-axis wafer mark 38X are also provided on the index plate 32 and the RG plane 35. Since the actual configuration differs slightly from that shown in FIGS. 5(a) and 5(c), we describe this below in such context.

Figure 5B:
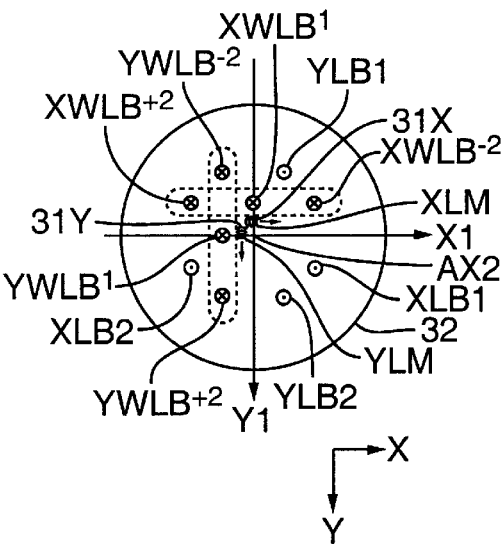
FIG. 5(b) depicts, with respect to the first example embodiment, locations on the index plate 32 through which the illuminant light and the detection light can pass in a second instance.
Figure 5C:
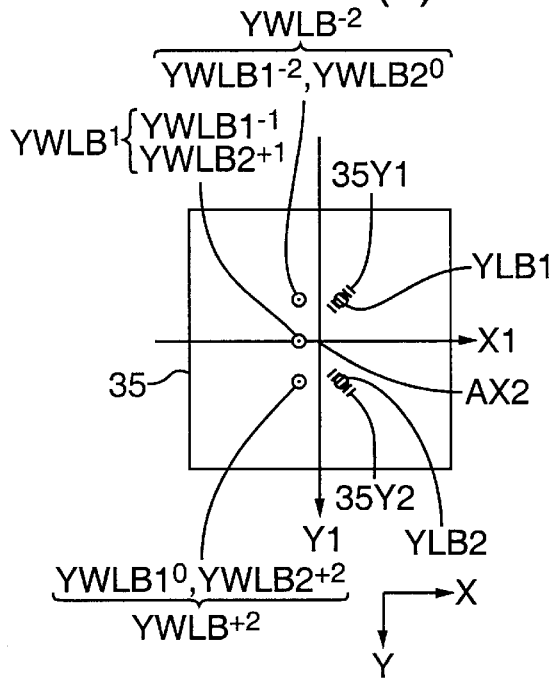
FIG. 5(c) depicts, with respect to the first example embodiment, locations on the RG plate 35 through which illuminant light and detection light can pass when the alignment sensor includes index plate 32 shown in FIG. 5(a).
Figure 5D:
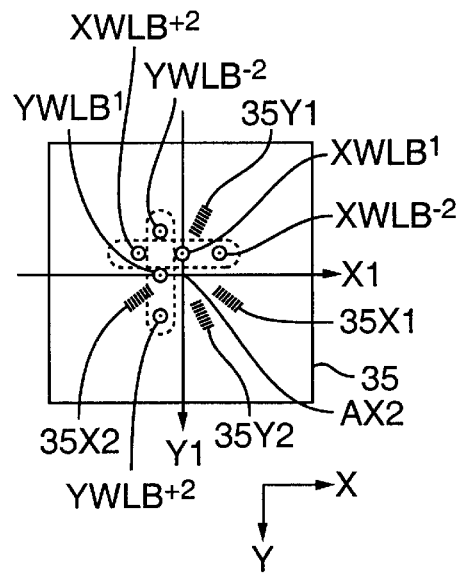
FIG. 5(d) depicts, with respect to the first example embodiment, locations on the RG plate 35 through which illuminant light and detection light pass when the alignment sensor includes the index plate 32 shown in FIG. 5(c).

FIG. 5(b) shows the actual arrangement of the two beams of detection light in the X direction and the Y direction on the index plate 32 as viewed from the second-objective-lens 30 side; and FIG. 5(d) shows the actual arrangement of the two beams of detection light in the X direction and the Y direction on the RG plane 35 of the right-angle reflecting prism 34 as viewed from the first-objective-lens 33 side. In FIG. 5(b), the Y-axis eccentric index mark 31Y is formed at a slightly eccentric location, in the −X direction from the optical axis AX2, on the index plate 32; and the X-axis eccentric index mark 31X, in the form of a Fresnel-zone-plate having a prescribed pitch in the X direction, is formed at a location rotated 90° clockwise about the optical axis AX2 from the Y-axis eccentric index mark 31Y. Apart from the fact that it is rotated relatively 90°, the X-axis eccentric index mark 31X is a grating-form mark essentially identical to the Y-axis eccentric index mark 31Y. Like the Y-axis eccentric index mark 31Y, the X-axis eccentric index mark 31X is configured so as to diffract, in the direction of the arrow, the X-axis reference mark detection light. Further, the X-axis illuminant light beams XLB1 and XLB2 are likewise respectively converged at locations rotated 90° clockwise about the optical axis AX2 with respect to the Y-axis illuminant light beams YLB1 and YLB2. Moreover, the X-axis wafer-mark detection lights $XWLB^1$, $XWLB^{-2}$, and $XWLB^{+2}$ (respectively corresponding to the Y-axis wafer-mark detection lights $YWLB^1$, $YWLB^{-2}$, and $YWLB^{+2}$) are also likewise respectively converged at locations rotated 90° clockwise about the optical axis AX2 from the Y-axis wafer mark detection light.

As shown at FIG. 5(d), the X-axis reference marks 35X1 and 35X2 are provided at locations on RG plane 35 that are rotated 900 about the optical axis AX2 with respect to the Y-axis reference marks 35Y1 and 35Y2. Apart from the fact that they are relatively rotated 90°, the X-axis reference marks 35X1 and 35X2 are grating-form marks essentially identical to the Y-axis reference marks 35Y1 and 35Y2. The X-axis wafer-mark detection lights $XWLB^1$, $XWLB^{-2}$, and $XWLB^{+2}$ are likewise converged at locations rotated 90° clockwise with respect to the Y-axis wafer-mark detection lights $YWLB^1$, $YWLB^{-2}$, and $YWLB^{+2}$.

The directions in which the patterns of the four reference marks 35Y1, 35Y2, 35X1, and 35X2 on the RG plane 35 are pitched to deviate from lines drawn from their respective pattern centers to the optical axis AX2. The angles formed by either the X1 axis or the Y1 axis and the pitched directions are therefore smaller than the case in FIG. 5(c). Consequently, the locations where the pre-combination Y-axis reference-mark detection light YLM and X-axis reference-mark detection light XLM are respectively converged upon the index plate 32 will not lie on the optical axis AX2, as shown at FIG. 5(b). The eccentric index marks 31Y and 31X can thus be arranged such that they do not interfere with each other. As shown in FIG. 5(c), by imparting the eccentric index mark 31Y (located at the point at which the reference-mark detection light YLM converges) with positive refractive power and appropriately setting the refractive power and eccentricity of this eccentric index mark 31Y, it is possible to impart control such that the two beams of transmitted diffracted light produced by the reference-mark detection light YLM at the eccentric index mark 31Y become two overlapping light beams proceeding along more or less the same optical path, as shown in FIG. 4(a). (The light beam in which these two light beams are combined is referred to as the "reference mark detection light" YLG and the overlapping light beam obtained from the X-axis reference-mark detection light XLM at the eccentric index mark 31X is referred to as the "reference-mark detection light" XLG.)

For the sake of simplicity, the distance between the RG plane 35 and the surface of the wafer 2 is assumed to be half the focal length f of the first objective lens 33. As shown in FIGS. 4(a)–4(b), the reference-mark detection lights YRLB1 and YRLB2 proceed long the optical axis AX2 from the reference marks 35Y1 and 35Y2 and are incident upon the eccentric index mark 31Y (which is in the vicinity of the optical axis AX2 on the index plate 32 located on the entrance-pupil plane IP of the first objective lens 33). An angle β is formed at the eccentric index mark 31Y by the pre-combination reference-mark detection light YLM and the optical axis AX2. Formation of this angle β is based on the condition that the distance between the RG plane 35 and the surface of the wafer 2 is half the focal length f of the first objective lens 33; thus, β will be half the angle of incidence θ of the illuminant light beam YLB1 or YLB2 on the wafer 2 (see FIG. 3(a)). Accordingly, the following equation is applicable:

$$\beta = \theta/2 = \lambda/(2P_G) \tag{1}$$

wherein λ is the wavelength of the illuminant light beams YLB1 and YLB2, and $P_G$ is the pitch of the patterns of Y-axis reference marks 35Y1 and 35Y2.

Next, if the eccentricity of the eccentric index mark 31Y is denoted by D, and the focal length is denoted by F, then the following equation is applicable:

$$D/F = 2\beta = \lambda/P_G \qquad (2)$$

Where "n" (n=1, 2, 3, . . . ) represents the number of arc-shaped fringes from the center of the complete Fresnel-zone-plate-form pattern (of which the eccentric index mark 31Y is a part) to the point on the eccentric index mark 31Y irradiated by the reference-mark detection light YLM, and where $R_n$ is the radius of the arc at that irradiated point on the pattern, the radius $R_n$ can be calculated from the following equation:

$$R_n = [(2n-1)\lambda F]^{1/2} \qquad (3)$$

Since the eccentricity D is equal to the radius $R_n$ (i.e., $D=R_n$), the following equation arises from this relationship and from Equations (2) and (3):

$$(\lambda \cdot F)/P_G = [(2n-1)\lambda F]^{1/2} \qquad (4)$$

Furthermore, where $\Delta R_n$ is the distance between the arc-shaped fringes at the nth fringe of the complete pattern of which the index mark is a part (i.e., the pattern interval of the eccentric index mark 31Y), the following equation is applicable:

$$\Delta R_n = [\lambda F/(2n-1)]^{1/2} = P_g/2 \qquad (5)$$

Accordingly, the pitch $P_H$ of the pattern of the eccentric index mark 31Y is given by the following equation:

$$P_H = 2\Delta R_n = P_G \qquad (6)$$

Thus, the pitch $P_H$ of the pattern of the eccentric index mark 31Y is equal to the pitch PG of the patterns of the reference marks 35Y1 and 35Y2, and is not dependent on either the focal length F or the eccentricity D of the eccentric index mark 31Y. As is evident from the foregoing description, the focal length F of the eccentric index mark 31Y, as well as its eccentricity D, can both be set arbitrarily, but the pitch $P_H$ of the fringes of the pattern of the eccentric index mark 31Y nearly coincide with the pitch $P_G$ of the fringes of the patterns of the reference marks 35Y1 and 35Y2. This is required to ensure that the post-combination reference-mark detection light YLG will be two overlapping light beams proceeding more or less along the same optical path.

It is possible to cause the post-combination reference-mark detection light YLG to be two overlapping light beams proceeding essentially along the same optical path when a grating consisting of alternating light and dark regions of pitch $P_G$ is used in place of the eccentric index mark 31Y. However, this could cause the reference marks 35Y1 and 35Y2 to become defocused from the surface of the wafer 2, and any defocusing of the images of the reference marks 35Y1 and 35Y2 produced by the reference-mark detection light YLG at the reference-mark photoelectric detector 42Y would require correction. In addition, the photoelectric detector 42Y should be situated a reasonable distance from the deflector mirror 29. Executing such steps could result in instability of the sensor optical system, resulting in a lessening of the precision with which the position of wafer mark 38Y can be detected.

In order to ensure that the wafer mark 38Y can be detected with precision, it is preferable to employ the eccentric index mark 31Y having the diffracting properties of an alternately light-dark grating and the properties of a field lens at the entrance-pupil plane IP. Similar benefits can also be obtained by replacing the eccentric index mark 31Y with an alternately light and dark grating used in combination with an adjacent micro-lens having positive refractive power. The embodiment described above permits one to obtain, as shown in FIGS. 4(a)–4(b), a post-combination reference-mark detection light YLG. The null-order transmitted diffracted light $YRLB1^0$ (produced by the reference-mark detection light YRLB1 at the eccentric index mark 31Y) and the negative first-order transmitted diffracted light $YRLB2^{-1}$ (produced by the reference-mark detection light YRLB2 at the eccentric index mark 31Y), which differ slightly in frequency from one another, overlap and proceed together. As characteristic of the wafer-mark detection light YWLB, the post-combination reference mark detection light YLG possesses beat signal components that are several tens of kHz. If there is an offset in the position of the illuminant light YLB1 or YLB2 incident upon the reference marks 35Y1 and 35Y2, then there will be a corresponding shift in the phase of the reference-mark detection light YLG beat-signal component. After exiting the index plate 32, the reference-mark detection light YLG (possessing information regarding the positions of the reference marks 35Y1 and 35Y2) is once again converted into a collimated beam via the second objective lens 30. The reference-mark detection light is then deflected by the reflecting region(s) of the partially reflective deflector mirror 29A (or, in FIG. 1, is transmitted through the transmitting region 29a of the partially reflective deflector mirror 29), and is received by the photoelectric detector 42Y located immediately downstream of the deflector mirror 29A. The light-receiving surfaces of the photoelectric detector 42Y are located at positions that are essentially conjugate to the reference mark 35Y1. Because the luminous intensity distribution of the reference-mark detection light YLG at the light-receiving surfaces of the photoelectric detector 42Y is such that the two beams of diffracted light $YRLB1^{-1}$ and $YRLB2^0$ that make up the reference-mark detection light YLG more or less overlap with practically no angular misalignment between them, it is possible for the photoelectric detector 42Y to photoelectrically detect, with good contrast, the beat-signal components of the reference-mark detection light YLG. The reference beat signals obtained at the photoelectric detector 42Y as a result of photoelectric conversion of the reference-mark detection light YLG are supplied to the central controller 6 in FIG. 1. Furthermore, as shown in FIG. 1, the X-axis reference-mark detection light XLG is incident upon the photoelectric detector 42X by way of transmitting regions of the deflector mirror 29.

As shown in FIG. 5(b), the index plate 32 is preferably provided with micro-apertures (not shown) centered on the illuminant lights YLB1 and YLB2 and sized appropriately so as to enclose the regions at which the illuminant lights YLB1 and YLB2 pass through the index plate 32. In this fashion, the resulting increase in the depth of focus of the image of the field stop 21 on the wafer 2 enables suppression of uneven illumination at the reference marks 35Y1 and 35Y2 that accompanies defocusing of the image of the field stop 21 whenever the illuminant lights YLB1 and YLB2 irradiate the reference marks 35Y1 and 35Y2. This method yields favorable contrast in the beat-signal components of the reference-mark detection light YLG, which are received at the photoelectric detector 42Y. Also, the index plate 32 is preferably provided with micro-apertures to enclose the respective regions at which the other illuminant light and detection light pass through.

Furthermore, the position of the photoelectric detector 42Y (i.e., the position it would have assuming no deflection by the deflector mirror 29) within a plane perpendicular to the optical axis AX2 in FIGS. 1, 2, 3(a), 3(b), 4(a), and 4(b) is essentially conjugate to a position on the wafer 2 directly beneath the reference mark 35Y1. If the direction of eccentricity (i.e., the diffraction direction) of the eccentric index mark 31Y were to be reversed, the position of the photoelectric detector 42Y within a plane perpendicular to the optical axis AX2 would correspond to the apparent position of the reference mark 35Y2 on the wafer 2. Furthermore, the photoelectric conversion device 42Y may be moved along the optical axis AX2 such that the location of the photoelectric detector 42Y parallel to the optical axis AX2 is conjugate to the field stop 21 rather than the reference marks 35Y1 and 35Y2. In addition, the positive refractive power of the eccentric index mark 31Y may be increased, and other such adjustments may also be carried out. The refractive power of the eccentric index mark 31Y may also be set between a power that would cause the plane of the photoelectric detector 42Y to be conjugate to the reference marks 35Y1 and 35Y2 and a power that would cause the plane of the photoelectric detector 42Y to be conjugate to the field stop 21.

FIG. 6(a)–6(c) illustrate the arrangement of the points at which the X-axis and Y-axis reference-mark detection lights XLG and YLG are incident, with FIG. 6(a) showing the apparent points at which the reference-mark detection lights XLG and YLG exit the wafer 2. FIG. 6(b) shows the arrangement of the reference-mark detection lights XLG and YLG on the deflector mirror 29, and FIG. 6(c) shows the light-receiving surfaces of the wafer-mark photoelectric detectors 43Y and 43X projected onto the index plate 32. In FIG. 6(a), the Y-axis wafer mark 38Y and the X-axis wafer mark 38X are located on axes Y1 and X1 which are parallel to the Y axis and the X axis and which respectively intersect the optical axis AX2.

As shown at FIG. 6(b), the nearly square transmitting regions 29c and 29a are provided on the partially reflective deflector mirror 29 at respective edge regions adjacent to the axis X1 and at the edge region adjacent to the axis Y1. The reference-mark detection lights XLG and YLG are respectively transmitted through corresponding transmitting regions 29c and 29a, and are incident upon the photoelectric detectors 42X and 42Y. The transmitting regions 29c and 29a are surrounded by the reflecting region 29s. The wafer-mark detection lights YWLB and XWLB are reflected at the essentially circular reflection area 29h, indicated by the dashed line and centered on the optical axis AX2, and are respectively received by the photoelectric detectors 43Y and 43X. Note that the Y-axis and X-axis reference-mark detection lights YLG and XLG are measured at the light-receiving surfaces of the reference-mark photoelectric detector 42Y such that the apparent exit points of the lights are in the respective vicinities of the Y-axis wafer mark 38Y and the X-axis wafer mark 38X.

As shown in FIG. 6(c), at the photoelectric detector 43Y for reception of the Y-axis wafer-mark detection light YWLB, and at the photoelectric detector 43X for reception of the X-axis wafer-mark detection light XWLB, the respective wafer-mark detection light is condensed. Hence, just as they were arranged on the index plate 32 in FIG. 5, the Y-axis wafer-mark detection lights $YWLB^1$, $YWLB^{-2}$, and $YWLB^{+2}$ are condensed along the axis Y1, and the X-axis wafer-mark detection lights $XWLB^1$, $XWLB^{-2}$, and $XWLB^{+2}$ are condensed along the axis X1.

As described above, in the example as shown at FIGS. 6(a)–6(c) and FIGS. 5(b) and 5(d), the arrangement on the RG plane 35 of the X-axis reference marks 35X1 and 35X2 and the Y-axis reference marks 35Y1 and 35Y, and the arrangement of the eccentric index marks 31X and 31Y on the index plate 32, and so forth, are such that the marks correspond to the X-axis and Y-axis wafer marks 38X and 38Y.

In a projection aligner comprising the position-detection apparatus described above, the wafer-mark detection lights XWLB and YWLB (possessing positional data regarding the wafer marks 38X and 38Y) are respectively received at the photoelectric detectors 43X and 43Y, and wafer beat signals corresponding to the positions of these detection lights are respectively output from the detectors. The reference-mark detection lights XLG and YLG from the reference marks 35X1 and 35X2 and the reference marks 35Y1 and 35Y2 (which are fiducial marks) are respectively received at the photoelectric detectors 42X and 42Y, and reference beat signals corresponding to the positions pf these detection lights are respectively output from the detectors. The beat signals from the photoelectric detectors 43X and 43Y and from the photoelectric detectors 42X and 42Y are supplied to the central controller 6. Based on the difference in phase between the beat signals from the photoelectric detectors 43X and 42X, the difference in phase between the beat signals from the photoelectric detectors 43Y and 42Y, and positional data from the laser interferometer 4a of the wafer stage 3, the central controller 6 detects the positions of the wafer marks 38X and 38Y within the stage coordinate system (i.e., the coordinate system based on values measured by laser interferometer 4a) with reference to the positions of the reference marks 35X1, 35X2, 35Y1 and 35Y2. The X-axis and Y-axis wafer marks are respectively provided at each shot region on the wafer 2.

More specifically, when detecting the position of, e.g., the Y-axis wafer mark 38Y on the wafer 2, the central controller 6 determines the difference in phase between the reference beat signal from the photoelectric detector 42Y corresponding to the Y-axis reference marks 35Y1 and 35Y2, and the wafer beat signal from the photoelectric detector 43Y corresponding to the wafer mark 38Y. The wafer mark 38Y receives, e.g., the wafer detection light YWLB1, which is composed of two beams of first-order diffracted light. The central controller 6 then moves the wafer stage 3 in the Y direction so as to make that phase difference equal to, for example, zero. When the phase difference is within a prescribed tolerance of being zero, the Y coordinate of the wafer stage 3 measured by the laser interferometer 4a is stored in memory as the position of that wafer mark 38Y in the Y direction. Likewise for the X-axis wafer mark 38X, when the difference in phase between the reference beat signal corresponding to the X-axis reference marks 35X1 and 35X2 and the wafer beat signal corresponding to the wafer mark 38X is within a prescribed tolerance of zero, the X coordinate measured by the laser interferometer 4a is stored in memory as the position of that wafer mark 38X.

The central location of the wafer mark 38Y in the Y direction, reached when the difference in phase is zero between the reference beat signal corresponding to the Y-axis reference marks 35Y1 and 35Y2 and the wafer beat signal corresponding to the Y-axis wafer mark 38Y, can be regarded as the measurement center of the alignment sensor 7 in the Y direction. Likewise, the central location of the wafer mark 38X in the X direction, reached when the difference in phase is zero between the reference beat signal corresponding to the X-axis reference marks 35X1 and 35X2 and the wafer beat signal corresponding to the X-axis wafer mark 38X, can be regarded as the measurement center of the alignment sensor 7 in the X direction.

By way of example, each shot region is aligned according to the enhanced global alignment (EGA) method, in which the coordinate positions of the wafer marks of a plurality of shot regions (sample shots) selected from among all of the shot regions on wafer 2 are detected using the alignment sensor 7, and the array coordinates in the stage-coordinate system of all of the shot regions on the wafer 2 are calculated through statistical processing of the positional data from those sample shots. During exposure, based on the array coordinates calculated using the EGA method, the wafer stage 3 is driven and each shot region is consecutively moved and positioned within the exposure region of projection optical system 1. As a result of irradiation of exposure light, the pattern defined by the reticle R is then exposed onto the subject shot region by way of the projection optical system 1. A baseline check is normally performed previously, in which the distance between the center of the projected image of the reticle pattern (center of exposure) and the center of measurement of the alignment sensor 7 is measured. Such a check is performed through the use of, for example, fiducial mark members or the like (not shown) on the wafer stage 3. The central controller 6, based on positional data for the wafer obtained as described above, drives the wafer stage 3, thereby moving the wafer 2, and drives the reticle stage (not shown), thereby making fine adjustments in the position of the reticle. The image of the reticle pattern is exposed such that each shot region of the wafer 2 is accurately aligned with the image of the reticle pattern.

As described above, in the alignment sensor 7 of FIG. 1, the index-objective unit 11b (comprising the index plate 32, first objective lens 33, right-angle reflecting prism 34, etc.) is isolated from the sensor main body 11a. With respect to the Y-axis detection system, a plurality of reference marks 35Y1 and 35Y2 for obtaining the reference beat signal are provided on the RG plane 35 of the right-angle reflecting prism 34. The eccentric index mark 31Y is employed as an index mark with deflecting and condensing operations directed on the index plate 32.

As a result of being affected by changes in temperature or other such environmental changes caused by irradiation of the wafer by, e.g., an illuminant light flux for exposure, the sensor main body 11a experiences rotational or translational displacements. Deformations can also occur in the interior of the main body 11a. Consequently, the angles of incidence at the entrance-pupil plane IP of the illuminant lights YLB1 and YLB2 (which are incident upon the index-objective unit 11b) fluctuate. Also, the regions on the wafer 2 irradiated by the illuminant lights YLB1 and YLB2 drift.

Whenever reference marks are provided, for example, internal to the heterodyne-beam-generation system HDB, as in the prior art, the drift of the illuminant lights YLB1 and YLB2 on the wafer 2 accompanying such thermal deformations is accompanied by a shift in wafer-mark position. This shift causes the baseline to fluctuate which is a factor in causing degradation in alignment precision (overlay-registration precision).

However, whenever the reference-beat-signal reference marks 35Y1 and 35Y2 are provided internal to the index-objective unit 11b, as in the present embodiment, a change in the angles of incidence of the illuminant lights YLB1 and YLB2 at the entrance-pupil plane IP is accompanied by a change in the phase of the beat-signal components of the post-combination reference mark detection light YLG exiting the reference marks 35Y1 and 35Y2. If heterodyne detection of the position of the wafer mark 38Y is performed with reference to the reference beat signal from the photoelectric detector 42Y (which receives the reference-mark detection light YLG), then drift of the illuminant lights YLB1 and YLB2 on the wafer 2 is automatically corrected. There is also no change in the phase of the beat-signal components of the reference-mark detection light YLG accompanying any change in the incident positions of the illuminant lights YLB1 and YLB2 on the entrance pupil plane IP. In addition, no shift in the illuminant lights YLB1 and YLB2 on the wafer 2 occurs; the only effect is a very slight change in their angles of irradiation with respect to the wafer 2. Consequently, the drift stability of the alignment sensor 7 is extremely high.

The wafer-mark position-detection system, according to the present invention, described above exhibits practically no baseline fluctuation even when the sensor main body 11a experiences thermal deformations or the like. Although the index-objective unit 11b is the only factor that could contribute to baseline fluctuation, the index-objective unit 11b is small compared to the sensor main body 11a and is normally stable with respect to thermal deformation. The index-objective unit 11b also can perform temperature-control measures that are concentrated on the index-objective unit 11b and its surroundings with no wasted effort. Thus, a wafer-mark position detection system is provided that exhibits little baseline fluctuation.

The illuminant light used for detection of the reference marks 35Y1 and 35Y2 is identical to the illuminant light used for detection of the wafer mark 38Y. The only difference in the optical paths of these illuminant lights is the region between the RG-plane 35, on which the reference marks 35Y1 and 35Y2 are formed, and the surface of the wafer 2. The reference-mark detection light YLG and the wafer-mark detection light YWLB share very nearly the same optical path as far as the deflector mirror 29. Because such a configuration causes both signals to be affected simultaneously and to very nearly the same degree by any vibrations, atmospheric fluctuations, or other occurrences in the system that could disturb the optical path, measurement reproducibility during detection of the position of the wafer mark 38Y is improved.

Second Example Embodiment

A second example embodiment of a position-detection apparatus according to the invention is discussed below with reference to FIGS. 7(a)–7(b). This second example embodiment is directed to an alignment sensor employing both an LIA method and an off-axis method.

This second example embodiment utilizes laser beams of two wavelengths (two colors). Use of laser beams of two colors suppresses a phenomenon in which wafer-mark detection is made difficult due to weakening of the returning light as a result of photoresist thickness or wafer-mark steps, or the like. Thus, this example embodiment exhibits an improved precision with which wafer marks are detected. Since the basic configuration, apart from the heterodyne-beam-generation system, is the same as in the first example embodiment shown in FIG. 1, the same reference designators are used to designate components that are the same as in FIG. 1, and further description of such components is not provided here.

Figure 7A:
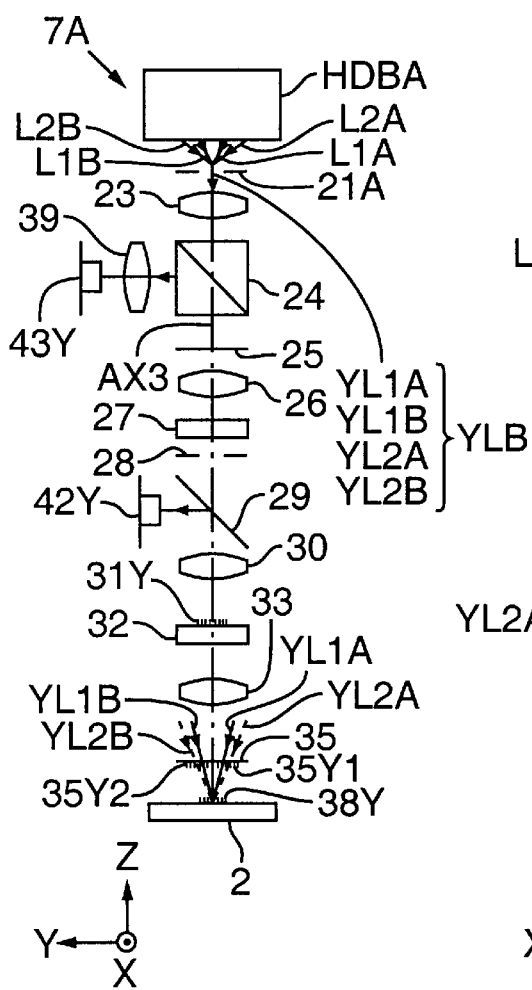
FIG. 7(a) is an optical diagram showing certain features of the second example embodiment of a position-detection apparatus (alignment sensor) of the invention.
Figure 7B:
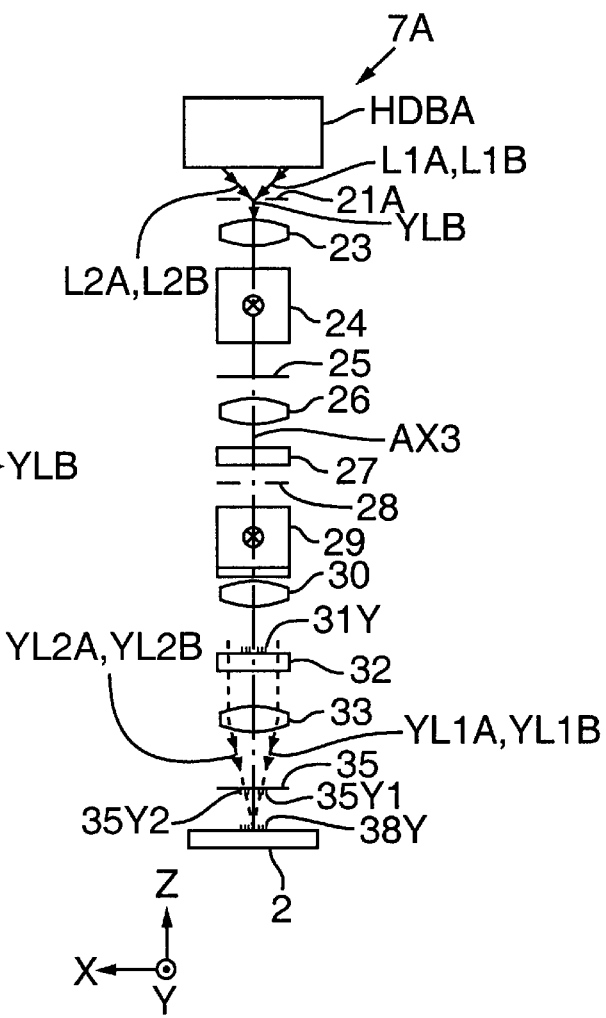
FIG. 7(b) is a side view of FIG. 7(a).

FIG. 7(a) shows the schematic optical diagram of certain principal components of the alignment sensor 7a. FIG. 7(b) is a side view of FIG. 7a. In FIG. 7a, two laser beams L1A and L1B, of slightly different frequencies (the difference in frequency being denoted by $\Delta f$) and having wavelength $\lambda_1$, and two laser beams L2A and L2B, differing in frequency by $\Delta f$ and having wavelength $X_2$ which is slightly greater than the wavelength $\lambda 1$, exit the heterodyne beam-generation system HDBA. Designating the respective frequencies of the laser beams L1A and L2A as $f_{10}$ and $f_{20}$, the respective frequencies of the laser beams L1B and L2B will be ($f_{10}+\Delta f$) and ($f_{20}+\Delta f$). The laser beams L1A, L1B, L2A, and L2B respectively exit the heterodyne-beam generation system HDBA from slightly different locations. As shown in FIG. 7(a), the laser beams L1B and L2B (i.e., the two beams that are higher in frequency by $\Delta f$) exit in the −Y direction relative to the optical axis AX3 at slightly different angles. Similarly, the laser beams L1A and L2A (i.e., the two beams that are lower in frequency) exit in the +Y direction relative to the optical axis AX3 at slightly different angles. Furthermore, as shown in FIG. 7(b), the laser beams L2A and L2B (the two having wavelength $\lambda_2$) exit, at identical angles, in the direction with respect to the optical axis AX3; and the laser beams L1A and L1B (the two having the wavelength $\lambda_2$) exit, at identical angles, in the +X direction with respect to the optical axis AX3.

The laser beams L1A, L1B, L2A, and L2B are condensed at the interior of the aperture, centered on the optical AX3, of the field stop 21A (located at a position conjugate to wafer 2). After the cross sectional profiles of these beams have been thus shaped, the beams are separated by means of a half-prism (not shown) into the Y-axis illuminant light YLB (which is made up of illuminant lights YL1A, YL1B, YL2A, and YL2B) and X-axis illuminant light XLB (which is made up of illuminant lights XL1A, XL1B, XL2A, and XL2B). The beams then respectively proceed along the corresponding Y-axis optical path and X-axis optical path. The illuminant lights YL1A and YL1B respectively correspond to the laser beams L1A and L1B of wavelength $\lambda_1$, and the illuminant lights YL2A and YL2B respectively correspond to the laser beams L2A and L2B of wavelength $x_2$.

Traveling along an optical path similar to that shown in FIG. 1, the illuminant light YLB irradiates the reference marks 35Y1 and 35Y2, as well as the wafer mark 38Y on the wafer 2. A reference-mark detection light and a wafer-mark detection light similar to those of the FIG. 1 embodiment are generated from the reference marks 35Y1, 35Y2 and the wafer mark 38Y. The reference-mark detection light and wafer-mark detection light are respectively received at corresponding photoelectric detectors 42Y and 43Y. A reference beat signal corresponding to the reference marks 35Y1 and 35Y2 is output from the photoelectric detector 42Y, and a wafer beat signal corresponding to the position of the wafer mark 38Y is output from the photoelectric detector 43Y. The same sort of description can be applied to measurement in the X-axis direction.

Figure 8A:
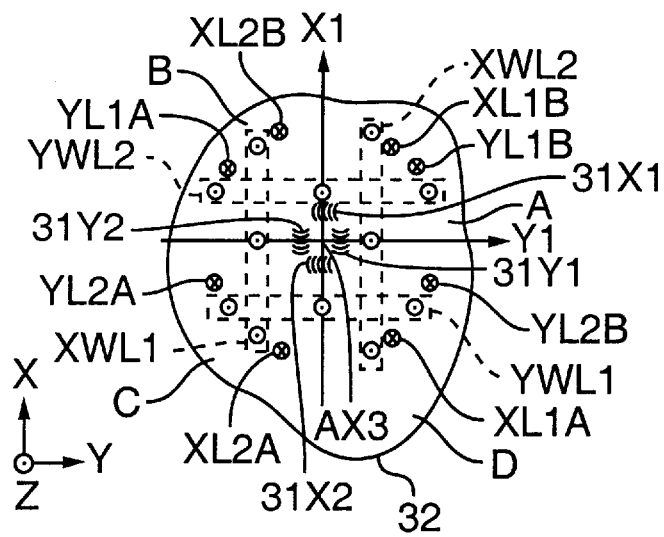
FIG. 8(a) depicts, with respect to the second example embodiment, locations where two beams of detection light in each of the X and Y directions pass through the index plate 32.
Figure 8B:
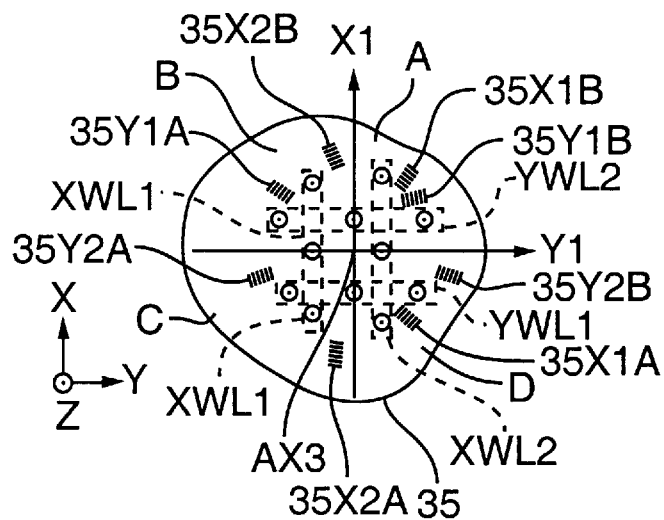
FIG. 8(b) depicts, with respect to the second example embodiment, locations where two beams of detection light in each of the X and Y directions pass through the RG plane 35.
Figure 9A:
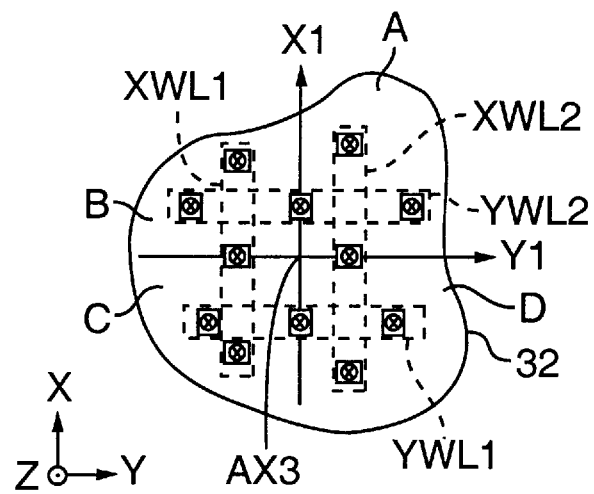
FIG. 9(a) depicts, with respect to the second example embodiment, locations projected onto the index plate 32 at which the wafer-mark detection light is condensed on the photoelectric detectors 43Y and 43X.
Figure 9B:
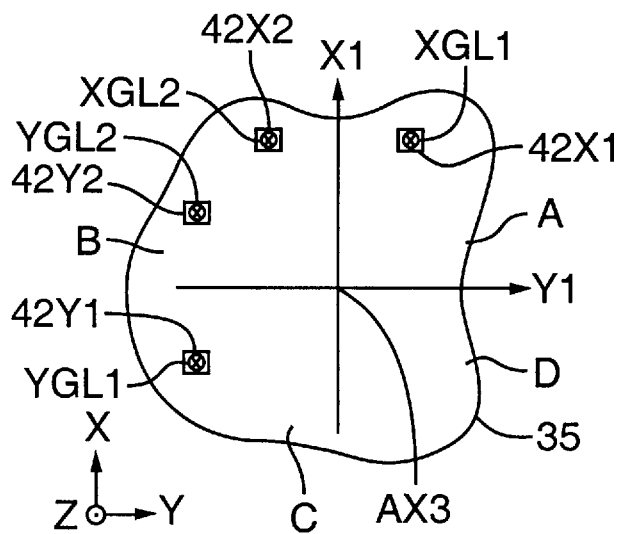
FIG. 9(b) depicts, with respect to the second example embodiment, locations projected onto the RG plane 35 where the reference-mark detection light is condensed on the photoelectric detectors 42Y and 42X.

Reference is now made to FIGS. 8(a), 8(b), 9(a), and 9(b) illustrating various aspects of the optical paths of the Y-axis and X-axis illuminant lights YLB and XLB, respectively. FIG. 8(a) shows the arrangement, as viewed from the second objective lens 30 side, of the Y-axis and X-axis illuminant lights YLB and XLB on the index plate 32. FIG. 8(b) shows the arrangement of the same lights, as viewed from the first objective lens 33 side, on the RG plane 35. FIG. 9(a) shows the points, projected onto the index plate 32, at which the Y-axis and X-axis wafer-mark detection lights YWL and XWL are condensed on the photoelectric detectors 43Y and 43X. Finally, FIG. 9(b) shows the projection, onto the RG plane 35, of the Y-axis and X-axis reference-mark detection lights YGL and XGL on the photoelectric detectors 42Y and 42X.

To facilitate conciseness, each of FIGS. 8(a), 8(b), 9(a), and 9(b) is divided into four quadrants A–D, that represent regions partitioned by the axes X1 and Y1 that intersect the optical axis AX3 and which are respectively parallel to the stage-coordinate-system X and Y axes. The region encompassing the +X direction and +Y direction from the optical axis AX3 is quadrant A, and the region encompassing the +X direction and −Y direction from the optical axis AX3 is quadrant B. The region encompassing the −X direction and −Y direction from the optical axis AX3 is quadrant C, and region encompassing the −X direction and +Y direction from the optical axis AX3 is quadrant D.

As shown in FIG. 8(a), with respect to this second example embodiment employing illuminant light of two wavelengths, there are twice as many points at which the illuminant lights and the wafer-mark detection lights are condensed on the index plate 32 compared to the FIG. 1 embodiment. The two Y-axis eccentric index marks 31Y1 and 31Y2, respectively corresponding to the two beams of reference-mark detection light, are formed on the axis Y1 at locations that are more or less symmetrical with respect to the optical axis AX3. The X-axis eccentric index marks 31X1 and 31X2 are likewise formed on the axis X1 at locations that are more or less symmetrical with respect to the optical axis AX3.

The two beams of Y-axis illuminant light YL1A and YL1B, having slightly different frequencies and having the wavelength $\lambda_1$, are respectively condensed at locations in quadrant B and A that are more or less equidistant from the axis Y1 and that are also more or less equidistant from the axis X1. The wafer-mark detection light YWL1, comprising of the three pairs of diffracted light beams from the null to the second order corresponding to the illuminant lights YL1A and YL1B, is condensed at three points. The three points include two points that are more or less symmetrical, with respect to the Y1 axis, to the points at which the illuminant lights YL1A and YL1B are condensed, and a point that is equidistant between the two points (i.e., a point on the X1 axis).

The two beams of Y-axis illuminant lights YL2A and YL2B, having slightly different frequencies and having the wavelength $\lambda_2$, are respectively condensed at locations in quadrants C and D that are more or less equidistant from the axis Y1 and that are also more or less equidistant from the axis X1. The wafer-mark detection light YWL2, which includes the three pairs of diffracted light beams from the null to the second order corresponding to the illuminant lights YL2A and YL2B, is condensed at three points. The three points include two points more or less symmetrical, with respect to the Y1 axis, to the points at which the illuminant lights YL2A and YL2B are condensed. The three points also include a point that is located equidistantly between the two points (i.e., a point on the X1 axis).

The two beams of X-axis illuminant light XL1A and XL1B (having slightly different frequencies and having the wavelength $\lambda_1$), the wafer-mark detection light XWL1 (including the three pairs of diffracted light beams from the null to the second order corresponding to the illuminant lights XL1A and XL1B), the two beams of X-axis illuminant lights XL2A and XL2B (having slightly different frequencies and having the wavelength $\lambda_2$), and the wafer-mark detection light XWL2 (including the three pairs of diffracted light beams from the null to the second order corresponding to the illuminant lights XL2A and XL2B), are respectively condensed at locations rotated 90° about the optical AX3 from the locations at which the Y-axis illuminant lights YL1A and YL1B, the wafer-mark detection light YWL1, the illuminant lights YL2A and YL2B, and the wafer-mark detection light YWL2 are condensed.

As shown in FIG. 8(b), the reference marks 35Y1A and 35Y1B for the illuminant lights YL1A and YL1B are respectively formed, symmetrically with respect to the axis Y1, in quadrants B and A. The reference marks 35Y2A and 35Y2B for illuminant lights YL2A and YL2B are respectively formed, symmetrically with respect to the axis Y1, in quadrants C and D. The reference marks 35X1A and 35X1B for the illuminant lights XL1A and XL1B, and the reference marks 35X2A and 35X2B for the illuminant lights XL2A and XL2B, are respectively formed at locations rotated 90° about the optical AX3 from the locations of the reference marks 35Y1A and 35Y1B, and the reference marks 35Y2A and 35Y2B.

The Y-axis wafer-mark detection light YWL1 is condensed at three points that include two points more or less symmetrical to the reference marks 35Y1A and 35Y1B with respect to the Y1 axis and a point located equidistantly between the two points (i.e., a point on the X1 axis). The wafer-mark detection light YWL2 is condensed at three points that include two points more or less symmetrical to the reference marks 35Y2A and 35Y2B with respect to the Y1 axis and a point located equidistantly between the two points (i.e., a point on the X1 axis). The X-axis wafer-mark detection light XWL1 and the wafer-mark detection light XWL2 are respectively condensed at points rotated 90° about the optical AX3 from the points at which the wafer-mark detection light YWL1 and YWL2 are condensed.

Further, as shown in FIG. 9(*a*) pertaining to the projection image on the index plate 32, the Y-axis wafer-mark detection lights YWL1 and YWL2, and the X-axis wafer-mark detection lights XWL1 and XWL2, are condensed onto the respective photoelectric conversion components of the photoelectric detectors 43Y and 43X at points (indicated by squares) corresponding to the points at which the lights were condensed on the index plate 32 in FIG. 8(*a*).

As shown in FIG. 9(*b*), in which the light-receiving surfaces of the photoelectric detectors 42Y and 42X are projected onto the RG plane 35, the post-combination reference-mark detection light YGL1 is condensed onto the photoelectric conversion component 42Y1, which is arranged at a position in quadrant C that is proximal to the axis Y1, of the photoelectric detector 42Y. The post-combination reference mark detection light YGL2 is likewise condensed onto the photoelectric conversion component 42Y2, which is arranged at a position symmetrical to the reference-mark detection light YGL1 with respect to axis Y1, of the photoelectric detector 42Y. The post-combination reference-mark detection light XGL1 and the post-combination reference-mark detection light XGL2 are condensed onto the photoelectric conversion components 42X1 and 42X2, which are essentially respectively rotated 90° about the optical AX3 from the photoelectric conversion components 42Y2 and 42Y1.

As discussed above, this second example embodiment employs an illuminant light of two colors. However, the wafer-mark position can be detected in the same manner as in the FIG. 1 embodiment. This would be performed by: (a) setting the directions of the illuminant lights of two wavelengths such that they deviate from M telecentricity in opposite directions, (b) setting the deviating magnitude of M telecentricity so as to ensure that they do not mutually interfere, as shown in FIG. 7(*a*) and FIG. 7(*b*), and (*c*) properly arranging the eccentric index marks, reference marks, photoelectric conversion components of the wafer-mark detection light photoelectric detector, the photoelectric conversion components of the reference-mark detection light photoelectric detector, etc., as shown in FIGS. 8(*a*), 8(*b*), 9(*a*), and 9(*b*).

Also, because the detection method of this second embodiment employs a two-color heterodyne beam, improvement can be realized in the precision with which the wafer-mark position is detected without reducing the intensity of the detection signal, i.e. without reducing the signal to noise ratio, caused by wafer-mark steps or the like.

Third Example Embodiment

A third example embodiment of this invention is shown in FIG. 10. In this embodiment, an FIA-type alignment sensor and an LIA-type alignment sensor similar to that of FIG. 1 are used that share a common objective lens. Hence, they share a common index-objective unit 11*b*. In FIG. 10, components that are the same as in the FIG. 1 embodiment have the same reference designators, and further description of such components is not provided here. Furthermore, whereas the description below is concerned primarily with the Y-axis optical system, the X-axis optical system is similar.

FIG. 10 shows a partial simplified cutaway view of a projection aligner of this example embodiment. The main body of the LIA-type alignment sensor 7B, similar to that shown in FIG. 1, and the main body of the FIA-type alignment sensor 7F are arranged within the casing 12A of the sensor main body ilk. Regarding the optical axis of the LIA-type alignment sensor 7B as the optical axis AX4, the FIA-type alignment sensor 7F is described below.

The FIA-type alignment sensor 7F respectively detects wafer marks and index marks using two beams of illuminant light. A beam of visible light is generated by a source not shown); the light source 53 generates infrared light. The visible-light source comprises a halogen lamp or other suitable source. The visible illuminant light is introduced into the interior of the sensor main body 11*k* via a light guide 51. The light guide 51 comprises an optical fiber or the like that passes through the casing 12A of the sensor main body 11*k*. (Here, the sensor main body 11*k* and the casing 12A correspond to the sensor main body 11*a* and the casing 12 of FIG. 1).

The casing 12A, formed from low-thermal-expansion material, is secured to the D surface of the projection-optical-system retainer 16 via plural supporting frames (two supporting frames 17*c* and 17*d* are shown in FIG. 10).

After exiting in the -X direction from the exit end-plane of the light guide 51, the illuminant light AL1 is condensed by a condenser lens 52 and is incident upon a dichroic mirror 55. The dichroic mirror 55 is mounted at a tilt angle of 45° with respect to the optical axis of the illuminant light AL1. The dichroic mirror 55 exhibits wavelength selectivity such that it reflects visible light and transmits infrared light. The illuminant light AL1, being visible, is reflected downward by the dichroic mirror 55 with practically no attenuation, to uniformly irradiate the field stop 56. As described below, the illuminant light AL2, consisting of infrared light emitted from the light source 53 mounted within the sensor main body 11*a*, is incident upon the dichroic mirror 55 from a direction orthogonal to the illuminant light AL1.

The illuminant light AL1, having passed through a field stop 56, is then condensed at a relay lens 58 via a mirror 57, and is incident upon a first half-prism 59. The first half-prism comprises a half-mirror surface arranged with a tilt angle of 45° to the optical axis of the illuminant light AL1. The illuminant light AL1, after being reflected downward by the half-mirror surface, then travels along the optical path of the illuminant light from the LIA-type alignment sensor 7B and is incident upon a second half-prism 60. The second half-prism comprises a half-mirror surface that is parallel to the half-mirror surface of the first half-prism 59. The illuminant light AL1 is reflected in the +Y direction by the half-prism 60. The illuminant light AL1 then passes through the window 12b provided at a lower side surface of casing 12A, and is incident upon the interior of the casing 13 of the index-objective unit 11b via the window 13a at a side surface of the casing 13.

Next, the illuminant light AL1, proceeding along the optical axis AX4, is incident upon an index plate 32 on which the eccentric index mark 31Y is formed. The index plate is situated on the entrance-pupil plane IP of the first objective lens 33. After forming the projection image of the exit end plane of the light guide 24, the illuminant light is transmitted through the first objective lens 33 and is incident upon the right-angle reflecting prism 34.

The FIA-type diffraction-grating-form index mark 8 is formed at the optical axis AX4 on the plane (hereinafter referred to as the "RH plane") 34H of the right-angle reflecting prism 34 that faces the first objective lens 33.

The illuminant light AL1 is deflected downward by the right-angle reflecting prism 34, and is incident upon a cold mirror 37 (comprising transparent plate glass). Formed on RG plane 35 (which is the surface of right-angle reflecting prism 34 that faces the cold mirror 37) are the Y-axis reference marks 35Y1 and 35Y2 for the LIA-type alignment sensor 7B to the left and the right sides of the optical axis AX4, and two X-axis reference marks 35X1 and 35X2 at symmetrical locations straddling the optical axis AX4 in the x direction. The cold mirror film (hereinafter referred to as the "CM film") 37a, which transmits visible light and reflects infrared light, is adhered to the surface of cold mirror 37.

The illuminant light AL1, being visible light, is transmitted through the cold mirror 37 with practically no attenuation, and then essentially perpendicularly irradiates the wafer mark 38Y, on the wafer 2, corresponding to the focal plane of first objective lens 33. The illuminant light AL1, having irradiated the wafer mark 38Y, is then reflected and diffracted by the wafer mark 38Y. The reflected illuminant light starts back upward on a return trip from the wafer 2 along the optical axis AX4 as the wafer-mark detection light LB1.

The wafer-mark detection light LB1 is once again incident upon the cold mirror 37. After being transmitted through the cold mirror 37 with practically no attenuation by the CM film 37a, the wafer-mark detection light LB1 is deflected in the −Y direction by the right-angle reflecting prism 34 and is incident upon the first objective lens 33. The Fraunhofer diffraction image of the wafer mark 38Y is formed at the entrance-pupil plane IP of the first objective lens 33 by the wafer-mark detection light LB1. At this time, the size of the eccentric index mark 31Y is extremely small compared with the Fraunhofer diffraction image.

The wafer-mark detection light LB1, having been transmitted through the first objective lens 33 and the index plate 32, is then transmitted through the second half-prism 60. The wafer-mark detection light LB1 is incident upon the third objective lens 61. The wafer-mark detection light LB1, after being condensed by the third objective lens 61, is then incident upon a dichroic mirror 63.

The dichroic mirror 63, like the dichroic mirror 55, possesses wavelength selectivity such that it reflects visible light and transmits infrared light. Thus, the wafer-mark detection light LB1 is reflected at the dichroic mirror 63 with practically no attenuation to form the image of the wafer mark 38Y on the image-pickup surfaces of an image-pickup device 64 (comprising one-dimensional or two-dimensional CCDs or the like). The image of the wafer mark 38Y is practically unaffected by the index mark 8 or the eccentric index mark 31Y, and can be treated as an ideal image.

Accordingly, the position of the wafer mark 38Y can be detected accurately. The image-pickup device 64 converts the light intensity of the image of the wafer mark 38Y into an electrical signal; the electrical signal is supplied to the central controller 6.

The illuminant light AL2, which comprises infrared light, is emitted from the light source 53 mounted within the sensor main body 11k. The illuminant light AL2 is condensed by the condenser lens 54 and is transmitted through the dichroic mirror 55 with practically no attenuation. The illuminant light AL2 passes through the field stop 56 together with the visible illuminant light AL1. The illuminant light AL2 is reflected by the mirror 57, is condensed by the relay lens 58, and is incident upon the first half-prism 59. The illuminant light AL2, after being reflected by the first half-prism 59, is incident upon the second half-prism 60. The illuminant light AL2 is reflected in the +Y direction by the second half-prism 60, thereby forming the projection image of the light source 53 on the index plate 32 (arranged on the entrance-pupil plane IP of the first objective lens 33). The illuminant light AL2 is then transmitted through the first objective lens 33, and is incident upon the right-angle reflecting prism 34.

The pattern structure of the index mark 8, which is formed on the RH plane 34H of the right-angle reflecting prism 34, is such that it is a one- or two-dimensional phase pattern. There is a phase difference of 180° in the light transmitted through an array of peaks and valleys having a periodicity essentially the same as the wafer mark 38Y. The illuminant light AL2 is transmitted through and diffracted by the index mark 8 so as to become index-mark-detection light LB2. Practically all of the light beams are diffracted such that they are converted into only two or four positive and negative first-order diffracted light beams.

The index-mark detection light LB2 from the index mark 8 is deflected downward by the right-angle reflecting prism 34, and is incident upon the CM film 37a of the cold mirror 37. As described above, the CM film 37a has optical properties enabling it to transmit visible light and reflect infrared light. Accordingly, the index-mark detection light LB2, being incident on the CM film 37a, is reflected at the CM film 37a with practically no attenuation. The index-mark detection light LB2 returns once again to the right-angle reflecting prism 34, where the light is deflected in the −Y direction. The light is again incident upon the first objective lens 33.

The index-mark detection light LB2, after being transmitted through the first objective lens 33, is then transmitted through the index plate 32 without being influenced by the eccentric index mark 31Y. The index-mark detection light is transmitted through a second half-prism 60, and is incident upon a third objective lens 61. The wafer-mark detection light LB2, after being condensed by the third objective lens 61, is transmitted through the dichroic mirror 63 with practically no attenuation so as to form an image of the index mark 8 on the image-pickup surfaces of the index-mark image-pickup device 62. The image-pickup device 62 converts the light intensity of the image of the index mark 8 into an electrical signal that is supplied to the central controller 6. The image-pickup device 62 is also arranged such that it is as near as possible to the dichroic mirror 63.

The central controller performs arithmetic processing of the respective electrical signals from the image of the wafer mark 38Y and the image of the index mark 8 respectively supplied from the image-pickup devices 64 and 62. The central controller 6 also processes data regarding the position of the wafer stage 3 as detected by the laser interferometer 4a. Thus, the central controller 6 detects any amount of misalignment of the wafer mark 38Y with respect to the index mark 8. By then adding to that misalignment the Y coordinate of the wafer stage 3 detected by the laser interferometer 4a, the position of the wafer mark 38Y within the stage-coordinate system is detected. Accordingly, the location of the wafer mark 38Y in the Y direction, at the time that the position of the image of the wafer mark 38Y coincides with the position of the image of the index mark 8, can be regarded as the location of the measurement center of the alignment sensor 7F in the Y direction.

The wafer comprises plural shot regions. At each shot region a wafer mark similar to the wafer mark 38Y is formed at a prescribed location. The wafer stage 3 is moved such that the wafer mark of each shot region sequentially falls within the detection region of the alignment sensor 7F. By using the laser interferometer 4a to detect the position of the wafer stage 3, the position of the wafer mark, within the stage coordinate system, of the shot region in question can be detected using the FIA method (an image-processing method).

Whereas the LIA-type alignment sensor 7B of FIG. 10 is practically identical to the LIA-type alignment sensor 7 of FIG. 1, the sensor 7B differs slightly in that first and second half-prisms 59 and 60 are arranged subsequent to the second objective lens 30. After the illuminant light beams YLB1 and YLB2 from the heterodyne-beam-generation system HDB are transmitted through the second objective lens 30 and transmitted through the first half-prism 59, the light is reflected in the +Y direction by the second half-prism 60 and is incident upon the index plate 32.

The wafer-mark detection light YWLB from the wafer mark 38Y and reference-mark detection light YLG from the reference marks 35Y1 and 35Y2, after passing through index plate 32, are likewise reflected in the Z direction at the second half-prism 60. These lights YLWB and YLG are then respectively incident upon corresponding photoelectric detectors 43Y and 42Y via the first half-prism 59 and other optical components. In the same manner, the reference-mark detection light XLG from the X-axis reference marks 35X1 and 35X2, after exiting the index plate 32, is also reflected in the +Z direction at the second half-prism 60. The light XLG is transmitted through the first half-prism 59 and other optical components and is incident upon the X-axis photoelectric detector 42X and on another photoelectric detector (not shown). All other portions of the optical path of the FIG. 10 embodiment are similar to the optical path of the alignment sensor 7 of the FIG. 1 embodiment.

As described above, the main bodies of the LIA-type alignment sensor 7B and the FIA-type alignment sensor 7F are mounted within the casing 12A of the same sensor main body 11k such that they share use of a common index-objective unit 11b. Such sharing of the common index objective unit 11b permits a reduction in the number of parts and volume of the assembly. Furthermore, as in the FIG. 1 embodiment, the index-objective unit 11b is isolated from the sensor main body 11k, and multiple reference marks 35Y1 and 35Y2, for the purpose of obtaining a reference signal, are provided on the RG plane 35 of the right-angle reflecting prism 34. Hence, operational benefits similar to those indicated for the LIA-type alignment sensor 7 of FIG. 1 can also be obtained with the FIA-type alignment sensor 7F of FIG. 10. In other words, fluctuation in the magnitude of the baseline (so-called baseline fluctuation) normally occurs when the D surface 16a moves due to expansion or contraction, or the sensor main body 11k moves or is deformed. In the present embodiment, in contrast, except for the portion of the optical path downstream of the dichroic mirror 63 of the sensor main body 11k, the wafer-mark detection light LB1 and index-mark detection light LB2 travel along essentially identical optical paths. Consequently, the images of the index mark 8 on the light-receiving surfaces of the photoelectric detector 62, and the images of the wafer mark 38Y on the light-receiving surfaces of the photoelectric detector 64, are displaced by essentially equal amounts of drift; and expansion or contraction of the D surface 16a, or movement or deformation of the sensor main body 11k, are not factors in baseline fluctuation.

Since the wafer-mark detection light LB1 and the index-mark detection light LB2 proceed along essentially identical optical paths and are therefore affected to the same extent by mechanical vibrations, atmospheric fluctuations, and so forth, over the course of that optical path, the detected positions of the images of the index mark 8 and the wafer mark 38Y on the light-receiving surfaces will likewise fluctuate to the same extent. Accordingly, when detecting the position of the wafer mark 38Y with reference to the index mark 8, i.e., when detecting their relative positional relationship, measurement reproducibility is advantageously improved.

This embodiment also exhibits a substantial reduction in sources of baseline fluctuation attributable to the sensor main body 11k. The principal factors responsible for the occurrence of baseline fluctuation are: (a) drift in the position of the index mark 8 with respect to the wafer mark 38Y occurring concomitantly with, e.g., expansion or contraction of the C surface 16b, to which the index objective unit 11b is secured, in the horizontal direction, and (b) drift of the index mark 8 with respect to the wafer mark 38Y occurring concomitantly with deformation at the interior of the index-objective unit 11b.

Since the index-objective unit 11b is itself inherently small, deformations at the interior of the index-objective unit 11b are also small. Accordingly, any drift of the index mark 8 is also extremely small.

The casing 13 can be affected by thermal deformations and the like and thus has a potentially large effect on drift. The casing 13 supports the right-angle reflecting prism 34, and baseline fluctuations occurring during pitching, rolling, yawing, or other movements or perturbations of the right-angle reflecting prism 34 due to thermal deformation of the casing 13 are reduced. Even if the casing 13 were not composed of low-thermal-expansion material, there would nonetheless be a dramatic reduction in the baseline fluctuations of the FIA-type alignment sensor 7F.

Because the factors responsible for drift occurring concomitantly with heat generation at the LIA-type alignment sensor 7B and the FIA-type alignment sensor 7F can thus be vastly reduced, procedures such as effective employment of low-thermal-expansion materials, local-area temperature controls, and predictive control through the use of temperature monitoring is possible without wasted effort. This permits baseline fluctuations occurring at the alignment sensors 7B and 7F due to thermal deformations and the like to be made extremely small, and permits substantial improvements in alignment precision. Furthermore, because baseline checks need not be repeated frequently, there is also the advantage of improved throughput.

Fourth Example Embodiment

Figure 12:
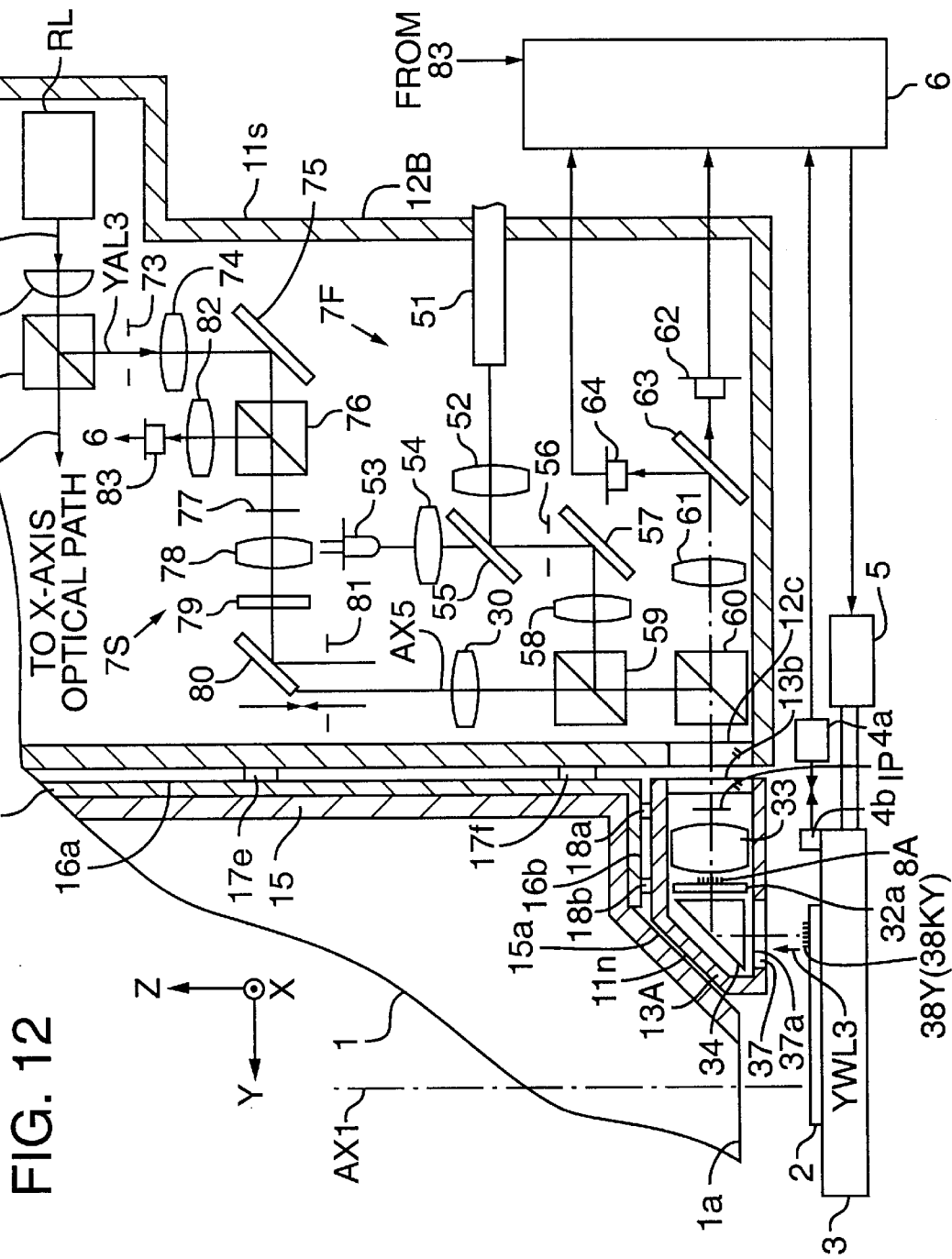
FIG. 12 is a simplified partial cutaway elevational view of a position-detection apparatus (alignment sensor) according to the fourth example embodiment of the invention, and of a portion of an aligner incorporating the position-detection apparatus.

The fourth example embodiment of the invention is now described with reference to FIGS. 11, 12, 13(a), and 13(b). This example embodiment is especially directed to a situation in which an LSA-type alignment sensor is provided in addition to the FIA-type alignment sensor 7F of FIG. 10 and the LIA-type alignment sensor 7 of FIG. 1. In FIG. 12, the main body of the FIA-type alignment sensor 7F and the main body of the LSA-type alignment sensor 7S are arranged within the same sensor main body 11s. These two alignment sensors 7F and 7S are provided with a common index-objective unit 11n within which the alignment sensors conduct wafer-mark detection.

In this example embodiment, wherever components of the LIA-type alignment sensor 7 and the FIA-type alignment sensor 7F, and of the apparatus as a whole are similar to what is depicted in FIGS. 1 and 10, the same reference designators are used in FIGS. 11–13, and further description of such components is not provided here.

FIG. 11 depicts an alignment sensor as used in this example embodiment, as viewed from the underside. The alignment sensor comprises a sensor main body 11s (in which the respective main bodies of the FIA-type alignment sensor 7F and the LSA-type alignment sensor 7S are mounted), and a sensor main body 11a (in which the main body of the LIA-type alignment sensor 7 is mounted). These sensor main bodies 11s, 11a are arranged at locations slightly removed from their respective index-objective units 11n and 11b such that they are in intimate contact and are parallel to the X axis. The sensor main body 11s is secured to the D surface 16a of the projection-optical system 1 by way of multiple supporting frames (of these, supporting frames 17e–17f, as well as supporting frame 17g that is shared with the sensor main body 11a, are shown in FIG. 11). The sensor main body 11a is likewise secured to the D surface 16a of the projection-optical system 1 by way of multiple supporting frames (of these, supporting frame 17h is shown in FIG. 11) and a common supporting frame 17g. Furthermore, the index-objective units 11n and 11b are respectively arranged, in the vicinity of the surface at which the sensor main body 11s and the sensor main body 11a are joined, so as to respectively face the sensor main bodies 11s and 11a. The index-objective units 11n, 11b are secured to the C surface 16b of the projection-optical system 1 via the common supporting frames 18e and 18f, the supporting frames 18a, 18b for the index-objective unit 11n, and supporting frames 18c, 18d for the index-objective unit 11b.

The materials of which the sensor main body 11s, and the casings 12B and 13A are made are respectively similar to the materials used to make the sensor main body 11a and the casing of the index-objective unit 11b.

FIG. 12 is a partial simplified cutaway view of the projection aligner according to this example embodiment. In addition to the main body of the FIA-type alignment sensor 7F, constructed similarly to that shown in FIG. 10, the main body of the LSA-type alignment sensor 7S is arranged in FIG. 12 within the casing 12B of the sensor main body 11s. The illuminant light AL3, consisting of a visible-spectrum laser beam, is emitted from the laser-light source RL of the LSA-type alignment sensor 7S. The illuminant light AL3 is incident upon a half-prism 72 by way of a cylindrical lens 71. The illuminant light AL3 is divided by the half-prism 72 into two beams: a Y-axis illuminant light YAL3 and an X-axis illuminant light XAL3. After being transmitted through the half-prism 72, the illuminant light XAL3 proceeds along its X-axis optical path, and is again combined with the Y-axis illuminant light YAL3 at an XY-combining mirror 80, to be described below.

The Y-axis illuminant light YAL3, after being reflected downward by the half-prism 72, is condensed on a field stop 73, situated at a location that is conjugate to the surface of wafer 2. The field stop 73 forms the cross-sectional profile of the Y-axis illuminant light so as to be slit-shaped. The Y-axis illuminant light YAL3 then passes through a relay lens 74 and is reflected in the +Y direction by a reflective mirror 75 (comprising a reflective surface inclined 45° with respect to the optical axis of illuminant light YAL3).

The Y-axis illuminant light YAL3 is then incident upon a prismatic polarizing beam splitter (PBS) 76. The PBS 76 is operable to transmit P-polarized light and reflect S-polarized light. Since the illuminant light AL3 emitted from the laser light source RL is P-polarized (linearly polarized), the illuminant light YAL3 is transmitted without attenuation through the PBS 76, and is condensed upon the entrance-pupil plane 77 of the relay lens 78.

The illuminant light YAL3 passes through the relay lens 78 via the entrance-pupil plane 77, is converted to circularly polarized light at a quarter-wave plate 79, and is incident upon an XY-combining mirror 80. The XY-combining mirror 80 combines the Y-axis illuminant light YAL3 and the X-axis illuminant light XAL3 and directs the combined light to a field stop 81, which is in a conjugate relationship with the wafer 2.

As with the FIG. 1 embodiment, the following descriptions primarily concern the optical path of the Y-axis illuminant light YAL3. The optical axis of the optical system through which the illuminant light YAL3 is guided is denoted AX5.

The illuminant light YAL3, having passed through the field stop 81, is transmitted through the first half-prism 59 via the second objective lens 30. Also incident at the first half-prism 59, from a direction orthogonal to the illuminant light YAL3, are a visible illuminant light AL1 and an infrared illuminant light AL2 from the main body of the FIA-type alignment sensor 7F. The illuminant light YAL3 is incident upon the second half-prism 60, where the light is reflected in the +Y direction. The illuminant light YAL3 is then transmitted through the window 12c and is introduced into the interior of the index-objective unit 11n by via the window 13b.

The illuminant light YAL3, after having been introduced into the index-objective unit 11n, is condensed on the entrance-pupil plane IP of the first objective lens 33, and is transmitted through the first objective lens 33. The illuminant light YAL3 is incident upon the index plate 32A comprising a transparent glass plate or the like. The index plate 32A comprises a two-dimensional index mark 8A formed as a diffraction grating at the optical axis AX5. The illuminant light YAL3 is transmitted through the index plate 32A without being eclipsed by the index mark 8A, is incident upon the right-angle reflecting prism 34, and is deflected downward by the right-angle reflecting prism 34.

Provided directly beneath the right-angle reflecting prism 34 is the cold mirror 37 comprising a transparent glass plate. The CM film 37a, which transmits visible light and reflects infrared light, is adhered to the surface of cold mirror 37 that faces the right-angle reflecting prism 34. The illuminant light YAL3, being a visible-spectrum laser beam, is transmitted through the cold mirror 37 with practically no attenuation, so as to irradiate the vicinity of the Y-axis wafer mark 38KY on the wafer 2 on the wafer stage 3 during alignment.

Figure 13A:
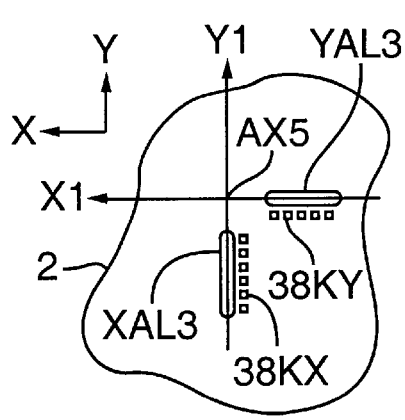
FIG. 13(a) depicts a situation, with respect to the fourth example embodiment, when illuminant light from the LSA-type alignment sensor 7S shown in FIG. 12 irradiates marks on a wafer (substrate surface).

FIG. 13(a) shows the wafer mark and the LSA-type illuminant light on the wafer 2. In FIG. 13(a), the X-axis slit-shaped illuminant light XAL3 and the Y-axis slit-shaped illuminant light YAL3 are respectively irradiated along the axis Y1 and the axis X1 which pass through the optical axis AX5 and are respectively parallel to the stage-coordinate system X and Y axes. The X-axis dot-array-form wafer mark 38KX and the Y-axis dot-array-form wafer mark 38KY are respectively located in the vicinity of the illuminant lights XAL3 and YAL3. By driving the wafer stage 3 in the Y direction until the Y-axis illuminant light YAL3 cuts across the Y-axis wafer mark 38KY, diffracted light is generated from the illuminant light YAL3 due to the location of the wafer mark 38KY at the space where the illuminant light YAL3 and wafer mark 38KY coincide. Furthermore, by driving the wafer stage 3 in the X direction until the X-axis illuminant light XAL3 cuts across the X-axis wafer mark 38KX, diffracted light will be generated from the illuminant light XAL3 due to the wafer mark 38KX being located at the space where the illuminant light XAL3 and the wafer mark 38KX coincide.

The diffracted lights from the illuminant lights YAL3 and XAL3 return along the incoming optical path to the sensor main body 11s. The diffracted lights are respectively incident at the light-receiving surfaces of a Y-axis photoelectric detector 83, to be described below, and an X-axis photoelectric detector (not shown).

The following descriptions are primarily in terms of the wafer-mark detection light $YWL3^0$ (the null-order (specular reflection) diffracted light from the wafer mark 38KY); the wafer-mark detection light $YWL3^{+1}$ (the positive first-order diffracted light); and the wafer-mark detection light $YWL3^{-1}$ (the negative first-order diffracted light). The wafer-mark detection lights $YWL3^0$, $YWL3^{+1}$, and $YWL3^{-1}$ are collectively referred to as the "wafer-mark detection light YWL3."

The wafer-mark detection light YWL3 is again incident upon the cold mirror 37, is transmitted through the cold mirror 37 with practically no attenuation at the CM film 37a, is deflected in the −Y direction by the right-angle reflecting prism 34, and is incident upon the index plate 32A.

Figure 13B:
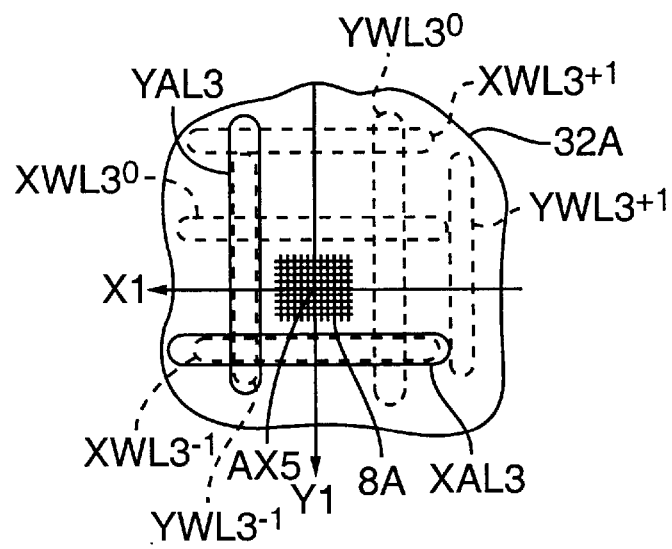
FIG. 13(b) depicts, with respect to the fourth example embodiment, the arrangement of illuminant light and detection light on the index plate 32A.

FIG. 13(b) is a plan view of the wafer-mark detection light YWL3 on the index plate 32A, as viewed from the first objective lens 33. The illuminant lights YAL3 and XAL3 are incident along axes Y1 and X1. The slit-shaped illuminant light YAL3, elongated in the Y direction and indicated by a solid line, is incident in the +X1 direction, while the slit-shaped illuminant light XAL3, elongated in the X direction and indicated by a solid line, is likewise incident in the +Y1 direction. The wafer-mark detection light $YWL3^{-1}$ (which is the negative first-order diffracted light generated from the Y-axis wafer mark 38KY), the wafer-mark detection light $YWL3^0$ (which is the null-order (reflected) diffracted light), and the wafer-mark detection light $YWL3^{+1}$ (which is the positive first-order diffracted light) are, as respectively indicated by slits drawn with dashed lines, respectively condensed at a location overlapping the illuminant light YAL3. The location is symmetrical to the illuminant light YAL3 with respect to the axis Y1, and outside the wafer-mark detection light $YWL3^0$. Furthermore, the wafer-mark detection light $XWL3^{-1}$ (which is the negative first-order diffracted light generated from the X-axis wafer mark 38KX), the wafer-mark detection light $XWL3^0$ (which is the null-order (reflected) diffracted light), and the wafer-mark detection light $XWL3^{+1}$ (which is the positive first-order diffracted light) are, as respectively indicated by slits drawn with dashed lines, respectively condensed at locations rotated 90° counterclockwise about the optical axis AX5 from the Y-axis wafer-mark detection lights $YWL3^{-1}$, $YWL3^0$, and $YWL3^{+1}$.

The wafer-mark detection light YWL3, after passing through the index plate 32A without being eclipsed, is incident upon the first objective lens 33. The wafer-mark detection light YWL3 is incident upon the second half-prism 60 after the light exits the entrance-pupil plane IP of the first objective lens 33. The light is then reflected upward at the second half-prism 60, and transmitted through the first half-prism 59, the second objective lens 30, and the field stop 81. The light is then reflected in the −Y direction by the XY-combining mirror 80.

The X-axis wafer-mark detection light is separated from the Y-axis wafer-mark detection light YWL3 by the XY-combining mirror 80. The X-axis wafer-mark detection light returns along the X-axis optical path, and is received by a photoelectric detector (not shown). The X-axis photoelectric detector generates a photoelectric signal corresponding to positional information from the wafer mark 38KX.

The Y-axis wafer-mark detection light YWL3, after being reflected in the −Y direction at the XY-combining mirror 80, is incident upon the quarter-wave plate 79 and is converted into S-polarized light. The wafer-mark detection light YWL3, after being converted into S-polarized light, is then incident upon the PBS 76 via the relay lens 78. The wafer-mark detection light YWL3, being S-polarized light, is reflected upward at the PBS 76, and is incident upon the light-receiving surfaces of the photoelectric detector 83 via the relay lens 82.

The photoelectric detector 83 generates a photoelectric signal corresponding to positional information from the wafer mark 38KY. The photoelectric signals from the photoelectric detector 83 and the X-axis photoelectric detector are both supplied to the central controller 6. For example, the positions of the wafer stage 3 when those photoelectric signals reach their maximum values may be regarded as corresponding to the locations of the wafer marks 38KX and 38KY.

As described above, this fourth embodiment is characterized by the main body of FIA-type alignment sensor 7F and the main body of the LSA-type alignment sensor 7S being integrated into a single sensor main body 11s. Both sensors share use of a common index-objective unit 11n. Such common use of the index-objective unit 11n permits reductions in the number of parts and the volume of the assembly.

Furthermore, as in the FIG. 1 embodiment, the index-objective unit 11n in the fourth embodiment is isolated from the sensor main body 11s. Also, the LIA-type alignment sensor is constructed such that the sensor main body 11a and the index-objective unit 11b are isolated from each other. Such features provide advantages as discussed above with respect to the FIG. 1 and FIG. 10 embodiments.

This embodiment is not limited to stepper-type projection aligners, but may be applied with equal advantage to scanning-exposure-type projection aligners. In scanning-exposure-type projection aligners, the pattern defined by the reticle is consecutively transferred to each shot region on the wafer during synchronous scanning of the reticle and wafer, the pattern defined by the reticle being projected onto the wafer by a projection optical system.

In the first through fourth example embodiments described above, a fiducial body (on which a fiducial mark is formed) is situated between a condenser optical system and a detected object, (on which a position-detection mark is formed). A plurality of lights diffracted from the position-detection mark (hereinafter referred to as the "first wafer-mark detection light") and a plurality of lights diffracted from the fiducial mark (hereinafter referred to as the "fiducial-mark detection light") are condensed by the same condenser optical system. Accordingly, because drift in the condenser optical system will have the same effect on the first wafer-mark detection light and the fiducial-mark detection light, drift stability is advantageously improved. Also, the precision with which the position of the position-detection mark is detected during position detection using, for example, the LIA method, is also improved. As a result, position-detection apparatus according to those embodiments may be used favorably as an off-axis-type alignment sensor for use in a projection aligner.

Also, in the first through fourth example embodiments, the combining optical components are condenser/deflector members that deflect light diffracted from the fiducial marks formed at two separate locations in the measurement direction on the fiducial body. As a result, the light is combined such that it propagates in a single optical path. Also, the combining optical components condense and combine light diffracted from the fiducial marks at two separate locations on the fiducial body so as to cause such light to propagate in a single optical path.

Furthermore, in the first through fourth example embodiments, the light beam from the position-detection mark and the light beam from the index mark are condensed via the same condenser optical system. Because drift in the condenser optical system will have the same influence on the light beams from the position-detection mark and the index mark, drift stability is advantageously at the FIA-type detection unit, with improved precision of detection of the position-detection mark.

Fifth Example Embodiment

The fifth example embodiment of an apparatus according to the invention is described with reference to FIGS. 15–20. The alignment sensor according to this embodiment employs both an FIA method and an off-axis method. The alignment sensor constitutes a portion of a stepper-type projection aligner that exposes a reticle pattern all at once onto each shot region on a wafer.

Figure 15:
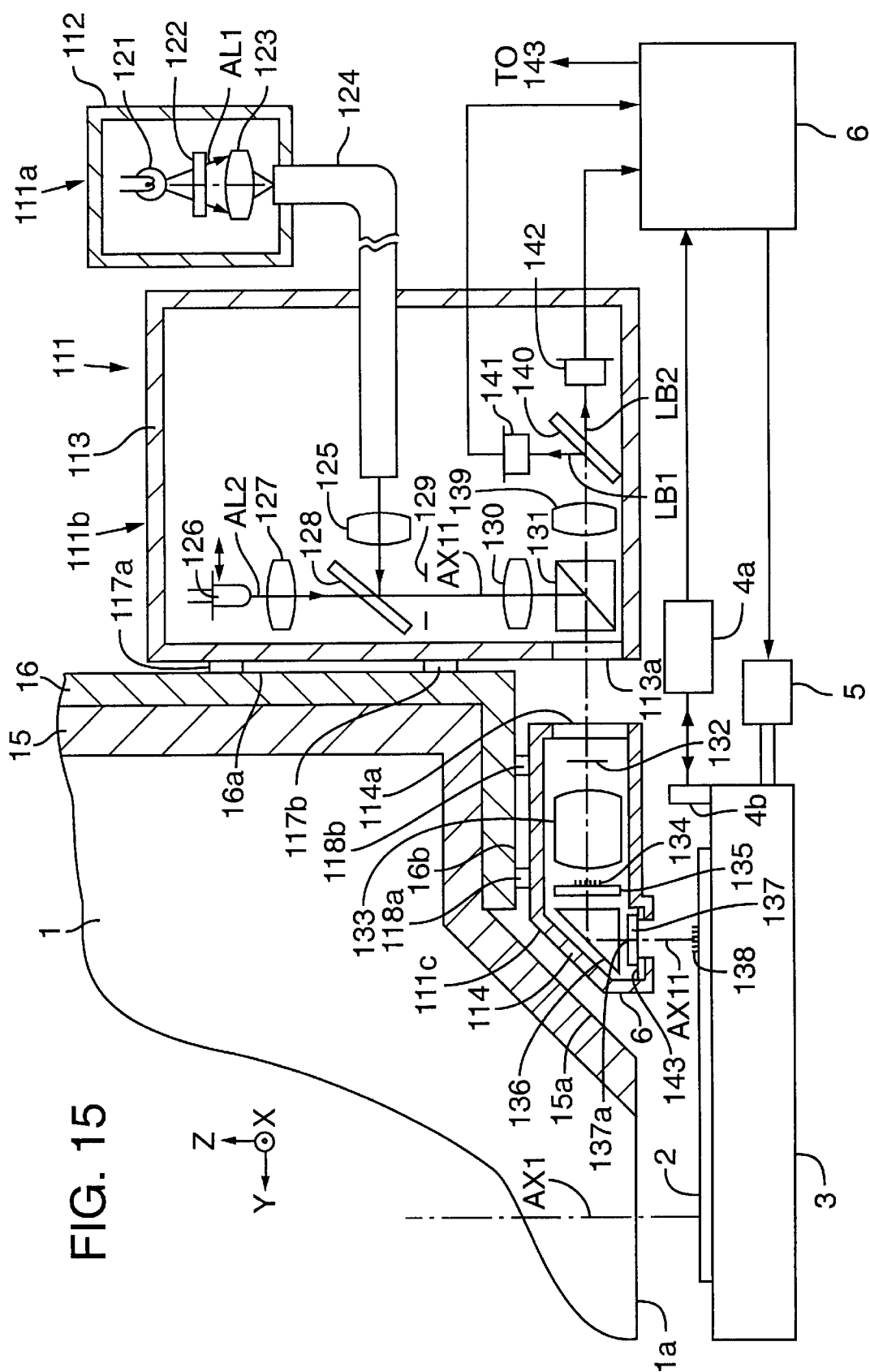
FIG. 15 is a simplified partial cutaway elevational view of a position-detection apparatus (alignment sensor) according to a fifth example embodiment of the invention, and of a portion of an aligner incorporating the position-detection apparatus.
Figure 16:
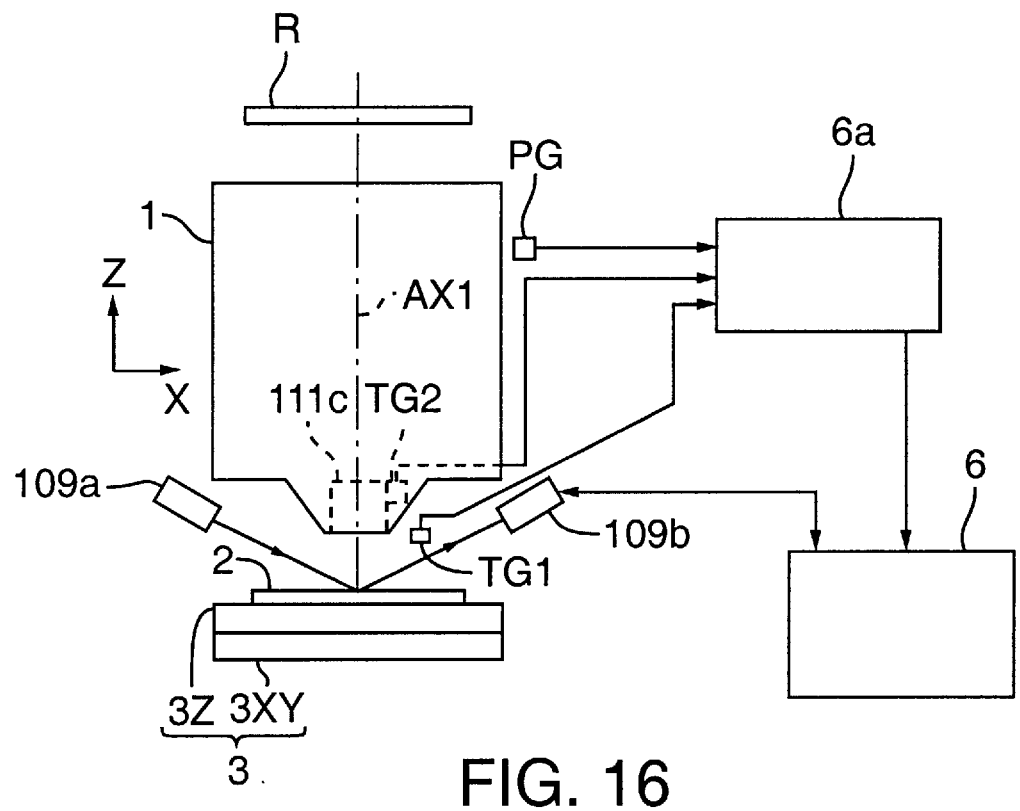
FIG. 16 shows certain features of a projection aligner comprising the position-detection apparatus of the fifth example embodiment.

A partial cutaway view of the alignment sensor in this embodiment is shown in FIG. 15, and FIG. 16 shows certain features of a projection aligner according to this embodiment. In FIG. 15, the pattern defined by a reticle R (see FIG. 16) is transferred, at the time of exposure, to each shot region on the wafer 2 by a projection optical system 1. FIG. 16 is a side view, looking in the Y direction, of FIG. 15.

In the following description, the Z axis is regarded as parallel to the optical axis AX1 of the projection optical system 1, the Y axis is regarded as parallel to the plane of the page in FIG. 15, and the X axis is regarded as perpendicular to the plane of the page in FIG. 15. Thus, the X and Y axes define a plane perpendicular to the Z axis.

As shown in FIG. 16, the wafer 2 is mounted on a Z-tilt stage 3Z by a wafer holder (not shown). The Z-tilt stage 3Z is operable, by means of an internal drive system, of moving the wafer 2 in the direction of the optical axis AX1 (i.e., in the Z direction). The Z-tilt stage 3Z is also operable to incline the wafer 2 and to rotate the wafer 2 about the optical axis AX1. The Z-tilt stage 3Z is mounted on an XY stage 3XY that is operable, by means of a wafer-stage driver 5, to move in the X direction or in the Y direction with respect to the projection optical system 1. The wafer stage 3 comprises the XY stage 3XY and the Z-tilt stage 3Z.

Referring further to FIG. 15, the movable mirror 4b, which reflects a laser beam from the external laser interferometer 4a, is secured to the end of the wafer stage 3. The position of the wafer stage 3 in the X direction and Y direction, and its angular rotation, are measured by the laser interferometer 4a operating cooperatively with the movable mirror 4b. Positional data from the laser interferometer 4a are supplied to the central controller 6, which exercises overall control of the entire apparatus. The central controller 6 controls positioning movements of the wafer stage 3 by controlling actuation of the wafer-stage driver 5 based on the positional data.

As shown in FIG. 16, a grazing-incidence-type focal-point-position detection system (hereinafter referred to as a "focal-point-position detection system" 109a, 109b) comprises an irradiation optical system 109a. The irradiation optical system supplies a detection light for formation of a pinhole image or slit image from a direction that is oblique with respect to the optical axis AX1. The direction light is directed at the surface of the wafer 2. A light-receiving optical system 109b re-images, on a vibrating slit, the image of the pinhole or the like from the light beam produced when that detection light is reflected at the surface of wafer 2. The light-receiving optical system receives the light beam transmitted through the vibrating slit. A focal-point-position detection system 109a, 109b supplies to the central controller 6 a focus signal corresponding to the positional deviation, in the Z direction, of the surface of the wafer 2 with respect to the best imaging plane of the projection optical system 1. The central controller 6 drives the Z-tilt stage 3Z in the Z direction in autofocusing fashion based on this focus signal. In addition, the angle of a plane parallel mirror, not shown, provided inside the light-receiving optical system 109b, is adjusted in advance such that the imaging plane is the zero-point reference. Autofocusing causes the focus signal from the light-receiving optical system 109b to become zero.

The alignment sensor of this example embodiment employs both the off-axis method and the FIA method. As shown in FIG. 15, the alignment sensor 111 comprises a lamp unit 111a, mounted at the exterior of the sensor main body 111b. The lamp unit 111a comprises a housing 112 enclosing a first light source 121 and associated optical components. The sensor main body 111b, secured to the lower flank of the projection optical system 1, comprises a second light source 126, image-pickup devices 141 and 142, and associated optical components arranged within a housing 113. An index-objective unit 111c, secured to the lower part of the end (in the -Y direction) of the projection optical system 1, comprises a first objective lens 133, index plate 135, right-angle reflecting prism 136, and other associated optical components arranged within a housing 114. The lens barrel 15 of the projection optical system 1 is secured to the projection optical system retainer 16, which is secured to a support column (not shown) of the aligner. The projection optical system retainer 16 is made of a low thermal expansion material such as Invar or other such alloy having a low coefficient of thermal expansion. Also, care is taken so that fluctuations in temperature at the interior of the chamber have as little effect as possible on the projection optical system 1 and the alignment sensor 111.

The housing 113 of the sensor main body 111b is secured to the flank region 16a of the projection optical system retainer 16 by way of multiple supporting frames (of these, supporting frames 117a and 117b are shown in FIG. 15). The housing 114 of the index-objective unit 111c is also preferably made of a low thermal expansion material such as an alloy having a low coefficient of thermal expansion, and is secured to the underside peripheral region 16b of the projection optical system retainer 16 by multiple supporting frames (of these, supporting frames 118a and 118b are shown in FIG. 15). It is important that the measurement position of alignment sensor 111 be made as proximally as possible to the optical axis AX1 of the projection optical system 1, and that the plurality of supporting frames of the index-objective unit 111c be arranged symmetrically with respect to the Y axis.

In the following description, the flank region 16a of the projection optical system retainer 16 is denoted the "D surface," and the underside region 16b of the projection optical system retainer 16 is denoted the "C surface." Furthermore, the underside inclined region 15a of the lens barrel 15 of the projection optical system 1 is denoted the "B surface," and the central underside region 1a of the projection optical system 1 is denoted the "A surface."

Illuminant light of broad spectral bandwidth, emitted from the first light source 121 consisting of a halogen lamp or the like provided in the lamp unit 111a, is converted into visible illuminant light of an appropriate bandwidth by the wavelength-limiting optical filter 122. The illuminant light AL1, comprising visible illuminant light, is condensed by a condenser lens 123 onto the entrance plane of a light guide 124, e.g., an optical fiber or the like. The other end of the light guide 124 is routed through the housings 112 and 113 to the interior of the sensor main body 111b. The illuminant light AL1 is emitted in the +Y direction from the output plane of the light guide 124, is condensed by the condenser lens 125, and is incident upon the dichroic mirror 128.

The dichroic mirror 128 is tilted 45° with respect to the optical axis of the illuminant light AL1. The dichroic mirror 128 exhibits wavelength selectivity such that it reflects visible light and transmits infrared light. The illuminant light AL1, being visible light, is reflected downward by the dichroic mirror 128 with practically no attenuation so as to uniformly irradiate the field stop 129. As is described below, the illuminant light AL2, comprising infrared light emitted from the second light source 126 mounted within the sensor main body 111b, is incident upon the dichroic mirror 128 from a direction orthogonal to the illuminant light AL1. The illuminant light AL1, having passed through field stop 129, is condensed by the relay lens 130, and is incident upon the half-prism 131. The half-prism 131 is tilted at 45° with respect to the optical axis of the illuminant light AL1. The illuminant light AL1, after being reflected in the +Y direction at the half-mirror surface of the half-prism 131, passes through a window 113a provided at a lower side surface of the housing 113. The illuminant light AL1 enters the housing 114 of the index-objective unit 111c via a window 114a provided at a side surface of the housing 114.

After forming a projected image of the exit plane of the light guide 124 on the entrance-pupil plane 132 of the first objective lens 133, the illuminant light AL1 is transmitted through the first objective lens 133 and is incident upon the index plate 135, comprising a transparent glass plate on which an index mark 134 is formed. After passing through the index plate 135, the illuminant light AL1 is deflected downward by a right-angle reflecting prism 136, and is incident upon a cold mirror 137. The cold mirror 137 comprises a transparent glass plate and a film (hereinafter referred to as the "CM film") 137a, which transmits visible light but reflects infrared light. The CM film 137a is vapor-deposited on the surface of the cold mirror 137. The illuminant light AL1, being visible light, is transmitted through the cold mirror 137 with practically no attenuation.

The optical axis of the optical system consisting of the first objective lens 133, the relay lens 130, the right-angle reflecting prism 136, and so forth, is noted as the optical axis AX11.

The cold mirror 137 can be finely moved in the direction of the optical axis AX11 direction (the Z direction) by means of a cold-mirror driver 143. The cold-mirror driver 143 comprises piezoelectric elements or analogous components provided at the interior of the index-objective unit 111c. The cold-mirror driver 143 is controlled by a central controller 6.

As described below, there are instances requiring that the position of the cold mirror 137 in the optical axis AX11 direction (the Z direction) be adjusted, via the cold-mirror driver 143 and the central controller 6.

The illuminant light AL1, having passed through the cold mirror 137, then essentially perpendicularly irradiates the wafer mark 138 (an alignment mark on the wafer 2). The wafer mark 138 has a prescribed shape and resides in the focal plane of the first objective lens 133. The illuminated region on the wafer 2 has a desired size as controlled by the field stop 129. Typically, the wafer mark 138 is about 100 $\mu$m×100 $\mu$m in size, and is configured as a two-dimensional grating-form pattern formed with pitches of several microns in each of the X and Y directions. However, a one-dimensional grating or other such pattern may also be used as the wafer mark 138.

The illuminant light AL1, having irradiated the wafer mark 138, is reflected and diffracted by the wafer mark 138. The illuminant light AL1 then starts back on a return trip from the wafer 2. The returning light is termed the wafer-mark detection light LB1 which propagates upward along the optical axis AX11. The wafer-mark detection light LB1 once again is incident upon the cold mirror 137 and is transmitted through the cold mirror 137 with practically no attenuation by the CM film 137a. The wafer-mark detection light LB1 is deflected in the −Y direction by the right-angle reflecting prism 136 and is incident upon the first objective lens 133 via the index plate 135.

A Fraunhofer diffraction image of the wafer mark 138 is formed at the entrance-pupil plane 132 of the first objective lens 133 by the wafer-mark detection light LB1. Formed on the index plate 135 is an index mark 134, possessing a two-dimensional phase-grating pattern (however, a one-dimensional pattern is also possible). The size of the index mark is about the size of the wafer mark 138. The index plate 135 is located proximally to the first objective lens 133. Accordingly, the spread on the index plate 135 of the illuminant light AL1 (which irradiates the wafer mark 138) and of the wafer-mark detection light LB1 from the wafer mark 138 is nearly the effective diameter of the first objective lens 133, i.e., a few tens of millimeters.

In contrast, the size of the index mark 134 on the index plate 135 is extremely small (about 100 $\mu$m square). This is about $10^{-4}$ the area of the index plate. Hence, the illuminant light AL1 is practically unaffected by any blocking or diffraction caused by the index mark 134 as the light passes through the index plate 135. This allows uniform irradiation of the wafer mark 138. Because the wafer-mark detection light LB1 is likewise practically unaffected by blocking or diffraction caused by the index mark 134 when the light passes through the index plate 135 as the light starts back on the return trip from the wafer mark 138, the index mark 134 has practically no effect on the image of the wafer mark 138 formed at the entrance-pupil plane 132 of the first objective lens 133.

After exiting the entrance-pupil plane 132 of the first objective lens 133, the wafer-mark detection light LB1 passes through the half-prism 131, and is incident upon the second objective lens 139. After being condensed by the second objective lens 139, the wafer-mark detection light LB1 is incident upon the dichroic mirror 140. The dichroic mirror 140, like the dichroic mirror 128, possesses wavelength selectivity such that the mirror 140 reflects visible light and transmits infrared light. Thus, the wafer-mark detection light LB1 is reflected at the dichroic mirror 140 with practically no attenuation.

The wafer-mark detection light forms the image of the wafer mark 138 on the image-pickup surfaces of two-dimensional image pickup device 141 (preferably comprising two-dimensional CCDs or the like). The image-pickup device 141 may comprise one-dimensional CCDs or the like if the wafer mark 138 is a one-dimensional mark. The image of the wafer mark 138 is practically unaffected by eclipsing due to the index mark 134, and can be treated as an ideal image. Accordingly, the position of the wafer mark 138 can be detected accurately from the image of that wafer mark.

The image-pickup device 141 converts the light intensity of the image of the wafer mark 138 into an electrical signal. The signal is conducted to the central controller 6.

The illuminant light AL2, which comprises infrared light, is emitted from the second light source 126 within the sensor main body 111*b*. The illuminant light AL2 is condensed at the condenser lens 127 and is transmitted through the dichroic mirror 128 with practically no attenuation. The illuminant light passes through the field stop 129, is condensed by the relay lens 130, and is incident upon the half-prism 131. The light source 126 is capable of being finely moved in a direction perpendicular to the optical axis AX11 (i.e., perpendicular to the Z direction). As described below, the telecentricity of the illuminant light AL2 is adjusted by changing the position of the light source 126 in a direction perpendicular to the optical axis AX1.

The light source 126 may be situated exterior to the sensor main body 111*b*, and infrared illuminant light AL2 may be introduced into the interior of the sensor main body 111*b* via a light guide or the like in the same manner as the visible illuminant light AL1. Arrangement of heat sources, such as halogen lamps, at the exterior of the sensor main body 111*b* is highly preferred for high-precision positioning.

Figure 17:
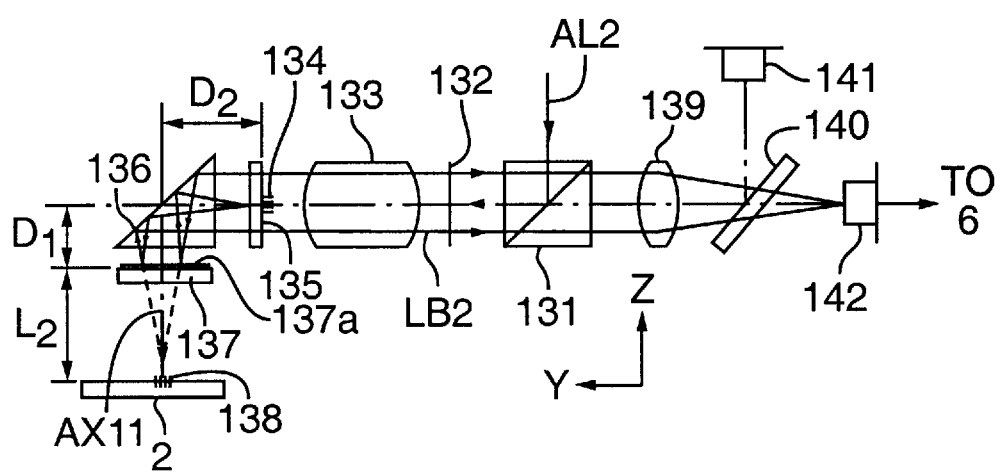
FIG. 17 is an optical diagram showing, with respect to the fifth example embodiment, the optical paths of the illuminant light used for detection of the index mark 134.

FIG. 17 is an optical diagram showing details of the optical path of the illuminant light AL2. The illuminant light AL2, after entering the half-prism 131, is reflected at the half-prism 131 and forms the projection image of the light source 126 of FIG. 15 on the entrance-pupil plane 132 of the first objective lens 133. The beam diameter of the illuminant light beam AL2 as it exits the first objective lens 133 is several tens of millimeters, and is essentially equal to the effective diameter of the first objective lens 133. Such a beam diameter is sufficient to uniformly irradiate the index mark 134, which is about 100 $\mu$m in diameter and is arranged on the index plate 135 immediately following the first objective lens 133.

The pattern of the index mark 134 is preferably a two-dimensional (however, a one-dimensional pattern is also possible) phase pattern. There is a phase difference of 180° in the light transmitted through the peaks and valleys (having a periodicity essentially equal to the periodicity of the wafer mark 138. Accordingly, with respect to the illuminant light AL2, the light beams irradiating the index mark 134 are transmitted and diffracted to become the index-mark detection light LB2. Practically all of the light beams are diffracted such that they are converted into only four (or in the case of a one-dimensional mark, two) positive and negative first-order diffracted light beams.

After passing through the index mark 135, the index-mark detection light LB2 (comprising infrared light) is deflected downward by a right-angle reflecting prism 136. The index-mark detection light LB2 is incident upon the cold mirror 137. As described above, the CM film 137*a* is vapor-deposited on the surface of the cold mirror 137 and transmits visible light and reflects infrared light. Accordingly, the index-mark detection light LB2, after being reflected at the CM film 137*a* of the cold mirror 137 with practically no attenuation, returns once again to the right-angle reflecting prism 136 which reflects the light in the $-Y$ direction. The light passes through the index plate 135 without being affected by the index mark 134, and is again incident upon the first objective lens 133.

A Fraunhofer diffraction image of the index mark 134 is formed at the entrance-pupil plane 132 of the first objective lens 133 by the index-mark detection light LB2. Also, as described above, the position of the cold mirror 137 (on which the CM film 137*a* is formed) in the optical axis AX11 direction (the Z direction) is adjustable by means of a cold-mirror driver 143. By changing the position of the cold mirror 137 in the optical axis AX11 direction, the position of the index mark 134 in the optical axis AX11 direction can be adjusted.

The optical path length from the index mark 134 to the reflecting surface of the right-angle reflecting prism 136 is denoted $D_2$, and the optical path length from the reflecting surface of the right-angle reflecting prism 136 to the CM film 137*a* of the cold mirror 137 is denoted $D_1$. The positions of the cold mirror 137 and the index plate 135 are situated such that the optical path length $L_1=D_1+D_2$ along the optical axis AX11 from the index mark 134 to the CM film 137*a* is about equal to the optical path length $L_2$ along the optical axis AX11 from the wafer surface to the surface of the CM film 137*a* of the cold mirror 137. Hence, as viewed from the first objective lens 133, the index mark 134 will appear to be on the wafer surface. As far as the first objective lens 133 is concerned, this is equivalent to the index mark 134 being in the focal plane of the first objective lens 133.

After exiting the first objective lens 133, the index-mark detection light LB2 passes through the half-prism 131, and is incident upon the second objective lens 139. After being condensed by the second objective lens 139, the index-mark detection light LB2 is then transmitted through the dichroic mirror 140 with practically no attenuation to form the image of the index mark 134 on the image-pickup surfaces of the image-pickup device 142.

For a two-dimensional index mark 134, the image-pickup device 142 preferably comprises two-dimensional CCDs. (The image-pickup device 142 can comprise one-dimensional CCDs or the like if the index mark 134 is a one-dimensional mark.) The image-pickup device 142 converts the light intensity of the image of the index mark 134 into an electrical signal that is supplied to the central controller 6. The image-pickup device 142 is situated as proximally as possible to the dichroic mirror 140. Furthermore, focusing of the image of the index mark 134 on the image-pickup device 142 is performed by changing the arrangement of, e.g., the index plate 135, cold mirror 137, image pickup device 142.

The image of the index mark 134, being practically unaffected by eclipsing generated by the index mark 134 itself, possesses accurate positional data regarding the index mark 134. However, the contrast of the image is somewhat reduced by the effects of insufficiently corrected spherical aberration arising from the index-mark detection light LB2 having already passed twice through the right-angle reflecting prism 136. To remedy such spherical aberration, a spherical-aberration correcting means employing an aspheric lens or the like can be provided in the optical path between the dichroic mirror 140 and the image-pickup device 142.

Spherical aberration of the index-mark detection light LB2 can be suppressed as shown in FIG. 18(*a*). In FIG. 18(*a*), the deflector mirror 136A is utilized in place of the right-angle reflecting prism 136. The thicknesses of the index plate 135 and the cold mirror 137 are made about equal. Consequently, the index-mark detection light LB2 is subject to the same aberration conditions as the wafer-mark detection light LB1. Also, the image of the wafer mark 138 and the image of the index mark 134 on the respective image-pickup surfaces of the image-pickup devices 141 and 142 will both be ideal.

The optical path length from the index mark 134 to the reflective surface of the deflector mirror 136A is denoted $D_4$, and the optical path length from the reflective surface of the deflector mirror 136A to the CM film 137a of the cold mirror 137 is denoted $D_3$. The cold mirror 137 and the index plate 135 are situated such that the optical path length $L_5=D_3+D_4$) along the optical axis AX11 from the index mark 134 to the CM film 137a is about equal to the optical path length $L_3$ along the optical axis AX11 from the wafer surface to the surface of the CM film 137a of the cold mirror 137.

Figures 18A, 18B:
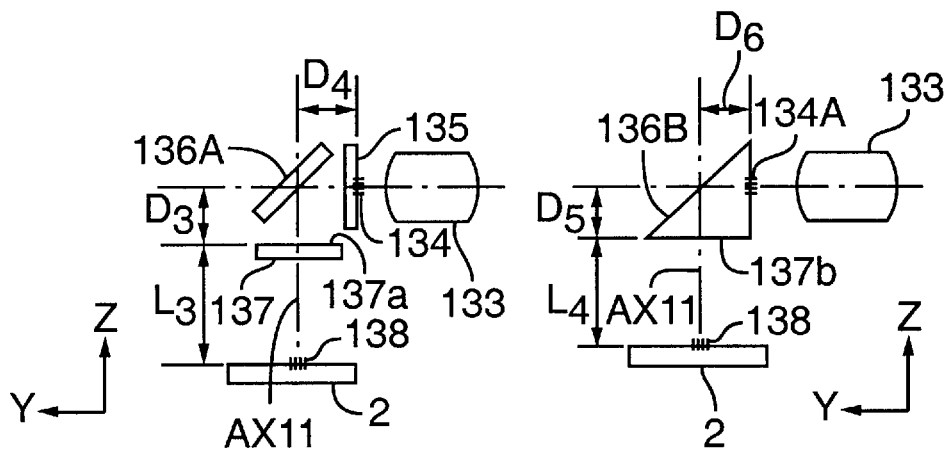
FIG. 18(a) depicts, with respect to the fifth example embodiment, a first alternative configuration of the portion including the right-angle reflecting prism 136.
FIG. 18(b) depicts, with respect to the fifth example embodiment, a second alternative configuration of the portion including the right-angle reflecting prism 136.

Whereas FIGS. 15, 18(a), and 18(b) depict the index plate 135 and the cold mirror 137, is also possible (as shown in FIG. 18(b)) to use a right-angle reflecting prism 136B. In such an instance, the index mark 134A, similar to the index mark 134 of FIG. 15, is formed on the surface facing the first objective lens 133. The CM film 137b, similar to the CM film 137a, is vapor-deposited on the surface opposing the wafer mark 138, in place of the right-angle reflecting prism 136 of FIG. 15.

The optical path length from the index mark 134A of the right-angle reflecting prism 136B to the reflecting surface is denoted $D_6$, and the optical path length from that reflecting surface to the CM film 137b is denoted $D_5$. The right-angle reflecting prism 136B and so forth are situated such that the optical path length $L_6=D_5+D_6$ along the optical axis AX11 from the index mark 134A to the CM film 137b is about equal to the optical path length $L_4$ along the optical axis AX11 from the wafer surface to the CM film 137b.

In this embodiment, there is a lessening of flare as a result of a reduction in the number of interfaces in the optical path. Moreover, because there is a reduction in the number of parts affected by thermal fluctuations and mechanical fluctuations, there is a lighter effect of shifting and so forth on parts. While the index marks 134 and 134A in FIGS. 15, 18(a), and 18(b) possess pattern structures (peaks and valleys) imparting a phase change of 180° in light transmitted through the index marks, a line-and-space pattern made up of alternating light and dark regions, or the like, may also be used.

The configurations shown in FIGS. 15, 18(a), and 18(b) are such that, after a portion of the light from the illuminant light AL2 (comprising infrared light) is irradiated on the index mark 134 or 134A, the light transmitted through and diffracted by that index mark 134 or 134A is then reflected by the cold mirror 137 or 137A. Light reflected therefrom (i.e., index mark detection light LB2) is ultimately introduced to image pickup device 142.

This embodiment is not limited to the foregoing configuration. Illuminant light AL2 taking a route peripheral to the index mark 134 or 134A (i.e., such light passing through the index plate 135 in regions in which the index mark 134 is not located, or regions on the right-angle reflecting prism 136B at which the index mark 134A is not formed) can be reflected by the cold mirror 137 or 137A; the reflected light is irradiated toward the index mark 134 or 134A. The reflected from and diffracted by the index mark 134 or 134A is again reflected by the cold mirror 137 or 137A. The resulting light (i.e., the index-mark detection light LB2) travels along a route peripheral to the index mark 134 or 134A and is ultimately introduced to the image-pickup device 142.

Referring again to FIG. 15, the respective electrical signals from the image of the wafer mark 138 and the image of the index mark 134 respectively supplied from the image-pickup devices 141 and 142, and data from the laser interferometer 4a regarding the position of the wafer stage 3 is arithmetically processed by the central controller 6. Thus, any two-dimensional misalignment of the center of the image of the wafer mark 138 with respect to the center of the image of the index mark 134 can be determined. Since the magnification between the surface of the wafer 2 and the images at the image-pickup surfaces of the image-pickup devices 141 and 142 is known in advance, the misalignment can be converted to an equivalent misalignment at the wafer 2. By then adding to that equivalent misalignment the values measured by the laser interferometer 4a at the time the wafer-stage position is measured, the two-dimensional position of the wafer mark 138 within the stage-coordinate system (the coordinate system indicating the position of wafer stage 3) can be calculated. The location of the center of the wafer mark 138, at the time the position of the center of the image of the wafer mark 138 coincides with the position of the center of the image of the index mark 134, is regarded as the location of the measurement center of the alignment sensor 111.

The wafer 2 typically has multiple shot regions. At each such shot region a wafer mark similar to the wafer mark 138 is formed at a prescribed location. The wafer stage 3 is moved such that the wafer mark of each shot region sequentially falls within the detection region of the alignment sensor 111. By detecting misalignment of the wafer stage 3 relative to the index mark 134, the laser interferometer 4a can be used to detect the position of the wafer mark, within the stage-coordinate system, of the shot region in question.

As shown in FIG. 16, the projection aligner of this example embodiment is provided with environmental sensors that measure the ambient temperature and atmospheric pressure of the apparatus surroundings. Such sensors can include, for example, (a) temperature sensors such as the temperature sensor TG2 for measuring the temperature in the vicinity of the housing 114 of the index-objective unit 111c, or the temperature sensor TG1 for measuring the ambient temperature at the wafer 2, and (b) barometric pressure sensor PG, which measures the atmospheric pressure surrounding the apparatus. The output signals from the temperature sensors, barometric pressure sensors, etc., are supplied to the signal processor 6a. The signal processor 6a determines temperatures and barometric pressures based on those output signals, and supplies this data to the central controller 6.

In this example embodiment, the alignment of each shot region takes place at the time of exposure using the enhanced global alignment (EGA) method. In the EGA method, the coordinate positions of the wafer marks provided at a prescribed number of shot regions (sample shots) selected from those on wafer 2 are measured using the alignment sensor 111. The array coordinates of each shot region on the wafer 2 are calculated by statistical processing of the results of these measurements. The magnitude of the baseline, representing the misalignment between the measurement center of the alignment sensor 111 (the center of the image of the index mark 134) and the center of the image (i.e., exposure center for the pattern defined by the reticle R, as projected by the projection optical system 1, have been measured. The measurement was performed using, for example, a fiducial mark member (not shown) on the wafer stage 3. The central controller 6 positions the wafer stage 3 based on coordinates which are the array coordinates of each shot region after correction for the magnitude of that baseline. As a result of the above operation, each shot region on the wafer 2 can be accurately positioned with respect to the projection image of the pattern of reticle R, and by carrying out exposure in this manner, high precision in overlay registration can be obtained at each shot region.

With respect to the alignment sensor 111 of this embodiment, the sensor main body 111b and the index-objective unit 111c are preferably separated, in contrast to a conventional FIA-type alignment sensor.

Figures 19A, 19B:
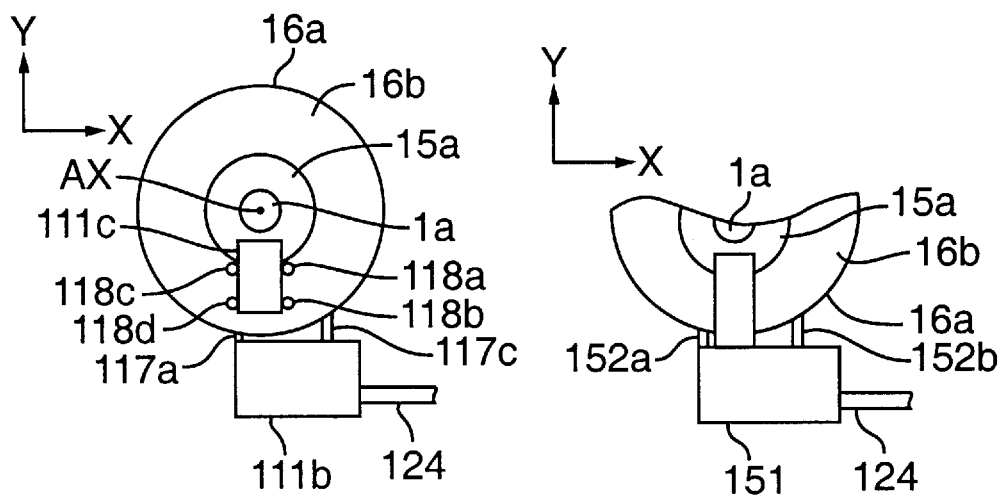
FIG. 19(a) depicts, with respect to the fifth example embodiment, the FIA-type alignment sensor as viewed from the wafer side of the projection optical system 1.
FIG. 19(b) depicts a comparative example for the configuration shown in FIG. 19(a).

FIG. 19(a) shows the alignment sensor 111 of FIG. 15 as viewed from below, while FIG. 19(b) shows a conventional FIA-type alignment sensor as viewed from below. The sensors of FIG. 19(a) and 19(b) differ from each other in several respects.

First, as shown in FIG. 19(b), the sensor main body and the index-objective unit are not separated in a conventional alignment sensor. In fact, the sensor main body and the index-objective unit are integrated in the sensor main body 151, which is secured to the D surface of the projection optical system retainer 16 by way of supporting frames 152a and 152b. Since thermal deformations at the sensor main body 151 can greatly influence baseline fluctuations, the housing of the sensor main body 151 is formed from a low thermal expansion material.

In contrast, in the preferred alignment sensor 111 for use in this embodiment, as shown in FIG. 19a, the index-objective unit 111c is separated from the sensor main body 111b. Moreover, the sensor main body 111b is secured to the D surface of the projection optical system retainer 16 by way of supporting frames 117a and 117c. The index-objective unit 111c is situated at a location slightly removed from the end (in the +Y direction) of the sensor main body 111b so as to orient the unit toward the optical axis AX1 of the projection optical system 1. The index-objective unit 111c is secured to the C surface of the projection optical system retainer 16 by way of supporting frames 118a through 118d, which are arranged symmetrically with respect to an axis parallel to the Y axis and passing through the optical axis AX1.

Second, as shown in FIG. 15, the index mark 134 is arranged between the first objective lens 133 and the wafer mark 138.

Third, the index-mark detection light LB2 from the index mark 134 and the wafer-mark detection light LB1 from the wafer mark 138 are separated immediately prior to their being incident at the image-pickup devices 141 and 142.

The foregoing differences permit the following operations and benefits to be obtained using the alignment sensor 111 of this embodiment:

(a) With conventional alignment sensors, when the D surface 16a of the projection optical system retainer 16 experiences an expansion or contraction, or when the sensor main body 111b moves or is deformed, a fluctuation in the magnitude of the baseline ("baseline fluctuation") will usually arise. In this example embodiment, except for the part of the optical path downstream of the dichroic mirror 140 of the sensor main body 111b, the wafer-mark detection light LB1 and the index-mark detection light LB2 travel along more or less identical optical paths. Consequently, any drift occurring in with respect to the images of the index mark 134 on the image-pickup surfaces of the image-pickup device 142, and with respect to the images of the wafer mark 138 on the image-pickup surfaces of the image-pickup device 141, will have about equal displacement. Furthermore, any expansion or contraction of the D surface, or any movement or deformation of the sensor main body 111b, will not contribute to baseline fluctuation. In other words, so long as the index-objective unit 111c and the wafer mark 138 are stationary, there is essentially no change in offset between the image of the index mark and the image of the wafer mark 138. This makes "drift stability" of this example embodiment extremely high.

(b) In this example embodiment, the wafer-mark detection light LB1 and the index-mark detection light LB2 proceed along essentially the same optical path. Thus, both lights are affected to the same extent by any mechanical vibrations and/or atmospheric fluctuations occurring over the course of the optical path. Consequently, the detected positions of the images of the index mark 134 and the wafer mark 138 at the image-pickup surfaces will likewise fluctuate to the same extent. This results, when detecting the position of the wafer mark 138 with reference to the index mark 134 (i.e., when measuring the so-called differential between the two marks) in improved measurement reproducibility.

(c) This example embodiment does not require that the housing 113 of the sensor main body 111b be made from a low thermal expansion material such as an alloy having a low coefficient of thermal expansion. Such materials are typically expensive and difficult to work. Thus, costs can be controlled.

(d) With this example embodiment, there is a dramatic reduction in sources of baseline fluctuation attributable to the sensor main body 111b. Hence, any occurrence of baseline fluctuation is principally due to drift in the position of the index mark 134 with respect to the wafer mark 138 occurring concomitantly with, for example, expansion or contraction in the horizontal direction of the C surface 16b to which the index-objective unit 111c is secured. Such fluctuation can als arise from drift of the index mark 134 with respect to the wafer mark 138 occurring concomitantly with deformation at the interior of the index-objective unit 111c. However, because the index-objective unit 111c is itself inherently small, deformations at the interior of the index objective unit 111c will also be small. This greatly minimizes drift of the index mark 134 to extremely small levels.

One optical member within the index-objective unit 111c that can be affected by thermal fluctuations and that can have a large effect on drift is the housing 114. The housing 114 supports the right-angle reflecting prism 136. Baseline fluctuations occurring during pitching, rolling, yawing, and other displacements of the right-angle reflecting prism 136 caused by thermal deformation of this housing 114 are reduced in this embodiment, as described below.

To explain the reductions in baseline fluctuations with respect to this embodiment, reference is made, by way of example, use of a right-angle reflecting prism 136B as shown in FIG. 18(b).

Figure 20A:
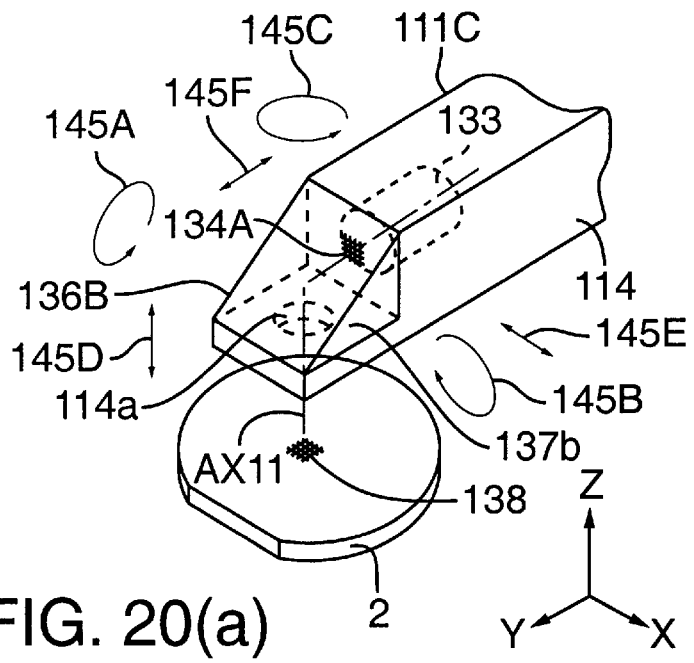
FIG. 20(a) depicts various types of misalignment resulting from displacement of the right-angle reflecting prism 136B shown in FIG. 18(b).

FIGS. 20(a)–20(g) depict various baseline fluctuations occurring when the right-angle reflecting prism 136B of FIG. 18(b) is displaced. FIG. 20(a) is an oblique view showing the positional relationship between the index-objective unit 111c and the wafer 2. FIGS. 20(a)–20(g) respectively show the effects of pitching, rolling, yawing, vertical movement (movement in the Z direction), horizontal movement (movement in the X direction), and front-to-back movement (movement in the Y direction) of the right-angle reflecting prism 136B. In FIG. 20(a), the index-objective unit 111c comprises the first objective lens 133, the index mark 134A, the right-angle reflecting prism 136B on which the CM film 137b is formed, etc., within the housing 114. The index-objective unit 111c is situated above the wafer 2 (on which the wafer mark 138 is formed). The illuminant light AL1, which illuminates the wafer mark 138, and the wafer-mark detection light LB1 (see FIG. 15), pass through the opening 114a provided in the housing 114 corresponding to the bottom center of the right-angle reflecting prism 136B. Any pressure exerted on the right-angle reflecting prism 136B accompanying thermal deformation of the housing 114 will, as shown by the arrows 145A–145E, produce kinetic phenomena such as pitching, rolling, yawing, vertical movement, horizontal movement, and front-to-back movement of the prism, thereby producing drift in the images of the index mark 134A and the wafer mark 138.

In the following description, the magnitude of the drift of the images of the index mark 134A and the wafer mark 138 occurring due to pitching, rolling, and the like, is denoted, respectively, by $\Delta X_{TM}$ and $\Delta X_{WM}$. Any difference between the drift $\Delta X_{TM}$ of the image of the wafer mark 138 and the drift $\Delta X_{TM}$ of the index mark 134A is denoted by $\Delta D$.

Previously, the index mark was not situated between the first objective lens 133 and the wafer mark 138. Any displacement of the right-angle reflecting prism due to pitching, rolling, or the like, would, except in the case of horizontal movement, cause a drift $\Delta X_{WM}$ of the image of the wafer mark to appear unmitigated as drift $\Delta D$ between the wafer mark and the index mark. In the present example embodiment, since the index mark 134A is placed between the first objective lens 133 and the wafer mark 138, any drift $\Delta D$ between the image of the wafer mark 138 and the image of the index mark 134A is reduced compared with the conventional apparatus, as described below.

Figure 20B:
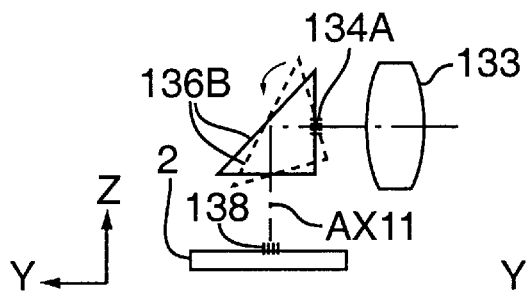
FIG. 20(b) depicts the result of pitching of the right-angle reflecting prism 136B shown in FIG. 18(b).

When the right-angle reflecting prism 136B is displaced as a result of pitching, as indicated by the dashed line in FIG. 20(b), the following relationships exist between drift $\Delta X_{WM}$ of the image of the wafer mark 138 and drift $\Delta X_{TM}$ of the image of the index mark 134A:

$\Delta X_{WM} = 2\Delta X_{TM}$, and $\Delta D = \Delta X_{WM} - \Delta X_{TM} = \Delta X_{WM}/2$ As can be seen, drift $\Delta D$ is reduced to half of the conventional amount.

Figure 20C:
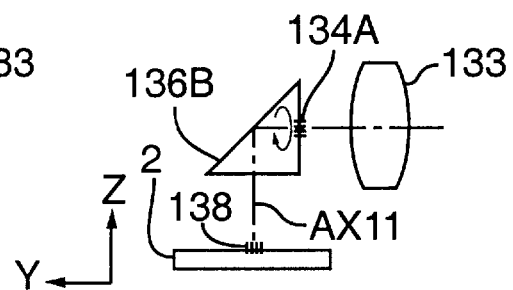
FIG. 20(c) depicts the result of rolling of the right-angle reflecting prism 136B shown in FIG. 18(b).

When the right-angle reflecting prism 136B is displaced as a result of rolling, as indicated in FIG. 20(c), the following relationships exist between drift $\Delta X_{WM}$ of the wafer mark 138 and drift $\Delta X_{TM}$ of the index mark 134A:

$\Delta X_{TM} = 0$, and $\Delta D = \Delta X_{WM} - \Delta X_{TM} = \Delta X_{WM}$ As can be seen, there is no change in the amount of drift $\Delta D$.

Figure 20D:
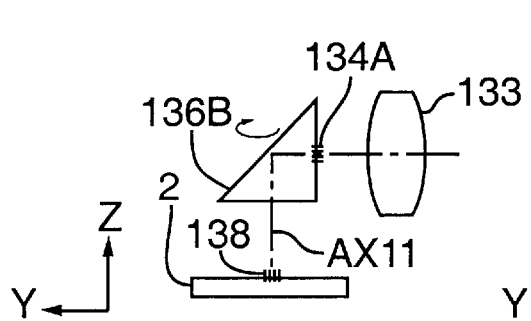
FIG. 20(d) depicts the result of yawing of the right-angle reflecting prism 136B shown in FIG. 18(b).

When the right-angle reflecting prism 136B is displaced as a result of yawing, as indicated in FIG. 20(d), the following relationships exist between drift $\Delta X_{WM}$ of the wafer mark 138 and drift $\Delta X_{TM}$ of the index mark 134A:

$\Delta X_{TM} = \Delta X_{TM}$, and $\Delta D = \Delta X_{WM} - \Delta X_{TM} = 0$ As can be seen, drift $\Delta D$ is practically zero.

Figure 20E:
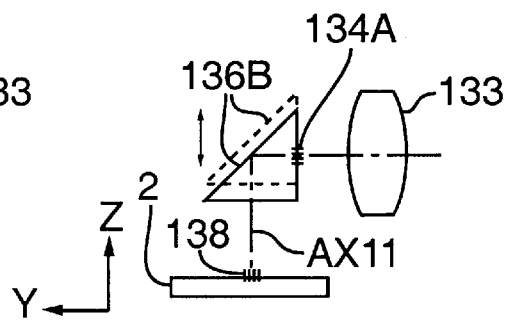
FIG. 20(e) depicts the result of vertical movement (movement in the Z direction) of the right-angle reflecting prism 136B shown in FIG. 18(b).

When the right-angle reflecting prism 136B undergoes vertical movement, as indicated in FIG. 20(e), the following relationships exist between drift $\Delta X_{WM}$ of the wafer mark 138 and drift $\Delta X_{TM}$ of the index mark 134A:

$\Delta X_{WM} = \Delta X_{TM}$, and $\Delta D = \Delta X_{WM} - \Delta X_{TM} = 0$ As can be seen, no drift is produced.

Figure 20F:
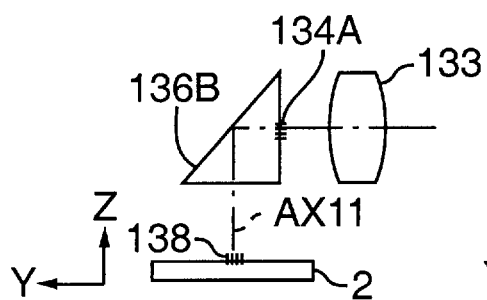
FIG. 20(f) depicts the result of horizontal movement (movement in the X direction) of the right-angle reflecting prism 136B shown in FIG. 18(b).

When the right-angle reflecting prism 136B undergoes horizontal movement, as indicated in FIG. 20(f), the following relationships exist between drift $\Delta X_{WM}$ of the wafer mark 138 and drift $\Delta X_{TM}$ of the index mark 134A:

$\Delta X_{WM} = 0$, and $\Delta D = \Delta X_{WM} - \Delta X_{TM} = -\Delta X_{TM}$ Thus, no drift occurs conventionally in this instance. But, drift from such a cause can be produced in the present embodiment example. (However, because horizontal movement of the right-angle reflecting prism 136B is normally a very rare occurrence, the benefits of this embodiment are not impaired.)

Figure 20G:
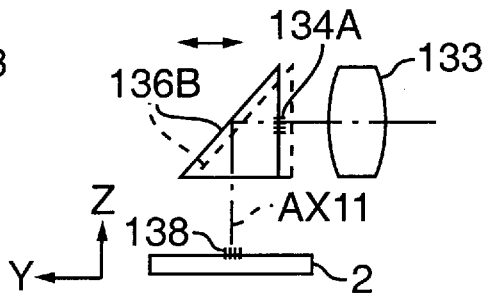
FIG. 20(g) depicts the result of front-to-back movement (movement in the Y direction) of the right-angle reflecting prism 136B shown in FIG. 18(b).

When the right-angle reflecting prism 136B undergoes front-to-back movement, as indicated in FIG. 20(g), the following relationships exist between drift $\Delta X_{WM}$ of the wafer mark 138 and drift $\Delta X_{TM}$ of the index mark 134A:

$\Delta X_{TM} = 0$, and $\Delta D = \Delta X_{WM} - \Delta X_{TM} = \Delta X_{WM}$ This is the same as the conventional case.

As indicated above, this example embodiment advantageously places the index mark 134A between the first objective lens 133 and the wafer mark 138. In addition, although the foregoing is an investigation of the right-angle reflecting prism 136B of FIG. 18(b), similar results may also be obtained using the configuration of FIG. 15. Hence, the index plate 135 (on which the index mark 134 is formed) is arranged extremely close to the right-angle reflecting prism 136. The index plate 135 and the right-angle reflecting prism 136, therefore, are about equally affected by pressures from thermal deformations of the casing 114, and the index plate 135 will experience a displacement similar to that of the right-angle reflecting prism 136. Accordingly, any drift between the index mark 134 and the wafer mark 138 can be regarded as being similar to that shown in FIG. 18(b).

As described above, there is a dramatic reduction in baseline fluctuations even if the housing 114 of the index objective unit 111c is not made of a low thermal expansion material. However, because the housing 114 of the index-objective unit 111c is preferably made of a low thermal expansion material, essentially no baseline fluctuations arise due to thermal deformations of the housing 114.

Drift in the Y direction could arise from expansion or contraction at the C surface on the underside of the projection optical system 1. (Symmetry in the method of securing the index-objective unit 111c assures practically no drift of the index-objective unit 111c in the X direction.) Concentration of temperature control in the area surrounding, in particular, the C surface (16b) on the underside of the projection-optical-system retainer 16 is an effective remedy for such a problem.

In this example embodiment, as illustrated in FIG. 16, the temperature sensor TG2 is provided in the vicinity of the index-objective unit 111c. The temperature in the area surrounding the C surface is measured using the temperature sensor TG2. The amount of drift at the index-objective unit 111c can be predicted from the change in temperature.

Locations where drift accompanies heat generation at the alignment sensor 111 can thus be dramatically reduced, and limited. Moreover, schemes such as using low thermal expansion materials, local-area temperature control, and predictive control through the use of temperature monitoring can be employed effectively, without wasted effort, permitting the magnitude of baseline fluctuations occurring at the alignment sensor 111 concomitant with thermal fluctuations to be made extremely small, and permitting dramatic improvements in alignment precision. Since baseline checks need not be repeated frequently, there is also the advantage of improved throughput (productivity).

Adjustment of the telecentricity of the illuminant light AL2 with respect to the index mark 134 must be conducted rigorously. Vital environmental fluctuations other than thermal factors occurring at the area surrounding the alignment sensor 111 include changes in atmospheric pressure. In the event that there are marked changes in atmospheric pressure, the image of the wafer mark 138 and the image of the index mark 134 will become defocused on the image-pickup surfaces of the image-pickup devices 141 and 142. In such an event, if there is no deviation in the telecentricity of the image of the wafer mark 138 or the image of the index mark 134 with respect to their image-pickup surfaces, there will be no shift in the image. Conversely, if there is deviation from telecentricity, there will be a shift in the image.

The case of the wafer mark 138 is addressed first. It is possible to make corrections to ensure no drift in the image of the wafer mark 138 with fluctuations in atmospheric pressure, even if the illuminant light AL1 deviates somewhat from being telecentric with respect to the wafer mark 138. Such corrections can be made by: (a) detecting changes in atmospheric pressure using the barometric pressure sensor PG of FIG. 16 and the like, (b) using the focal-point position detection system 109a, 109b of FIG. 16 to detect the position of the wafer mark 138 in the direction perpendicular to the wafer mark 138 so as to constantly maintain the focus of the image of wafer mark 138 at the image pickup device 141, and (c) by making adjustments using the central controller 6 to drive the Z-tilt stage 3Z.

The case of the index mark 134 is addressed next. Rigorous adjustment of the telecentricity of the illuminant light AL2 is performed to prevent shifting of the image. First, telecentricity of the illuminant light AL1 with respect to the wafer mark 138 can be adjusted by driving the Z-tilt stage 3Z, exploiting the ability of the wafer mark 138 to move vertically along the optical axis AX11. Next, telecentricity with respect to the index mark 134, which is incapable of being driven vertically, is adjusted as follows: (a) The image of the light source of the illuminant light AL1, for which adjustment of telecentricity with respect to the wafer mark 138 has already been completed, is observed at the entrance-pupil plane 132 of the first objective lens 133. (b) Fine adjustments in the position of the light source 126 within a plane perpendicular to the optical axis AX11 are made so as to align the image of the light source of infrared illuminant light AL2 to this image of the light source of illuminant light AL1. (c) According to the arrangements above, the telecentricity of the illuminant light AL2 is perfectly adjusted with respect to the index mark 134, enabling the position of the wafer mark 138 to be detected with high precision despite fluctuations in atmospheric pressure, and with no occurrence of drift in the image of the index mark 134 at the image pickup device 142 serving as the reference for detection. The images of the light sources may be observed at a location conjugate to the entrance-pupil plane 132.

It is possible to prevent the occurrence of deviations from telecentricity that can accompany fluctuations in atmospheric pressure. This can be done by utilizing, for example, the barometric pressure sensor PG of FIG. 16, or the cold-mirror driver 143 of FIG. 15. This can also be done by, as described for the wafer mark 138, automatically adjusting the focus of the image of the index mark 134 at the image-pickup device 141 during fluctuations in atmospheric pressure. For example, one can adjust the height (i.e., the position in the direction along the optical axis) of the CM film 137a by activating the cold-mirror driver 143. The cold-mirror driver 143 is activated by commands issued from the central controller 6. It is also possible to constantly maintain the image of the index mark 134 at the position of best focus, based on, e.g., (a) the magnitude of the change in focus of the index-mark image concomitant with the change in atmospheric pressure as determined from design values, or (b) the magnitude of the fluctuation in atmospheric pressure as determined from the barometric pressure sensor PG.

It is possible to measure in advance the rate of shift in the position of the image of the index mark 134 at the image-pickup device 141 occurring concomitantly with fluctuations in atmospheric pressure. Such measurements can be stored in the central controller 6. It is also possible to calculate the offset that should be applied to the detected position of the image of the index mark 134 based on the magnitude of the fluctuation in atmospheric pressure as determined by barometric pressure sensor PG. Thus, one can constantly apply a correction for the change in barometric pressure to the position of the image of index mark 134, which serves as a reference for detection, and achieve stable measurement.

Sixth Example Embodiment

Figure 21:
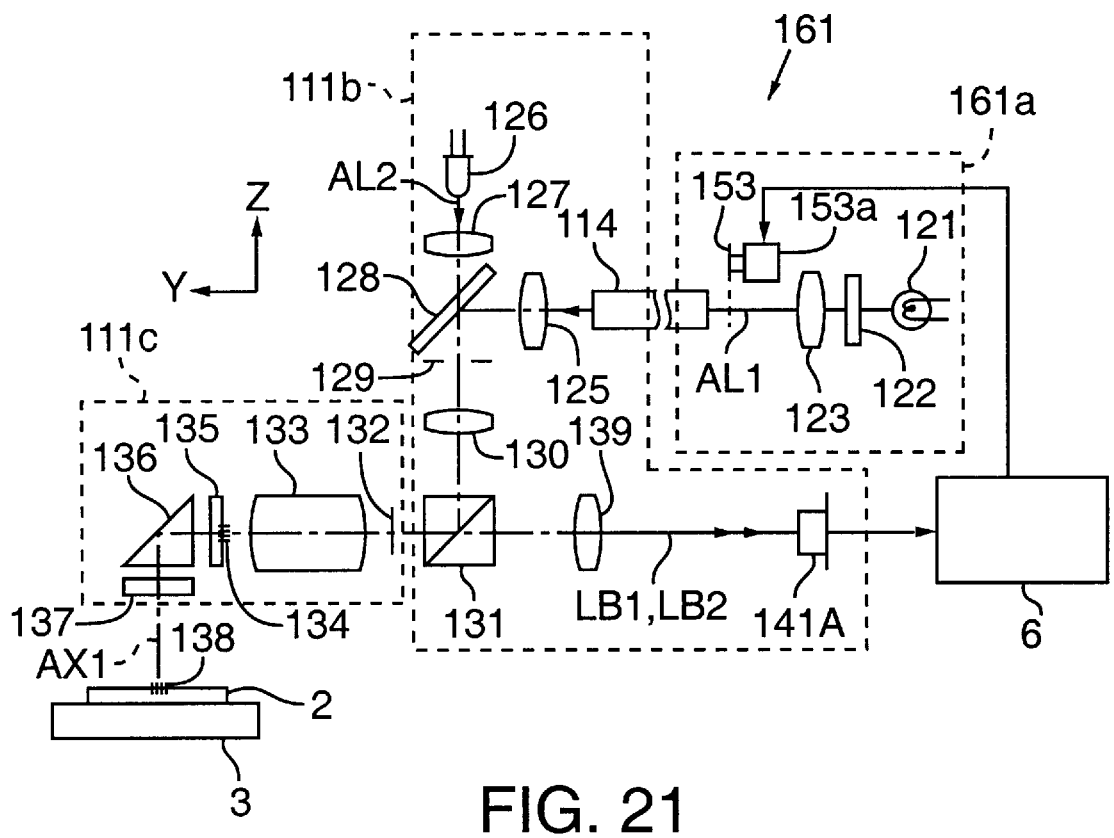
FIG. 21 is a simplified elevational view of a position-detection apparatus (alignment sensor) according to a sixth example embodiment of the invention.

This example embodiment is described with reference to FIG. 21. In this example embodiment, the image of the wafer mark 138 and the image of the index mark 134 are detected such that they are separated temporally, and not spatially. Since the basic configuration of this embodiment is similar to the fifth example embodiment, the same reference designators as used in FIG. 15 are used in FIG. 21 for the same components. For such components, no further description is provided here.

In the alignment sensor 161 of this example embodiment, a rotating shutter 153 and driver 153a for driving the rotating shutter 153 are provided just before the entrance plane of the light guide 114 within a lamp unit 161a. The lamp unit 161a supplies visible illuminant light AL1 for detection of the wafer mark 138 to the sensor main body 111b. An image-pickup device for reception of the wafer-mark detection light LB1 from the wafer mark 138 and an image-pickup device for reception of the index-mark detection light LB2 from the index mark 134 are not provided separately. Instead, a single image-pickup device 141A is utilized.

Other than the foregoing, this embodiment is constituted similarly to the fifth example embodiment.

In this sixth embodiment, the rotating shutter 153 is controlled such that it opens and closes by way of the driver 153a as controlled by the central controller 6. Thus, the wafer mark 138 is intermittently detected. The light source 126, provided at the sensor main body 111b for supplying the infrared illuminant light AL2 used to detect the index mark 134, is controllably turned on and off by the central controller 6. Thus, the index mark 134 is intermittently detected.

The operation of the alignment sensor 161 is as follows: When the wafer mark 138 reaches the measurement region of the alignment sensor 161 during the course of stepped movement of the wafer stage 3, the central controller 6 turns off the infrared light source 126. The central controller 6 simultaneously opens the rotating shutter 153 by way of the driver 153a of the lamp unit 161a. Thus, the wafer mark 138 is irradiated with the illuminant light AL1, causing reception of wafer-mark detection light LB1 at the image-pickup device 141A. An electrical signal corresponding to the position of the wafer mark 138 is then supplied from the image-pickup device 141A to the central controller 6. Next, concomitant with initiating movement of the wafer stage 3 in order to step to a different wafer mark, the central controller 6 turns on the light source 126 and simultaneously closes the rotating shutter 153. This causes illuminant light AL2 to be irradiated on the index mark 134, and the index-mark detection light LB2 to be received at the image-pickup device 141A. An electrical signal corresponding to the position of the index mark 134 is then supplied from image-pickup device 141A to the central controller 6. During alignment according to the EGA method, the coordinate positions of each shot region (sample shot) with respect to the index mark 134 can be measured by repeatedly carrying out this sequence of operations.

Detection of the position of the index mark 134 need not be carried out each time the wafer stage 3 is stepped. For example, the index mark 134 may be detected only twice, once during measurement of the first sample shot and once during measurement of the last sample shot. The average of the two sets of measured values may be used. In addition, the position of the index mark 134 may be determined from the values of a set of measurements made just once during the course of stepping through an appropriate number of shot regions.

In addition to the advantages realized with the fifth example embodiment, this sixth example embodiment also allows a reduction in the number of optical parts, such as the image-pickup device and other optical equipment, with consequent reduction in cost.

Seventh Example Embodiment

Figure 22A:
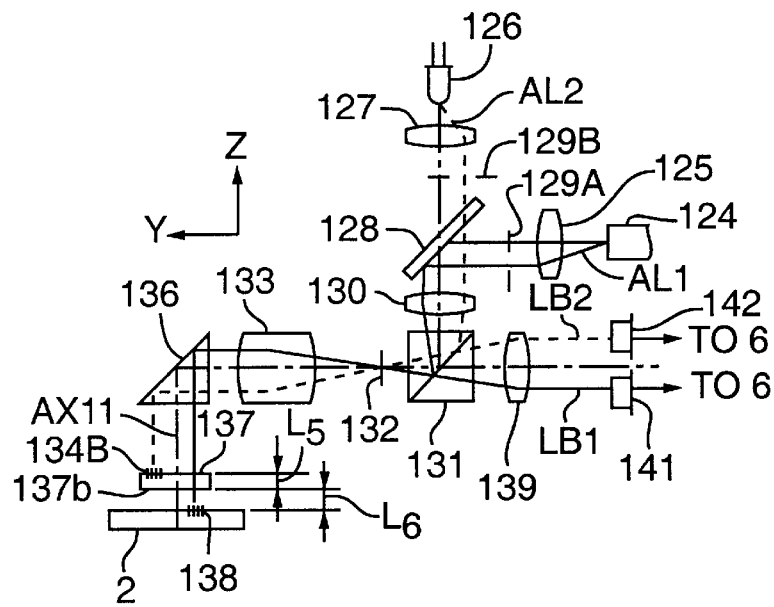
FIG. 22(a) is a simplified elevational view of a position-detection apparatus (alignment sensor) according to a seventh example embodiment of the invention.

This seventh example embodiment of the invention is depicted in FIG. 22(a). In this example embodiment, the index mark 134B, which is similar to the index mark 134 of FIG. 15, is provided between the right-angle reflecting prism 136 and the wafer 2. In addition to bearing the index mark 134B on its top surface, the cold mirror 137 also bears the CM film 137b on its bottom surface. Since the constitution of this example embodiment is otherwise similar to that of the fifth example embodiment, the same reference designators are used in FIG. 22(a) for components that are the same as used in FIG. 15. Further detailed description of such components is not provided here.

Referring to FIG. 22(a), the index mark 134B is formed on the top surface of the cold mirror 137, which is situated directly above the wafer 2. The CM film 137b is formed on the surface of the cold mirror 137 that is nearest to the wafer 2. The illuminant light AL2 comprises infrared light. The illuminant light AL2 irradiates the index mark 134B, is reflected by the CM film 137b, and returns to the image-pickup device 142 as index-mark detection light LB2. A field stop 129B for the index mark 134B is situated in the optical path of the illuminant light AL2 between the condenser lens 127 and the dichroic mirror 128. A field stop 129A for the wafer mark 138 is situated in the optical path of the illuminant light AL1 between the condenser lens 125 and the dichroic mirror 128. Thus, the respective separate field stop 129B for the index mark 134B and the field stop 129A for the wafer mark 138 allow irradiation of the index mark 134B and the wafer mark 138 to be limited solely to the respective infrared illuminant light AL2 and visible illuminant light AL1.

The optical path length $L_5$ from the CM film 137b to the index mark 134B is equal to the optical path length $L_6$ from the CM film 137b to the wafer mark 138. The index mark 134B lies in the focal plane of the first objective lens 133. The CM film 137b possesses the same ability to deflect (reflect) the index-mark detection light LB2 such that the light proceeds in a direction toward the image-pickup device 142 as in the fifth example embodiment (FIG. 15). The optical distance between the index mark 134B and the CM film 137b should be sufficiently small to ensure that the index-mark detection light LB2 is not vignetted.

The index mark 134B is arranged such that it is directly above and as proximally as possible to the wafer mark 138. By combining the optical paths of the index-mark detection light LB2 and the wafer-mark detection light LB1 such that the lights share a common optical path as early as possible, the effects of atmospheric fluctuations and mechanical vibrations on the index-mark detection light LB2 and the wafer-mark detection light LB1 are made as similar as possible. As a result, further improvement in the drift stability of the alignment sensor is realized. Also, improvement in the measurement reproducibility of the detected position of the wafer mark 138 is realized. Since the wafer mark 138 and the index mark 134 would be simultaneously affected by any displacement of the right-angle reflecting prism 136 (on which thermal fluctuations can have a large effect) this example embodiment exhibits no baseline drift between the index-mark detection light LB2 and the wafer-mark detection light LB1 due to displacement of the right-angle reflecting prism 136. Thus, it is now possible to completely eliminate the effects of pitching, rolling, yawing, and so forth described at the fifth example embodiment.

Figure 22B:
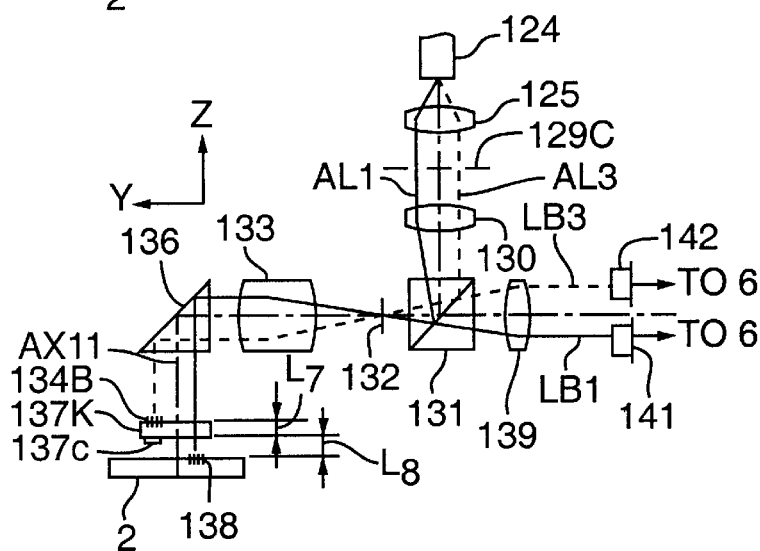
FIG. 22(b) is a simplified elevational view of a first alternative configuration of the alignment sensor of the seventh example embodiment.
Figure 22C:
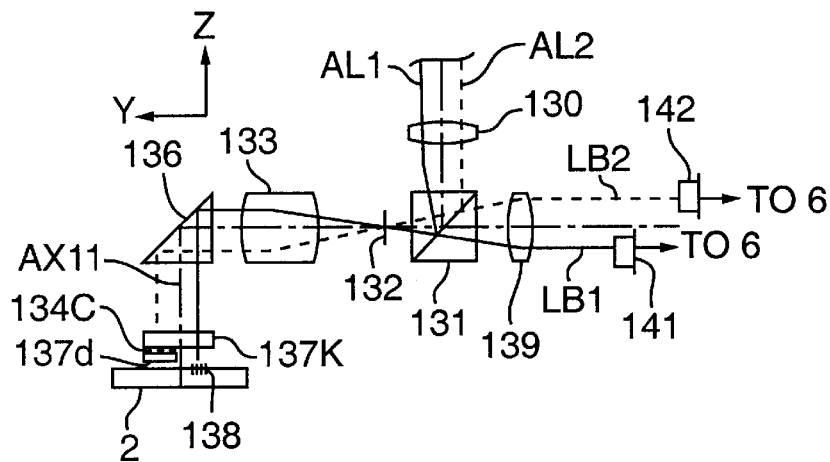
FIG. 22(c) is a simplified elevational view of a second alternative configuration of the alignment sensor of the seventh example embodiment.

FIGS. 22(b) and 22(c) depict two possible variations of this example embodiment. In both variations, an index mark is situated on the wafer side of the right-angle reflecting prism 136. The overall configuration of both variations is essentially the same as the FIG. 22(a) embodiment.

In the variation shown in FIG. 22(b), a dedicated light source 126 for producing infrared light for irradiation of the index mark 134B is not provided. Rather, the index mark 134B and the wafer mark 138 are both illuminated by a single light source that emits visible light. FIG. 22b shows a light guide 124 that supplies visible light from a visible light source (not shown). Illuminant light from the light guide 124 is incident upon the field stop 129C by way of a condenser lens 125. A field stop 129C is provided with two apertures, and the illuminant light from the condenser lens 125 is separated into illuminant light AL3 for irradiation of the index mark 134B, and illuminant light AL1 for irradiation of the wafer mark 138. The illuminant light AL3 corresponds to the illuminant light AL2 of FIG. 22(a). Hereafter, the optical paths of the illuminant light AL1 and the illuminant light AL3 are similar to those of the illuminant light AL1 and the illuminant light AL2 of FIG. 22(a).

In the FIG. 22(b) embodiment, the means for deflecting (reflecting) the index-mark detection light LB3 toward the image-pickup device 142 is not the CM film 137b of FIG. 22(a). Rather, the reflecting means comprises the reflecting member 137c comprising an aluminum (Al) film or the like vapor-deposited on a portion of the wafer-mark side of the transparent glass plate 137K where light-absorbing index mark 134B is formed. The optical path length $L_7$ from the reflecting member 137c to the index mark 134B is equal to the optical path length $L_8$ from the reflecting member 137c to the wafer mark 138. The index mark 134B lies in the focal plane of the first objective lens 133. Compared with the embodiment of FIG. 22(a), the FIG. 22(b) embodiment permits a further reduction in cost by eliminating the infrared light source.

The variation shown in FIG. 22(c) does not employ a CM film, aluminum reflecting member, or other type of reflecting member as a means for deflecting the index-mark detection light LB2 toward the image-pickup device 142. The FIG. 22(c) embodiment uses the light-reflecting index mark 134C as the index mark, the index mark 134C being formed on the wafer side of the transparent glass plate 137K. The light-blocking member 137d comprises chromium oxide or other such material possessing light-absorbing properties vapor-deposited such that it overlaps index mark 134C. The light-blocking member 137d is operable to block light from reaching the surface of the wafer 2. The index mark 134C may itself possess light-absorbing properties, in which case the light-blocking member 137d would comprise aluminum or other such reflecting materials.

Further with respect to the FIG. 22(c) embodiment, the index mark 134C lies substantially outside the focal plane of the first objective lens 133. Because the index mark 134C is defocused toward the first objective lens 133, the image-pickup device 142 (situated for detection of the index mark 134C) is placed farther back than the image-pickup device 141 for detection of the wafer mark 138. Since the FIG. 22(c) embodiment does not employ the CM film 137a shown in FIG. 15 or other such index-mark detection-light deflection means (reflection means), the FIG. 22(c) embodiment represents an even simpler arrangement of the index mark relative to the wafer-mark side of the first objective lens 133.

All the foregoing descriptions have pertained to employing dark-field methods for illumination of the wafer mark 138. However, arranging the index mark relative to the wafer-mark side of the first objective lens 133 can also be applied to instances in which the wafer mark 138 is illuminated by transmitted light. In addition, the wafer mark 138 or the index mark may comprise a luminous emitter that emits light on its own. In such instances, a separate illumination means is not required for the wafer mark 138 or the index mark.

The embodiments shown in FIGS. 22(a)–22(c) employ a position-detection scheme in which an index mark serving as a reference for detection is arranged at the wafer mark 138 or other location on the position-detection-target side of the first objective lens 133 (or other condenser means). Such a scheme can be applied to practically any conceivable situation in which a wafer mark 138 or other target object of position detection is being imaged and detected. In addition, a synergy is achieved from employing techniques such as, for example, independent retention of the first objective lens 133 and the index mark 134 as described in the first example embodiment.

Eighth Example Embodiment

An eighth example embodiment of the invention is depicted in FIGS. 23(a)–23(e).

In the preceding example embodiments (except the FIG. 21 embodiment), the image-pickup device for detection of the wafer mark 138 and the image-pickup device for detection of the index mark were provided separately; however, two image-pickup devices need not necessarily be provided. Appropriate placement of the index mark on the index plate, and appropriate placement of light-blocking plates for preventing stray light within the optical path of the illuminant light optical system from propagating to the light-source side of the half-prism 131, permit simultaneous high-precision detection of the positions of the index mark and wafer mark 138 using a single image-pickup device. Such a scheme is incorporated into this eighth embodiment which can detect the position of the wafer mark 138 with reference to the an index mark using a single image-pickup device.

Aside from the image-pickup device, the basic configuration of this embodiment is similar to the FIG. 15 embodiment. In FIGS. 23(a)–FIG. 23(e), components that are the same as used in FIG. 15 have the same reference designators as corresponding components in FIG. 15. Such components are not described further here.

Figure 23A:
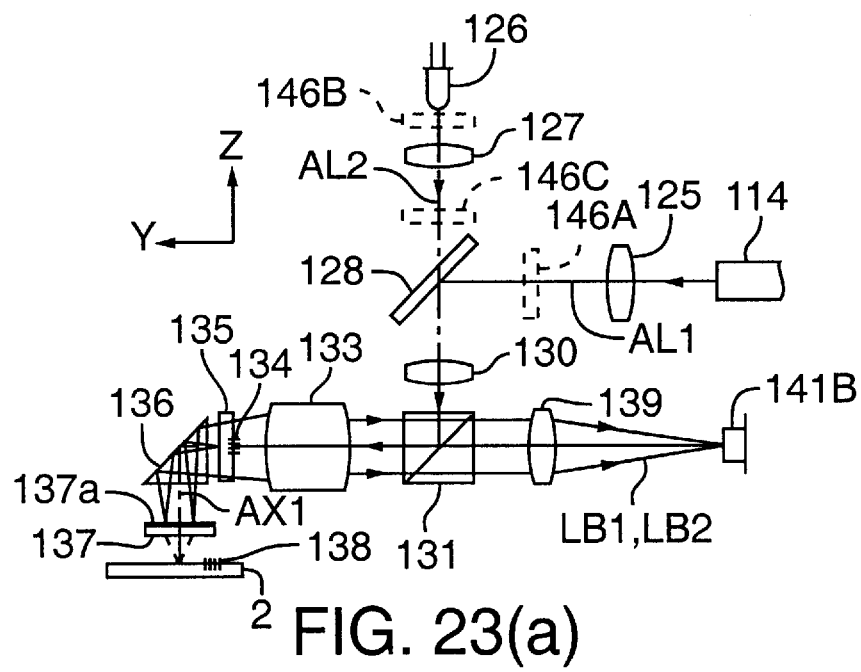
FIG. 23(a) is a simplified elevational view of a position-detection apparatus (alignment sensor) according to an eighth example embodiment of the invention.

Referring to FIG. 23(a), the detection light LB1 and LB2 from the index mark 134 and the wafer mark 138 are received at a single image-pickup device 141B. The possibility exists that stray light from the infrared light source 126 will encroach upon the image of the wafer mark 138 on the image-pickup device 141B, causing reduced contrast in the wafer-mark image. To prevent degradation of the signal-to-noise ratio of the electrical signal corresponding to the wafer mark 138 as a result of such stray light, a light-blocking plate 146B, operable to block areas other than the region of the pattern of index mark 134, is provided in the optical path of the illuminant light AL2. The light-blocking plate 146B is situated just upstream of where the illuminant light AL2 is incident at the dichroic mirror 128. Thus, the light-blocking plate 146B is located in a vicinity that is conjugate to the index mark 134. (This location corresponds, in FIG. 23(a), to a location between the infrared light source 126 and the condenser lens 127.) It is sufficient that the light-blocking plate 146B be in a more or less conjugate relationship to the index plate 134 by way of the lens system (127, 130, 133).

Figure 23B:
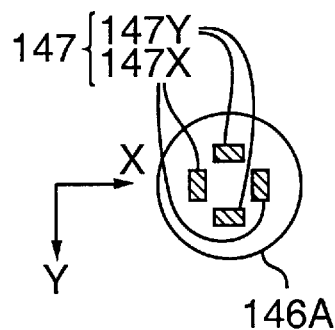
FIG. 23(b) depicts, with respect to the eighth example embodiment, the light-blocking plate 146A.
Figure 23C:
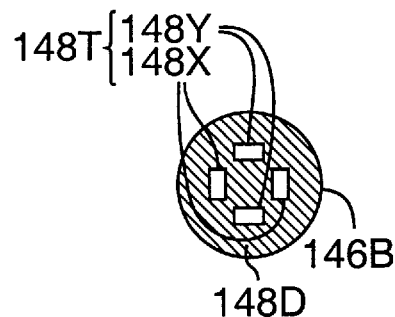
FIG. 23(c) depicts, with respect to the eighth example embodiment, the light-blocking plate 146B.
Figure 23D:
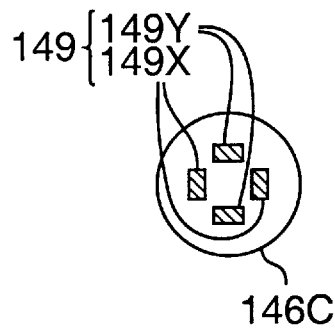
FIG. 23(d) depicts, with respect to the eighth example embodiment, the light-blocking plate 146C.
Figure 23E:
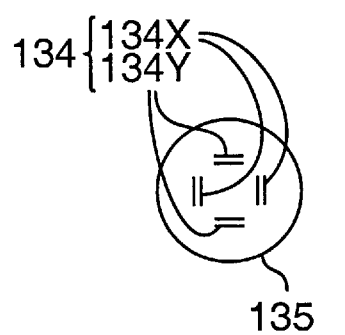
FIG. 23(e) depicts, with respect to the eighth example embodiment, the index plate 135.

FIG. 23(c) shows a pattern on the light-blocking plate 146B, while FIG. 23(e) shows the index mark 134 formed on the index plate 135. FIGS. 23(b) and 23(d), to be discussed below, also show patterns on respective light-blocking plates.

As shown in FIG. 23(e), the index mark 134 comprises two grating-form patterns 134X, for measurement in the X direction. The grating-form patterns 134X are separated a prescribed distance from each other on a line passing through the center of the index plate 135 and parallel to the X axis. The index mark 134 also comprises two grating-form patterns 134Y, for measurement in the Y direction. The grating-form patterns 134Y are separated a prescribed distance from each other on a line passing through the center of the index plate 135 and parallel to the Y axis.

In FIG. 23(c), the light-blocking plate 146B comprises transmitting regions 148T comprising two X-axis transmitting regions 148X and two Y-axis transmitting regions 148Y. The transmitting regions 148T have a slightly greater width than the grating-form patterns 134X and 134Y, and are situated at locations corresponding to the grating-form patterns 134X and 134Y of the index mark 134. The transmitting regions 148T are surrounded and enclosed by a light-blocking region 148D. Because the greater portion of the infrared illuminant light AL2 from the light source 126 is blocked by this light-blocking region 148D, a reduction in encroachment of stray light from the infrared light source into the image of the wafer mark 138 on the image-pickup device 141B is possible. Such blocking improves the signal-to-noise ratio of the electrical signal corresponding to the wafer-mark image.

Next, prevention of stray light at the image of the index mark is considered. Stray light arising from the visible illuminant light AL1 used to illuminate the wafer mark 138 exists at the region on the image-pickup device 141B where the image of the index mark 134 is detected. To reduce this stray light, a light-blocking plate 146A, operable to block light beams that pass through locations conjugate to the patterned region of the index mark 134, is preferably situated in the optical path of the illuminant light AL1 incident upon the dichroic mirror 128. The light-blocking plate 146A can also be situated in a location that is conjugate to the surface of the wafer 2 (corresponding, in FIG. 23(a), to a location along the optical path between the dichroic mirror 128 and the condenser lens 125).

FIG. 23(b) shows the pattern on the light-blocking plate 146A of the light-blocking regions 147. The light-blocking regions comprise two X-axis light-blocking regions 147X and two Y-axis light-blocking regions 147Y. The light-blocking regions 147X, 147Y are slightly wider than the grating-form patterns 134X and 134Y, and are provided on the light-blocking plate 146A at conjugate locations corresponding to the grating-form patterns 134X and 134Y of the index mark 134. Because the portion of wafer-mark-detection illuminant light AL1 passing through the index mark 134 is thus blocked, there is a drop in wafer-mark detection light LB1, which consists of light reflected from the wafer mark 138, present at the region where the image of the index mark 134 is detected at the image-pickup device 141B. This improves the signal-to-noise ratio of the electrical signal corresponding to the index-mark image.

There are also situations in which portions of illuminant light AL2 not contributing to formation of an image of the index mark 134 can act as stray light with respect to the index-mark detection light. To prevent degradation of the signal-to-noise ratio of the index-mark image-signal output from the image-pickup device 141B caused by such stray light, a light-blocking plate 146C can be situated in the optical path of the illuminant light AL2 upstream of the point at which the illuminant light AL2 is incident upon the dichroic mirror 128. The light-blocking plate 146C can also be placed at or in the vicinity of a location that is conjugate, by way of the cold mirror 137, to the index mark 134 (corresponding, in FIG. 23(a), to a location between the dichroic mirror 128 and the condenser lens 127). This results in an improved signal-to-noise ratio of the electrical signal corresponding to the index-mark image at the image-pickup device 141B.

FIG. 23(d) shows the pattern on the light-blocking plate 146C. The pattern comprises light-blocking regions 149 comprising two X-axis light-blocking regions 149X and two Y-axis light-blocking regions 149Y. Each of the light-blocking regions 149X, 149Y is slightly wider than the grating-form patterns 134X and 134Y. Similar to the light-blocking regions shown in FIG. 23 (b), the light-blocking regions 149X, 149Y are provided on the light-blocking plate 146C at conjugate locations corresponding to the grating-form patterns 134X and 134Y of the index mark 134. Consequently, there is a reduction in the stray light from the illuminant light AL2, and a corresponding improvement in the signal-to-noise ratio of the electrical signal corresponding to the image of the index mark 134 at the image-pickup device 141B.

Figure 24A:
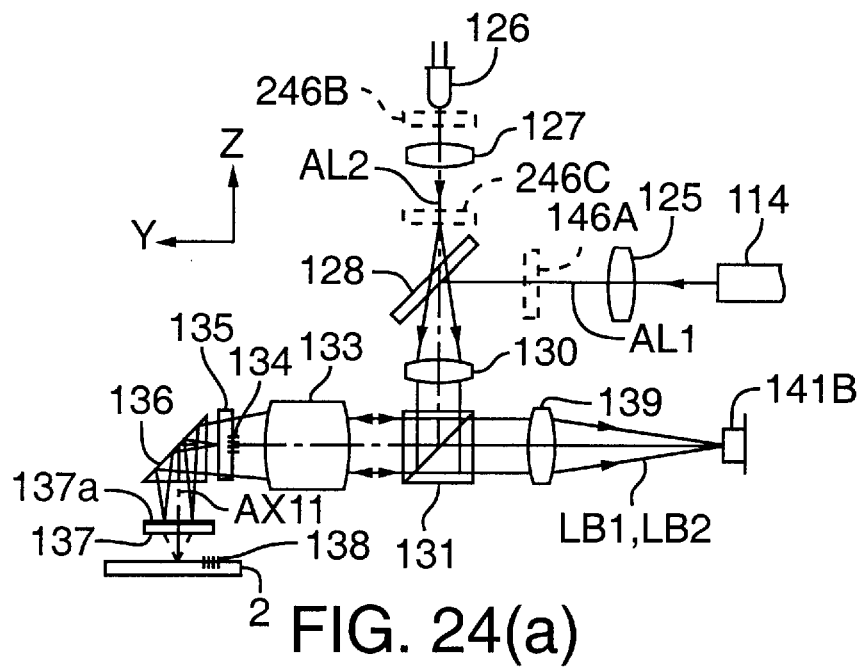
FIG. 24(a) is a simplified drawing showing an alternative configuration of the eighth example embodiment.
Figure 24B:
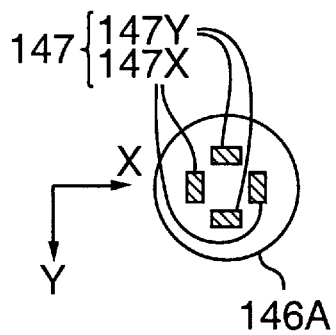
FIG. 24(b) depicts, with respect to the FIG. 24(a) configuration, the light-blocking plate 146A.
Figure 24C:
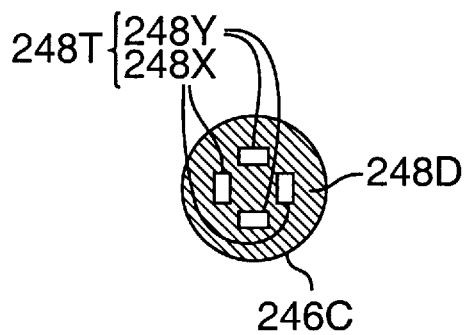
FIG. 24(c) depicts, with respect to the FIG. 24(a) configuration, the light-blocking plate 246C.
Figure 24D:
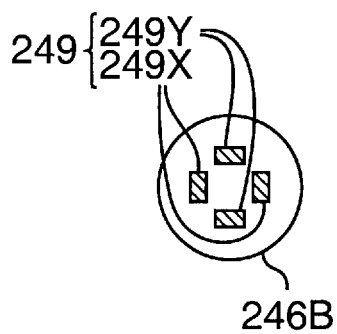
FIG. 24(d) depicts, with respect to the FIG. 24(a) configuration, the light-blocking plate 446B.
Figure 24E:
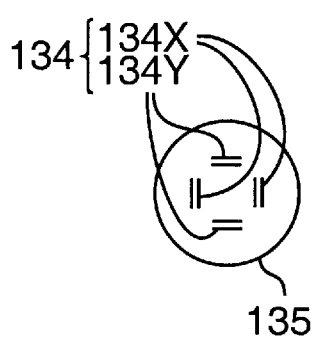
FIG. 24(e) depicts, with respect to the FIG. 24(a) configuration, the index plate 135.

Variations of this eighth embodiment are shown in FIGS. 24(a)–24(e). The same reference designators are used in FIG. 24(a) for the same components shown in FIG. 23(a). Thus, further detailed description of such components is not provided here. The index plate 135 shown in FIGS. 24(a) and 24(e) is configured the same as the index plate 135 of this eighth example embodiment shown in FIGS. 23(a) and 23(e). Also, the function and configuration of the light-blocking plate 146A situated between the dichroic mirror 128 and the condenser lens 125 in FIGS. 24(a) and 24(b) are the same as the function and configuration of the light-blocking plate 146A of this eighth example embodiment as shown in FIGS. 23(a) and 23(b). Thus, no further detailed description of these components is provided here.

FIG. 23(a) depicts a configuration in which a portion of the light (of which the infrared illuminant light AL2 is composed) was irradiated on the index mark 134. The light transmitted through and diffracted by the index mark 134 is then reflected by the cold mirror 137. Light reflected from the index mark 134 (i.e., index-mark detection light LB2) is ultimately guided to the image-pickup device 141.

In FIG. 23(a), a portion of the illuminant light AL2, which is infrared light, is irradiated on the index mark 134. The light transmitted and diffracted at the index mark 134 is reflected by the cold mirror 137. Reflected light (index-mark detection light LB2) is ultimately introduced to the image-pickup device 141.

In the variation of the eighth example embodiment shown in FIG. 24(a), a portion of the illuminant light AL2 passing through the region surrounding the index mark 134 (the region on the index plate 135 at which the index mark 134 is not formed) is used as detection light. Hence, in the FIG. 24(a) embodiment, the illuminant light AL2 passing through the region surrounding the index mark 134 (the region on index plate 135 at which the index mark 134 is not formed) is reflected by the cold mirror 137. Light reflected from the cold mirror is then irradiated on the index mark 134. The light reflected and diffracted by that index mark 134 is then again reflected by the cold mirror 137, and the light reflected therefrom (index-mark detection light LB2), after passing through the region surrounding the index mark 134 (the region on the index plate 135 at which the index mark 134 is not formed), is ultimately introduced to the image-pickup device 142.

With respect to the variation shown in FIG. 24(a), in order to prevent degradation of the signal-to-noise ratio of the electrical signal corresponding to the wafer mark 138 as a result of stray light, the light-blocking plate 246C is provided in the optical path of the infrared illuminant light AL2 upstream of the point at which the illuminant light AL2 is incident upon the dichroic mirror 128. The light-blocking plate 246C can also be placed at or in the vicinity of a location conjugate, by way of the cold mirror 137, to the index mark 134 (i.e., at a location conjugate to the surface of the wafer 2, or a location conjugate to the reflection of the index mark 134 in the cold mirror 137. Such a position corresponds, in FIG. 24(a), to a location between the dichroic mirror 128 and the condenser lens 127.

As shown in FIG. 24(c), the transmitting regions 248T, consisting of two X-axis transmitting regions 248X and two Y-axis transmitting regions 248Y, are slightly greater in width than the grating-form patterns 134X and 134Y. The transmitting regions 248T are provided on the light-blocking plate 246C at conjugate locations corresponding to the index marks 134X and 134Y. Such a constitution permits a portion of the infrared light AL2 from the light source 126 that is unwanted from the perspective of illumination of the index mark to be blocked by the light-blocking plate 246C. Thus, it is possible to reduce encroachment of stray light from the infrared light source into the image of wafer mark 138 on image pickup device 141B, improving the signal-to-noise ratio of the electrical signal corresponding to the wafer-mark image.

There are instances in which the illuminant light AL2, which directly illuminates the index mark 134, can present stray light with respect to index mark detection light LB2. If the image of the index mark formed at the image-pickup device 141B by the illuminant light AL2 directly illuminating of the index mark 134 is compared with the image of the index mark formed at the image-pickup device 141B by the illuminant light AL2 illuminating the index mark 134 by way of the cold mirror 137 and passing through the region surrounding the index mark 134, it can be seen that light and dark are reversed in the two images of the index mark. This lowers the contrast of the index-mark image.

To prevent degradation of the signal output signal-to-noise ratio of the index-mark image from the image-pickup device 141B due to this stray light, a light-blocking plate 246B is provided in the optical path of the illuminant light AL2 upstream of the point at which the illuminant light AL2 is incident upon the dichroic mirror 128. Such a location is in the vicinity of a location conjugate to the index mark (corresponding, in FIG. 24(a), to a location between the infrared light source 126 and the condenser lens 127). Because the light-blocking plate 246B can remove illuminant light AL2 that directly illuminates the index mark 134, the signal-to-noise ratio of the output signal from the index-mark image at the image-pickup device 141B is improved.

As shown in FIG. 24(d), the light-blocking regions 249, comprising two X-axis light-blocking regions 249X and two Y-axis light-blocking regions 249Y (each slightly wider than the grating-form patterns 134X and 134Y), are situated on the light-blocking plate 246B at conjugate locations corresponding to the index marks 134X and 134Y. Because such a configuration eliminates the encroachment into the image-pickup device 141B of stray light from the illuminant light AL2 that directly illuminates the index mark 134, the image of the index mark formed at the image-pickup device 141B can be detected with high contrast.

As described above, providing light-blocking plate(s) results in a decrease of stray light. This permits simultaneous reception of the image-forming light from the index mark and the wafer mark by means of a single image-pickup device. This also yields an image-pickup signal with satisfactory contrast without having to provide separate image-pickup devices for detection of the index mark and the wafer mark.

The present invention is not limited to alignment sensors employing the FIA method. The invention can be applied to alignment sensors employing the LSA method and alignment sensors employing the LIA method or the off-axis method.

The present invention is also not limited to stepper-type projection aligners, but may likewise be applied to scanned-exposure-type projection aligners (in which the reticle pattern is consecutively transferred to each shot region on the wafer by synchronously scanning the reticle and wafer such that a portion of the pattern of the reticle is projected onto the wafer by way of a projection optical system).

In the fifth through eighth example embodiments described above, a light beam from the position-detection mark (referred herein as the "detected-object detection light") and a light beam from the index mark (hereinafter referred to as the "fiducial detection light") are both detected by way of the same condenser optical system. As a result, the detected-object detection light and the fiducial detection light are both equally affected by drift caused by heat or mechanical vibration in the condenser optical system. This results in improved drift stability and improved precision in detection of the position of the position-detection mark. The position-detection apparatus of the invention is particularly effective when used in an off-axis-type alignment sensor, where high drift stability is sought.

Embodiments are also described above in which the position-detection mark and the index mark are easily detected using a shared condenser optical system. In such embodiments, an illumination optical system illuminates the position-detection mark and the index mark. Also, a reflecting member is included that substantially conjugates the surface on which the index mark is formed and the surface on which the position-detection mark is formed. The reflecting member reflects toward the index mark a light beam that was headed toward the detected object by way of the index mark after being irradiated on the index mark by the illumination optical system. When a light beam that has passed through the condenser optical system after being reflected by the reflecting member is received by the second photoelectric detector, the lengths of the optical paths of the detected-object detection light and the fiducial detection light are made substantially the same.

Also, as discussed above, the surface on which the index mark is formed can be arranged proximate to the surface on which the position-detection mark is formed. Also, the second photoelectric detection means can comprise an illumination optical system that illuminates the position-detection mark and the index mark, and also receives a light beam irradiated from the illumination optical system onto the index mark and then condensed by the condenser optical system after emerging from the index mark. Such a scheme advantageously improves drift stability because the index mark and the position-detection mark are arranged proximate to each other.

Also as discussed above, the condenser optical system cab be an imaging optical system that forms images of the position-detection mark and the index mark. Also, the first and second photoelectric detection means can be image-pickup devices that respectively receive the image of the position-detection mark and the image of the index mark. With such a scheme, the images of the position-detection mark and the index mark received at the respective image-pickup devices by the condenser optical system are detected. Consequently, the relative position of the position-detection mark is detected.

Also, as discussed above, the first and second photoelectric detection means can be image-pickup devices that respectively receive and detect the image of the position-detection mark and the image of the index mark. In such a scheme, there is preferably arranged a light-blocking member operable to partially block an illuminant light directed at the index mark at a location conjugate to the index mark or the position-detection mark within the illumination optical system. This results in advantageous blocking of unwanted light beams within the fiducial detection light, thereby improving the signal-to-noise ratio of the detection signal at the second photoelectric detection means.

Also, as discussed above, height-adjustment means can be provided that adjust the position, in the direction of the optical axis of the condenser optical system, of the index mark or an image of the index mark. Environmental-state-measurement means can also be provided that measure the ambient environmental state. Offset-computation means can also be provided that determine the magnitude of an offset between a prescribed target value and the location at which a light beam from the index mark is condensed by the condenser optical system. Such computations are made in accordance with data obtained by the environmental-state-measurement means regarding the magnitude of any change in environmental state. When the position of the index mark or of an image of the index mark is independently adjusted, by way of the height adjustment means, based on the magnitude of the offset determined by the offset-computation means, then any offset caused by environmental changes in the location where the fiducial detection light is condensed is eliminated. This improves the precision with which the position-detection mark is detected. This also allows correction of the offset from a target location to the point at which the index mark is condensed, thereby improving the precision with which the position-detection mark is detected.

In the fifth through eighth example embodiments discussed above, the relative position of an alignment mark with respect to an index mark can be detected with high precision. Hence, a pattern on a reticle can be exposed onto a photosensitive substrate with high precision. This is due in part because such embodiments include the position-detection apparatus as discussed above.

Finally, an aligner as disclosed in the fifth through eighth example embodiments essentially establishes commonality of various influences on the index mark and the position detection mark such as, e.g., thermal deformation or mechanical vibration in the projection optical system or first retaining member. Accordingly, there is additional improvement in the drift stability of the position detection apparatus.

Whereas the invention has been described in connection with multiple embodiments, it will be understood that the invention is not limited to those embodiments. On the contrary, the invention is intended to encompass all alternatives, modifications, and equivalents as may be included within the spirit and scope of the invention as defined by the appended claims.

What is claimed is:

1. An apparatus for determining the position of an object, comprising:
   (a) an irradiation optical system operable to produce at least one beam of coherent illuminant light;
   (b) a processor;
   (c) first and second photoelectric detectors connected to the processor;
   (d) a fiducial body defining a first fiducial mark;
   (e) a condenser optical system and a combining optical system, the condenser optical system (i) being situated so as to direct the beam of coherent light from the irradiation optical system through the combining optical system to the first fiducial mark and through the fiducial body to a position-detection mark formed on the object being detected, and (ii) directing at least one beam produced by the position-detection mark and passing through the combining optical system to the first photoelectric detector, the first photoelectric detector converting light received thereby into first electric signals; and
   (f) the first fiducial mark producing multiple diffracted beams that pass through the combining optical system and at least a portion of the condenser optical system to the second photoelectric detector, the second photoelectric detector converting light received thereby into second electric signals, the processor receiving the first and second electric signals and determining from said signals the position of the object.

2. The apparatus of claim 1, wherein the irradiation optical system comprises a source unit providing coherent illuminant light.

3. The apparatus of claim 2, wherein the source unit comprises a heterodyne laser-beam generation system that generates at least two laser beams having mutually different frequencies.

4. The apparatus of claim 3, wherein the irradiation optical system comprises:
   a field stop situated such that the irradiation optical system directs the laser beams from the heterodyne laser-beam generation system to the field stop; and
   an objective optical system situated so as to direct the at least two laser beams from the field stop to the object and the first fiducial body, the objective optical system comprising a first objective lens situated between the first fiducial body and the field stop, and a second objective lens situated between the first objective lens and the field stop.

5. The apparatus of claim 1, wherein the first fiducial mark comprises multiple separate reference marks corresponding to each dimension of movement of the object.

6. The apparatus of claim 1, wherein:
   (a) the first fiducial mark comprises a first fiducial mark element and a second fiducial mark element separated from the first fiducial mark element by a distance in the measurement direction; and
   (b) the combining optical system comprises an optical member situated between the first fiducial body and the second photoelectric detector, the optical member combining the at least two light beams diffracted from the first fiducial mark element and the second fiducial mark element into a single optical path to the second photoelectric detector.

7. The apparatus of claim 6, further comprising:
   (a) a second fiducial body situated between the object and the condenser optical system, the second fiducial body bearing an index mark;
   (b) an illumination optical system operable to illuminate the position-detection mark and the index mark;
   (c) a first image-pickup device situated so as to receive a first image formed based upon light from the position-detection mark which passes through a predetermined portion of the condenser optical system and to photoelectrically convert the first image into third electrical signals;
   (d) a second image-pickup device situated so as to receive a second image formed based upon light from the index mark which passes through a predetermined portion of the condenser optical system and to photoelectrically convert the second image into fourth electrical signals; and
   (e) the processor being operable to determine, from the third and fourth electrical signals being conducted thereto, the position of the position-detection mark relative to the index mark.

8. The apparatus of claim 1, further comprising:
   (a) a second fiducial body situated between the object and the condenser optical system, the second fiducial body defining an index mark;
   (b) an illumination optical system operable to illuminate the position-detection mark and the index mark;
   (c) a first image-pickup device situated so as to receive a first image formed based upon light from the position-detection mark which passes through a predetermined portion of the condenser optical system and to photoelectrically convert the first image into third electrical signals;
   (d) a second image-pickup device situated so as to receive a second image formed based upon light from the index mark which passes through a predetermined portion of the condenser optical system and to photoelectrically convert the second image into fourth electrical signals; and
   (e) the processor being operable to determine, from the third and fourth electrical signals being conducted thereto, the relative position of the position-detection mark relative to the index mark.

9. The apparatus of claim 8, wherein the irradiation optical system comprises a first illumination source unit that provides a first illumination light having a first wavelength so as to illuminate the position-detection mark and a second illumination light having a second wavelength so as to illuminate the index mark.

10. The apparatus of claim 9, wherein:
the first fiducial body is situated between the object and the second fiducial body; and
the irradiation optical system further comprises a dichroic member situated between the object and the first fiducial body to transmit the first illumination light and reflect the second illumination light.

11. An exposure apparatus operable to expose a transfer pattern formed on a reticle to a photosensitive substrate as the object, the exposure apparatus comprising the position-detection apparatus of claim 1.

12. The exposure apparatus of claim 11, wherein the condenser optical system comprises a first optical unit and a second optical unit, the apparatus further comprising:
(i) a projection system situated between the reticle and the photosensitive substrate so as to project an image of the transfer pattern on the reticle onto the photosensitive substrate;
(ii) a first retaining member supporting the projection system;
(iii) a second retaining member operable to hold the first fiducial body and to hold the first optical unit independently of the second optical unit. the second retaining member being mounted to a surface of the first retaining member nearest to the photosensitive substrate; and
(iv) the position-detection apparatus determining the position of the position-detection mark formed on the photosensitive substrate relative to the first fiducial mark for an alignment of the photosensitive substrate relative to the reticle.

13. The apparatus of claim 1, wherein the condenser optical system comprises:
an objective optical system situated so as to collect a diffracted beam from the position-detection mark and at least two diffracted beams from the first fiducial mark; and
a detection optical system situated so as to direct the diffracted beam from the position-detection mark and collected by the objective optical system to the first photoelectric detector, the objective optical system comprising a first objective lens situated between the first fiducial body and the detection optical system, and a second objective lens situated between the first objective lens and the detection optical system, the combining optical system being situated between the first objective lens and the second objective lens, the combining optical system and the second objective lens directing the at least two diffracted beams from the first fiducial mark to the second photoelectric detector.

14. The exposure apparatus of claim 13, wherein the first optical unit comprises:
(i) an objective lens unit situated so as to collect diffracted light from the position-detection mark and to collect the at least two diffracted light beams from the first fiducial mark; and
(ii) an optical-guide unit situated so as to direct the diffracted light from the position-detection mark through the objective lens unit toward the first photoelectric detector and to direct the at least two diffracted light beams from the first fiducial mark through the objective lens unit toward the second photoelectric detector.

15. A method for manufacturing semiconductor devices, comprising:
(a) using the exposure apparatus of claim 11, determining the position of the position-detection mark formed on the photosensitive substrate relative to the first fiducial mark for an alignment of the photosensitive substrate relative to the reticle by using the position-detection apparatus; and
(b) exposing the transfer pattern on the reticle onto the photosensitive substrate.

16. An exposure apparatus operable to expose a transfer pattern formed on a reticle to a photosensitive substrate as the object, the exposure apparatus comprising the position-detection apparatus of claim 1 and a projection system situated between the reticle and the photosensitive substrate, so as to project an image of the transfer pattern onto the photosensitive substrate.

17. A method for manufacturing semiconductor devices, comprising:
(a) using the exposure apparatus of claim 16, determining the position of the position-detection mark formed on the photosensitive substrate relative to the first fiducial mark for an alignment of the photosensitive substrate relative to the reticle; and
(b) exposing the transfer pattern onto the photosensitive substrate through the projection system.

18. An apparatus for determining the position of an object, the apparatus comprising:
(a) a condenser optical system having an optical axis and being operable to condense at least one light beam from a position-detection mark formed on a surface of the object being detected;
(b) a first photoelectric detector operable to receive the condensed light beam from the position-detection mark and to photoelectrically convert the received light into first electrical signals;
(c) a first fiducial body, situated between the detected object and the condenser optical system, comprising a surface bearing a first fiducial mark, the first fiducial mark being a source of at least two diffracted beams that pass through at least a portion of the condenser optical system;
(d) a second photoelectric detector operable to receive the diffracted beams from the first fiducial mark and to photoelectrically convert the received light beams into second electrical signals; and
(e) a processor operable to receive the first and second electrical signals and determine from said signals the position of the position-detection mark relative to the index mark.

19. The position-detection apparatus of claim 18, wherein the condenser optical system is operable to pass a first light beam from the position-detection mark and a second light beam from the index mark so as to direct the first light beam toward the first photoelectric detector and the second light beam toward the second photoelectric detector.

20. The position-detection apparatus of claim 18, further comprising:
(a) an illumination optical system operable to illuminate the position-detection mark and the index mark;
(b) a reflecting member operable to substantially conjugate the surface on which the index mark is formed and the surface on which the position-detection mark is formed by reflecting toward the index mark a light beam already irradiated on the index mark by the illumination optical system and now propagating toward the detected object by way of the index mark; and (c) the second photoelectric detector being operable to receive a light beam propagating from the index mark and that subsequently passes through the condenser optical system.

21. The position-detection apparatus of claim 20, wherein the illumination optical system is operable to illuminate the position-detection mark with light that, upon reflection from the position-detection mark, becomes a detected object-detection light, and to illuminate the index mark with light that, upon reflection from the index mark, becomes the fiducial detection light.

22. The position-detection apparatus of claim 21, wherein the detected object-detection light and the fiducial detection light have optical paths having substantially the same length.

23. The position-detection apparatus of claim 22, wherein each of the first and second photoelectric detectors has a light-receiving surface that is situated essentially equidistantly from the condenser optical system.

24. The position-detection apparatus of claim 19, further comprising an illumination optical system operable to illuminate the position-detection mark and the index mark, wherein the surface on which the index mark is formed is arranged proximally to the surface on which the position-detection mark is formed, and the second photoelectric detector is operable to receive a light beam irradiated from the illumination optical system onto the index mark and then condensed by the condenser optical system after the light beam emerges from the index mark.

25. The position-detection apparatus of claim 20, wherein:

(a) the condenser optical system is operable as an imaging optical system that forms an image of the position-detection mark and the index mark, and (b) the first and second photoelectric detectors comprise first and second image-pickup devices, respectively, that are operable to pick up the image of the position detection mark and the image of the index mark, respectively.

26. The position-detection apparatus of claim 25, further comprising a light-blocking member within the illumination optical system, the light-blocking member being operable to partially block illuminant light at a location, within the illumination optical system, conjugate to the index mark or to the position-detection mark.

27. The position-detection apparatus of claim 18, further comprising:

(a) a height adjuster operable to adjust the position, along the optical axis of the condenser optical system, of the index mark or of an image of the index mark;

(b) an environmental-state monitor operable to perform measurements of environmental conditions ambient to the position-detection apparatus;

(c) an offset computer operable to determine the magnitude of an offset between a target location and an actual location at which a light beam from the index mark is condensed by the condenser optical system in accordance with the measurements performed by the environmental-state monitor indicating a magnitude of change in the environmental conditions;

(d) the height adjuster being operable to adjust the position along the optical axis, based on the magnitude of offset determined by the offset computer, of the index mark or of an image of the index mark.

28. The position-detection apparatus of claim 27, further comprising:

(a) an environmental-state monitor operable to perform measurements of environmental conditions ambient to the position-detection apparatus;

(b) an offset computer operable to determine the magnitude of an offset between a target location and an actual location at which a light beam from the index mark is condensed by the condenser optical system in accordance with the measurements performed by the environmental-state monitor indicating a magnitude of change in the environmental conditions;

(c) the processor being operable to determine, from the determined magnitude of offset, a corrected position of the position-detection mark relative to the index mark.

29. An exposure apparatus operable to expose a transfer pattern formed on a reticle to a photosensitive substrate as the object, the exposure apparatus comprising the position-detection apparatus of claim 15.

30. The exposure apparatus of claim 29, wherein the position-detection apparatus determines the position of the position-detection mark formed on the photosensitive substrate relative to the index mark, for an alignment of the photosensitive substrate relative to the reticle.

31. The exposure apparatus of claim 30, wherein the condenser optical system comprises a first optical unit and a second optical unit, the exposure apparatus further comprising:

(a) a projection system situated between the reticle and the photosensitive substrate so as to project an image of the transfer pattern on the reticle onto the photosensitive substrate;

(b) a first retaining member supporting the projection system;

(c) a second retaining member supporting the first fiducial body and holding the first optical unit independently of the second optical unit, the second retaining member being mounted to a surface of the first retaining member nearest to the photosensitive substrate.

32. A method for manufacturing semiconductor devices, comprising:

(a) using the exposure apparatus of claim 29, determining the position of the position-detection mark formed on the photosensitive substrate relative to the reticle; and (b) exposing the transfer pattern onto the photosensitive substrate.

33. An exposure apparatus for exposing a transfer pattern formed on a reticle to a photosensitive substrate as the object, the exposure apparatus comprising:

(a) the position-detection apparatus of claim 18; and (b) a projection system situated between the reticle and the photosensitive substrate so as to project an image of the transfer pattern onto the photosensitive substrate.

34. A method for manufacturing semiconductor devices, comprising:

(a) using the exposure apparatus of claim 33, determining the position of a position-detection mark formed on the photosensitive substrate relative to the index mark so as to align the photosensitive substrate relative to the reticle; and (b) exposing the transfer pattern on the reticle onto the photosensitive substrate through the projection system.

35. An exposure apparatus for exposing a transfer pattern formed on a reticle to a photosensitive substrate, the exposure apparatus comprising:

(a) a position-detection apparatus comprising a detection optical system for detecting a position of a position-detection mark formed on the photosensitive substrate for an alignment of the photosensitive substrate relative to the reticle, the detection optical system comprising a first optical unit and a second optical unit;

(b) a projection system situated between the reticle and the photosensitive substrate so as to project an image of the transfer pattern onto the photosensitive substrate;

(c) a first retaining member supporting the projection system; and (d) a second retaining member supporting the first optical unit independently of the second optical unit, the second retaining member being mounted on a surface of the first retaining member nearest the photosensitive substrate.

36. A method for manufacturing semiconductor devices, comprising:

(a) using the apparatus of claim 35, detecting the position of the position-detection mark on the photosensitive substrate for an alignment of the photosensitive substrate relative to the reticle; and (b) exposing the transfer pattern on the reticle onto the photosensitive substrate through the projection system.

* * * * *

UNITED STATES PATENT AND TRADEMARK OFFICE
CERTIFICATE OF CORRECTION

PATENT NO. : 5,859,707

DATED : January 12, 1999

INVENTOR(S) : Nakagawa et al.

It is certified that error appears in the above-identified patent and that said Letters Patent is hereby corrected as shown below:

Column 1, line 55, "(Throughthe-Lens)" should be --(Through-the-Lens)--.

Column 15, line 40, "$P_W \cdot \leftarrow$" should be --$P_W \cdot \theta$--.

Column 17, line 32, "firs-torder" should be --first-order--.

Column 17, line 33, "$YWLB^{-1}$" should be --$YWLB1^{-1}$--.

Column 18, lines 57 and 65, "PG" should be --$P_G$--.

Column 18, line 66, "PW" should be --$P_W$--.

Column 21, line 29, equation (5) should read as follows:

$$\Delta R_n = [\lambda F/(2n-1)]^{1/2}/2 = P_G/2$$

Column 21, line 36, "PG" should be --$P_G$--.

Column 26, line 65, "$X_2$" should be --$\lambda_2$--.

Column 26, line 66, "$\lambda 1$" should be --$\lambda_1$--.

Column 27, line 16, "$\lambda_2$" should be --$\lambda_1$--.

UNITED STATES PATENT AND TRADEMARK OFFICE
CERTIFICATE OF CORRECTION

PATENT NO. : 5,859,707

DATED : January 12, 1999

INVENTOR(S) : Nakagawa et al.

It is certified that error appears in the above-identified patent and that said Letters Patent is hereby corrected as shown below:

Column 27, line 32, "$x_2$" should be --$\lambda_2$--.

Column 30, line 22, "ilk" should be --11k--.

Column 43, line 24, "AX1" should be --AX11--.

Column 49, line 19, "$\Delta X_{TM}$" should be --$\Delta X_{WM}$--.

Column 49, lines 26 and 30, "AD" should be --$\Delta D$--.

Column 49, line 58, "$\Delta X_{TM} = \Delta X_{TM}$" should be --$\Delta X_{WM} = \Delta X_{TM}$--.

Column 49, line 66, "AXTM" should be --$\Delta X_{TM}$--.

In the Claims:

Column 63, line 55, claim 14, "apparatus of claim 13" should be --apparatus of claim 12--.

Column 66, line 1, claim 28, "apparatus of claim 27" should be --apparatus of claim 18--.

Column 66, line 20, claim 29, "apparatus of claim 15" should be --apparatus of claim 18--.

Signed and Sealed this

Eighth Day of February, 2000

Attest:

Q. TODD DICKINSON

*Attesting Officer*  *Commissioner of Patents and Trademarks*